(12) United States Patent
Wang et al.

(10) Patent No.: US 7,968,937 B2
(45) Date of Patent: Jun. 28, 2011

(54) VERTICAL TRANSISTOR AND ARRAY WITH VERTICAL TRANSISTORS

(75) Inventors: Kuo-Chen Wang, Chiai (TW); Jung-Hua Chen, Taoyuan County (TW)

(73) Assignee: Nanya Technology Corporation, Taoyuan (TW)

( * ) Notice: Subject to any disclaimer, the term of this patent is extended or adjusted under 35 U.S.C. 154(b) by 339 days.

(21) Appl. No.: 12/236,517

(22) Filed: Sep. 24, 2008

(65) Prior Publication Data
US 2010/0038709 A1   Feb. 18, 2010

(30) Foreign Application Priority Data

Aug. 15, 2008  (TW) .............................. 97131242 A

(51) Int. Cl.
*H01L 29/66* (2006.01)
*H01L 27/108* (2006.01)

(52) U.S. Cl. ... 257/329; 257/330; 257/331; 257/E27.06; 257/E27.084; 257/E27.085; 257/E27.096; 257/E29.262

(58) Field of Classification Search .................. 257/329, 257/288, E29.262, E27.06, 330–331, E27.084–E27.085, 257/E27.096
See application file for complete search history.

(56) References Cited

U.S. PATENT DOCUMENTS

| 5,416,350 | A | * | 5/1995 | Watanabe | 257/330 |
| 5,432,739 | A | * | 7/1995 | Pein | 365/185.11 |
| 6,013,548 | A | * | 1/2000 | Burns et al. | 438/242 |
| 6,077,745 | A |  | 6/2000 | Burns, Jr. et al. |  |
| 7,015,525 | B2 |  | 3/2006 | Forbes et al. |  |
| 7,042,047 | B2 |  | 5/2006 | Eppich |  |
| 7,285,812 | B2 |  | 10/2007 | Tang et al. |  |
| 7,531,412 | B2 | * | 5/2009 | Yoon et al. | 438/270 |
| 2005/0032313 | A1 | * | 2/2005 | Forbes | 438/270 |
| 2006/0097304 | A1 | * | 5/2006 | Yoon et al. | 257/307 |
| 2006/0226463 | A1 | * | 10/2006 | Forbes | 257/301 |
| 2007/0228437 | A1 | * | 10/2007 | Forbes | 257/296 |
| 2008/0248620 | A1 | * | 10/2008 | Liu et al. | 438/257 |

* cited by examiner

*Primary Examiner* — Zandra Smith
*Assistant Examiner* — Jeremy J Joy
(74) *Attorney, Agent, or Firm* — Jianq Chyun IP Office

(57) ABSTRACT

A vertical transistor includes a substrate, a semiconductor structure, a gate, a gate dielectric layer, and a conductive layer. The semiconductor structure is disposed on the substrate and includes two vertical plates and a bottom plate. The bottom plate has an upper surface connected to bottoms of the two vertical plates and a bottom surface connected to the substrate. The gate surrounds the semiconductor structure to fill between the two vertical plates, and the gate is disposed around the two vertical plates. The gate dielectric layer is sandwiched in between the gate and the semiconductor structure, and the conductive layer is disposed on the semiconductor structure and electrically connected with tops of the two vertical plates.

17 Claims, 60 Drawing Sheets

VERTICAL TRANSISTOR AND ARRAY WITH VERTICAL TRANSISTORS

CROSS-REFERENCE TO RELATED APPLICATION

This application claims the priority benefit of Taiwan application serial no. 97131242, filed Aug. 15, 2008. The entirety of the above-mentioned patent application is hereby incorporated by reference herein and made a part of this specification.

BACKGROUND OF THE INVENTION

1. Field of the Invention

The present invention relates to a transistor structure, and more particularly to a vertical transistor and an array with vertical transistors.

2. Description of Related Art

In order to accelerate operating speed of dynamic random access memories (DRAMs) in integrated circuit products and to meet customers' demands on miniaturizing electronic devices, physical dimensions of transistors in a semiconductor apparatus are continuously reduced. Thereby, however, a short channel effect would occur in the transistors, and an On current is likely to decrease.

To resolve said issue, a conventional horizontal transistor is replaced by a vertical transistor, as proposed in U.S. Pat. No. 7,285,812. Specifically, the vertical transistor is formed both in a trench and above the trench. On the other hand, another conventional solution aims at forming a gate at an edge of an epitaxial post, as proposed in U.S. Pat. No. 7,042,047. Nonetheless, said structures can be further improved in terms of controlling channels thereof.

SUMMARY OF THE INVENTION

The present invention is directed to a vertical transistor equipped with eight controlling surfaces.

The present invention is further directed to an array with vertical transistors which can increase device density and reduce an area occupied by chips.

In the present invention, a vertical transistor including a substrate, a semiconductor structure, a gate, a gate dielectric layer, and a conductive layer is provided. The semiconductor structure is disposed on the substrate and has two vertical plates and a bottom plate. An upper surface of the bottom plate is partially connected to bottoms of the two vertical plates, while a bottom surface of the bottom plate is connected to the substrate. The gate surrounds the semiconductor structure and fills a space between the two vertical plates and is disposed around the two vertical plates. The gate dielectric layer is sandwiched in between the gate and the semiconductor structure, and the conductive layer is disposed on the semiconductor structure and electrically connected with tops of the two vertical plates.

In an embodiment of the present invention, the vertical transistor further includes a buried conductive region disposed in the substrate and electrically connected to the bottom plate of the semiconductor structure.

In an embodiment of the present invention, a material of the gate includes titanium nitride.

In an embodiment of the present invention, a material of the gate dielectric layer includes oxide-nitride-oxide.

In an embodiment of the present invention, a bottom surface of the gate is disposed above the bottom plate of the semiconductor structure.

In an embodiment of the present invention, an upper surface of the gate and the tops of the two vertical plates of the semiconductor structure are co-planar.

In an embodiment of the present invention, an upper surface of the gate is lower than the tops of the two vertical plates of the U-shaped semiconductor structure.

The present invention further provides an array with vertical transistors. The array with the vertical transistors includes a substrate, a plurality of gate lines, a plurality of semiconductor structures, and a plurality of conductive layers. Here, the substrate includes a plurality of conductive straps buried in the substrate in parallel along a first direction. The gate lines are disposed above the substrate and extended along a second direction. An insulation layer is disposed between each of the gate lines, and the insulation layer is extended between each of the gate lines and the substrate. The semiconductor structures are respectively disposed on the substrate located at intersections between the conductive straps and the gate lines. Each of the semiconductor structures includes two vertical plates, a bottom plate, and a gate dielectric layer. Bottoms of the two vertical plates are connected to an upper surface of the bottom plate and are disposed in one of the gate lines. A bottom surface of the bottom plate is electrically connected to one of the conductive straps. The gate dielectric layer is sandwiched by the two vertical plates and the one of the gate lines. Each of the conductive layers is disposed above each of the semiconductor structures and is electrically connected to the two vertical plates.

In another embodiment of the present invention, the bottom plate of each of the semiconductor structures in the first direction is connected to one another.

In another embodiment of the present invention, a material of the gate lines includes titanium nitride.

In another embodiment of the present invention, a material of the gate dielectric layer includes oxide-nitride-oxide.

In another embodiment of the present invention, upper surfaces of the gate lines and tops of the two vertical plates of the semiconductor structure are co-planar.

In an embodiment of the present invention, upper surfaces of the gate lines are lower than tops of the two vertical plates of the semiconductor structure.

The vertical transistor of the present invention has the semiconductor structure and the gate surrounding and penetrating the entire semiconductor structure. Therefore, the individual vertical transistor can be equipped with eight controlling surfaces in total. In addition, when the vertical transistors are arranged in array, the buried conductive straps implanted at one side are conductive to reduction of an area occupied by the chips, so as to increase the device density.

In order to make the aforementioned and other objects, features and advantages of the present invention more comprehensible, several embodiments accompanied with figures are described in detail below.

BRIEF DESCRIPTION OF THE DRAWINGS

The accompanying drawings constituting a part of this specification are incorporated herein to provide a further understanding of the invention. Here, the drawings illustrate embodiments of the invention and, together with the description, serve to explain the principles of the invention.

FIGS. 7-1 through 24-1 are top views illustrating a manufacturing process of an array of the vertical transistor depicted in FIG. 3.

FIGS. 7-2 through 18-2 and FIGS. 20-2 through 24-2 are cross-sectional views taken along sectional lines II-II' respectively depicted in FIGS. 7-1 through 18-1 and FIGS. 20-1 through 24-1.

FIG. 19-2 is a cross-sectional view taken along the sectional line II-II depicted in FIG. 19-1.

FIGS. 8-3 through 18-3 and FIGS. 20-3 through 24-3 are cross-sectional views taken along sectional lines III-III respectively depicted in FIGS. 8-1 through 18-1 and FIGS. 20-1 through 24-1.

FIGS. 15-4 through 18-4 and FIGS. 20-4 through 24-4 are cross-sectional views taken along sectional lines IV-IV' respectively depicted in FIGS. 15-1 through 18-1 and FIGS. 20-1 through 24-1.

FIGS. 25-1 through 33-1 are top views illustrating a manufacturing process of an array of the vertical transistor depicted in FIG. 5.

FIGS. 25-2 through 29-2 and FIGS. 31-2 through 33-2 are cross-sectional views taken along sectional lines II-II' respectively depicted in FIGS. 25-1 through 29-1 and FIGS. 31-1 through 33-1.

FIG. 30-2 is a cross-sectional view taken along a sectional line II-II depicted in FIG. 30-1.

FIGS. 25-3 through 29-3 and FIGS. 31-3 through 33-3 are cross-sectional views taken along sectional lines III-III respectively depicted in FIGS. 25-1 through 29-1 and FIGS. 31-1 through 33-1.

FIGS. 26-4 through 29-4 and FIGS. 31-4 through 33-4 are cross-sectional views taken along sectional lines IV-IV' respectively depicted in FIGS. 26-1 through 29-1 and FIGS. 31-1 through 33-1.

DESCRIPTION OF EMBODIMENTS

Figure 1:
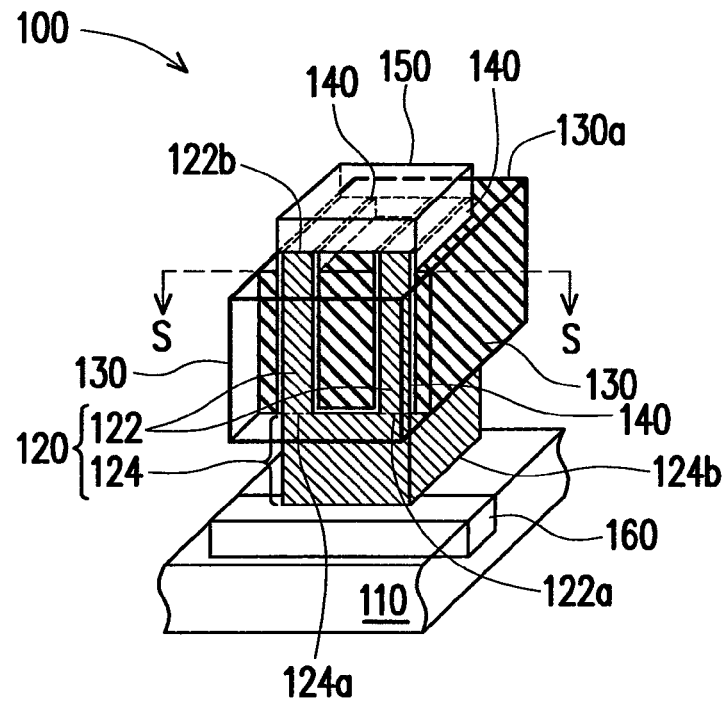
FIG. 1 is a schematic three-dimensional view of a vertical transistor according to a first embodiment of the present invention.

FIG. 1 is a schematic three-dimensional view of a vertical transistor according to a first embodiment of the present invention. An internal cross-sectional view of the vertical transistor is taken along a sectional line S-S to better illustrate the present invention.

Referring to FIG. 1, a vertical transistor 100 of the first embodiment includes a substrate 110, a semiconductor structure 120, a gate 130, a gate dielectric layer 140, and a conductive layer 150. The vertical transistor 100 can further include a buried conductive region 160 disposed in the substrate 110. The semiconductor structure 120 is disposed on the substrate 110 and has two vertical plates 122 and a bottom plate 124. An upper surface 124a of the bottom plate 124 is partially connected to bottoms 122a of the two vertical plates 122, while a bottom surface 124b of the bottom plate 124 is connected to the substrate 110. The buried conductive region 160 can be electrically connected to the bottom plate 124 of the semiconductor structure 120. The gate 130 surrounds the semiconductor structure 120 and fills a space between the two vertical plates 122 and is disposed around the two vertical plates 122. Here, the gate 130 in front of the sectional line S-S depicted in FIG. 1 is presented in a transparent form. Besides, the gate 130 is, for example, made of metals, such as tungsten, titanium nitride, or other appropriate metals. The gate dielectric layer 140 is sandwiched in between the gate 130 and the semiconductor structure 120 and is, for example, made of silicon oxide, oxide-nitride-oxide (ONO), or other appropriate dielectric materials. The conductive layer 150 is disposed on the semiconductor structure 120 and electrically connected to tops 122b of the two vertical plates 122 of the semiconductor structure 120. Note that the buried conductive region 160 herein acts as a bit line.

Referring to FIG. 1, a bottom surface of the gate 130 is disposed above the bottom plate 124 of the semiconductor structure 120, which is however not limited in the present invention. In addition, as shown in FIG. 1, an upper surface 130a of the gate 130 is lower than the tops 122b of the two vertical plates 122 of the semiconductor structure 120.

Figure 2:
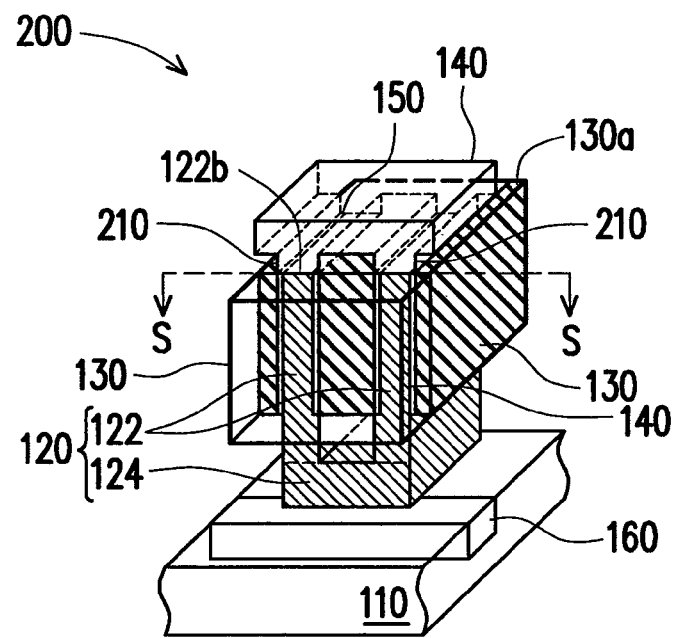
FIG. 2 is a schematic three-dimensional view of a transformed example of the vertical transistor according to the first embodiment of the present invention.

FIG. 2 is a schematic three-dimensional view of a transformed example of the vertical transistor according to the first embodiment of the present invention. Similar or identical elements in FIG. 2 and in FIG. 1 are represented by similar or the same reference numerals.

As shown in FIG. 2, a vertical transistor 200 similarly includes the substrate 110, the semiconductor structure 120 having the two vertical plates 122 and the bottom plate 124, the gate 130, the gate dielectric layer 140, the conductive layer 150, and the buried conductive region 160. The difference between FIG. 2 and FIG. 1 rests in that the upper surface 130a of the gate 130 and the tops 122b of the two vertical plates 122 of the semiconductor structure 120 are co-planar in FIG. 2. The conductive layer 150 is not allowed to contact the gate 130, and therefore the conductive layer 150 is connected to the tops 122b of the two vertical plates 122 through two contact windows 210, respectively.

In the vertical transistor of FIG. 1 and the vertical transistor of FIG. 2, the gate 130 not only surrounds the semiconductor structure 120 but also fills between the two vertical plates 122 of the semiconductor structure 120. Hence, the vertical transistor of the first embodiment is equipped with eight controlling surfaces.

Figure 3:
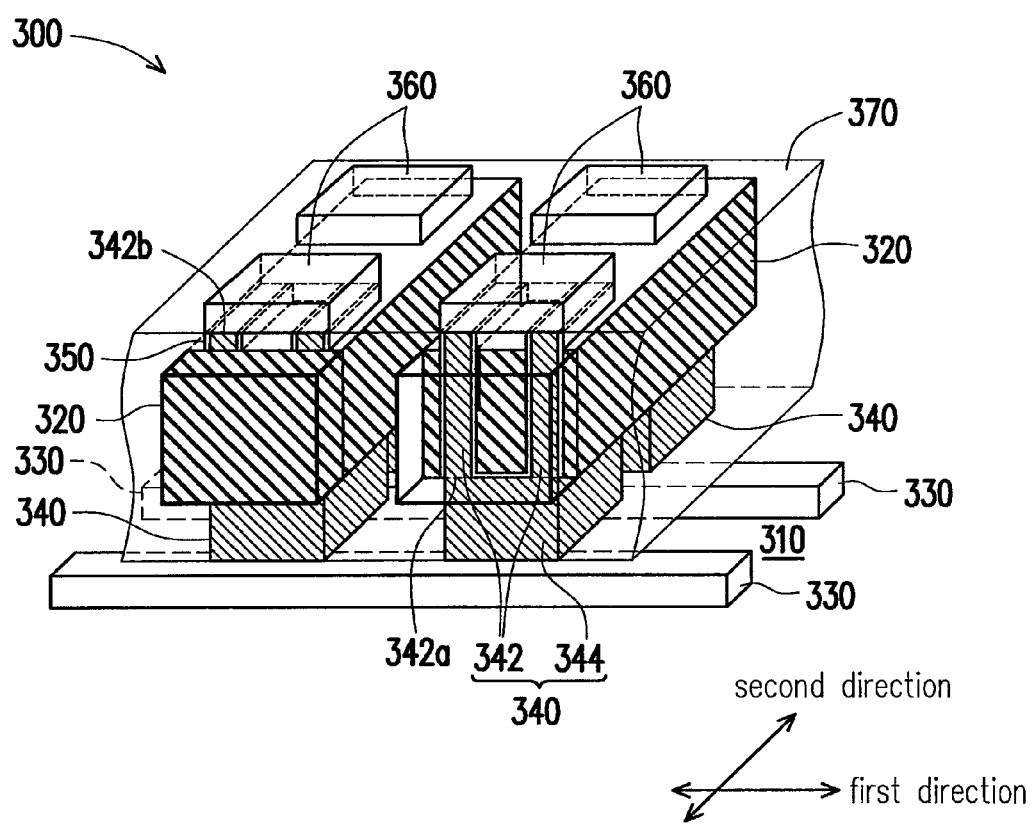
FIG. 3 is a schematic three-dimensional view of an array with vertical transistors according to a second embodiment of the present invention.
Figure 4A:
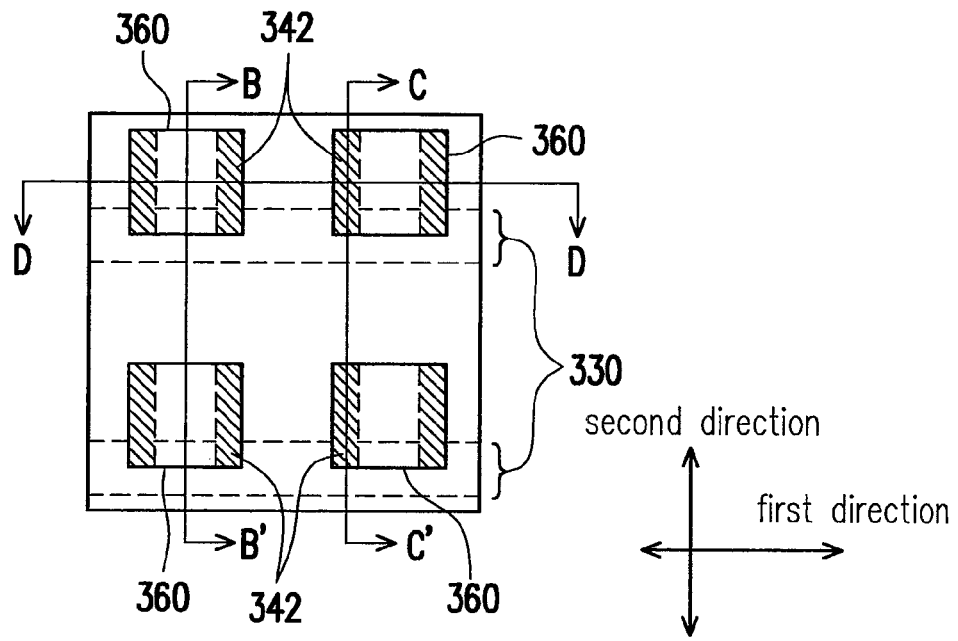
FIG. 4A is a top view of FIG. 3.
Figure 4B:
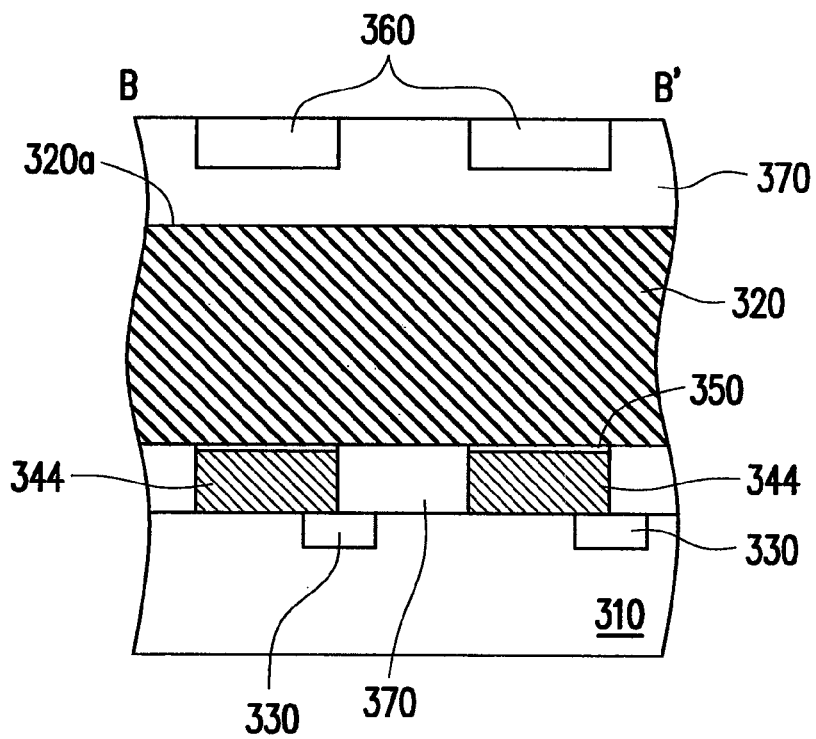
FIG. 4B is a cross-sectional view taken along a sectional line B-B' depicted in FIG. 4A.
Figure 4C:
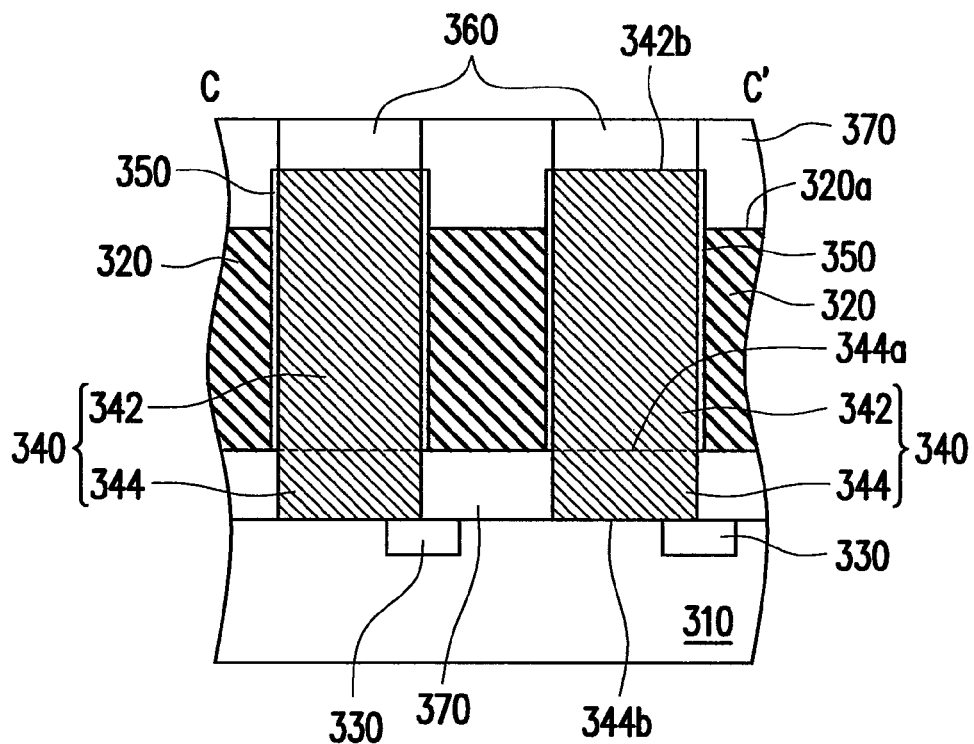
FIG. 4C is a cross-sectional view taken along a sectional line C-C' depicted in FIG. 4A.
Figure 4D:
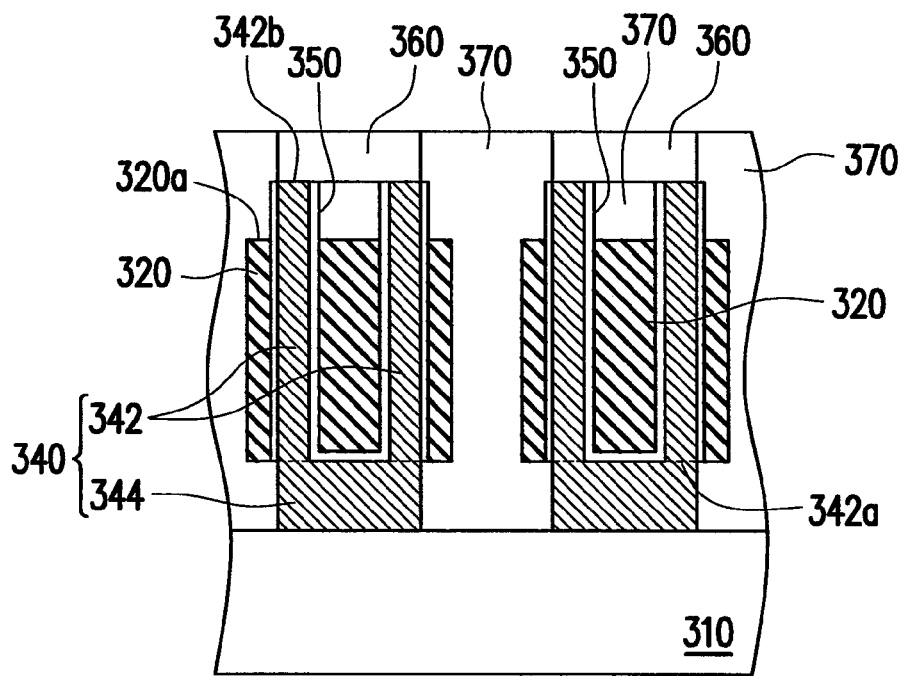
FIG. 4D is a cross-sectional view taken along a sectional line D-D depicted in FIG. 4A.

FIG. 3 is a schematic three-dimensional view of an array with vertical transistors according to a second embodiment of the present invention. FIG. 4A is a top view of FIG. 3. FIG. 4B is a cross-sectional view taken along a section line B-B' depicted in FIG. 4A. FIG. 4C is a cross-sectional view taken along a sectional line C-C' depicted in FIG. 4A. FIG. 4D is a cross-sectional view taken along a sectional line D-D depicted in FIG. 4A.

Referring to FIG. 3, an array 300 with vertical transistors in the second embodiment includes a substrate 310, a plurality of gate lines 320, a plurality of semiconductor structures 340, and a plurality of conductive layers 360. The substrate 310 includes a plurality of conductive straps 330 buried in the substrate 310 in parallel along a first direction, and the conductive straps 330 can serve as bit lines. The gate lines 320 are disposed above the substrate 310 and extended along a second direction, and the gate lines 320 are made of metals, such as tungsten, titanium nitride, or other appropriate metals. Besides, an insulation layer 370 is disposed between each of the gate lines 320, and the insulation layer 370 is extended between each of the gate lines 320 and the substrate 310. To elaborate the arrangement of the semiconductor structures 340, a portion of the gate lines 320 positioned at the right half of FIG. 3 is illustrated perspectively. Thereby, it is known from FIG. 3 that the semiconductor structures 340 are respectively disposed on the substrate 310 located at intersections between the conductive straps 330 and the gate lines 320. Each of the semiconductor structures 340 includes two vertical plates 342, a bottom plate 344, and a gate dielectric layer 350. Bottoms 342a of the two vertical plates 342 are connected to an upper surface 344a of the bottom plate 344 and are disposed in one of the gate lines 320, and a bottom surface 344b of the bottom plate 344 is electrically connected to one of the conductive straps 330. Each of the conductive layers 360 is disposed above one of the semiconductor structures 340 and is electrically connected to the two vertical plates 342.

Please refer to FIGS. 4A through 4D to better understand the array 300 with the vertical transistors of FIG. 3. In FIGS. 4A through 4D, the conductive straps 330 are electrically connected to the bottom plates 344 of the semiconductor structures 340. The upper surface 344a of the bottom plate 344 is connected to the bottoms 342a of the two vertical plates 342, while the bottom surface 344b of the bottom plate 344 is electrically connected to one of the conductive straps 330. The gate dielectric layer 350 is sandwiched in between the gate line 320 and the semiconductor structure 340, and the gate dielectric layer 350 is, for example, made of silicon oxide, ONO, or other appropriate dielectric materials. Upper surfaces 320a of the gate lines 320 are alternatively lower than tops 342b of the two vertical plates 342 of each of the semiconductor structures 340. Each of the conductive layers 360 is electrically connected with the tops 342b of the two vertical plates 342 of each of the semiconductor structures 340, respectively.

Figure 5:
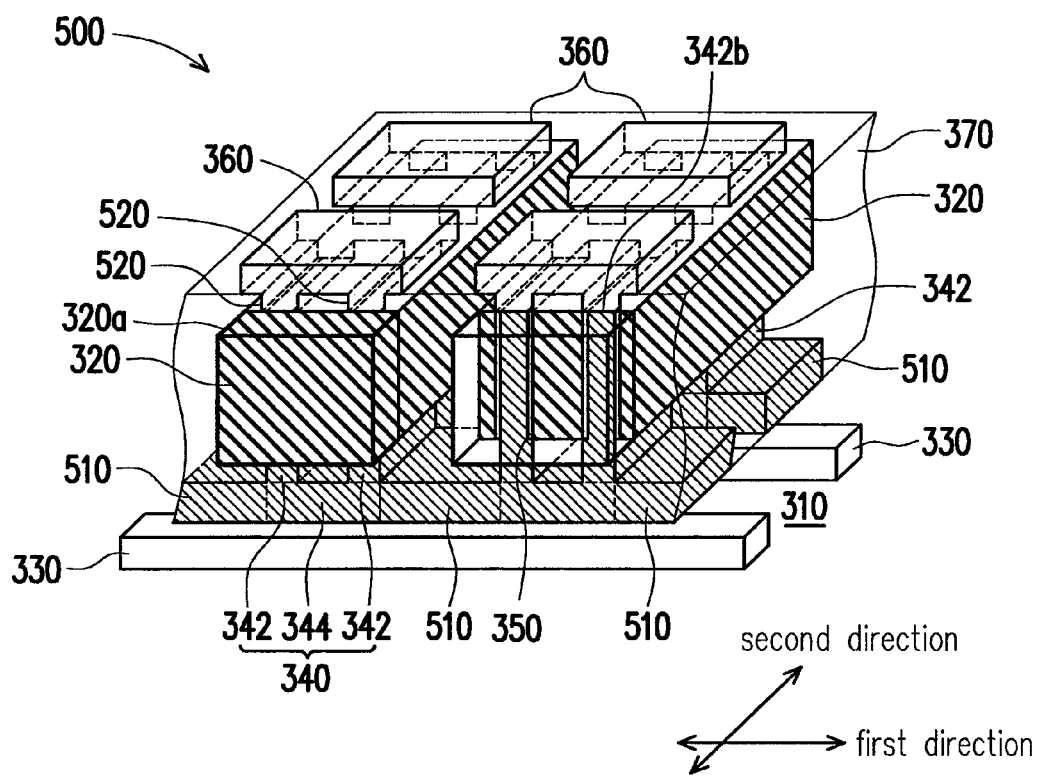
FIG. 5 is a schematic three-dimensional view of a transformed example of the vertical transistor according to the second embodiment of the present invention.
Figure 6A:
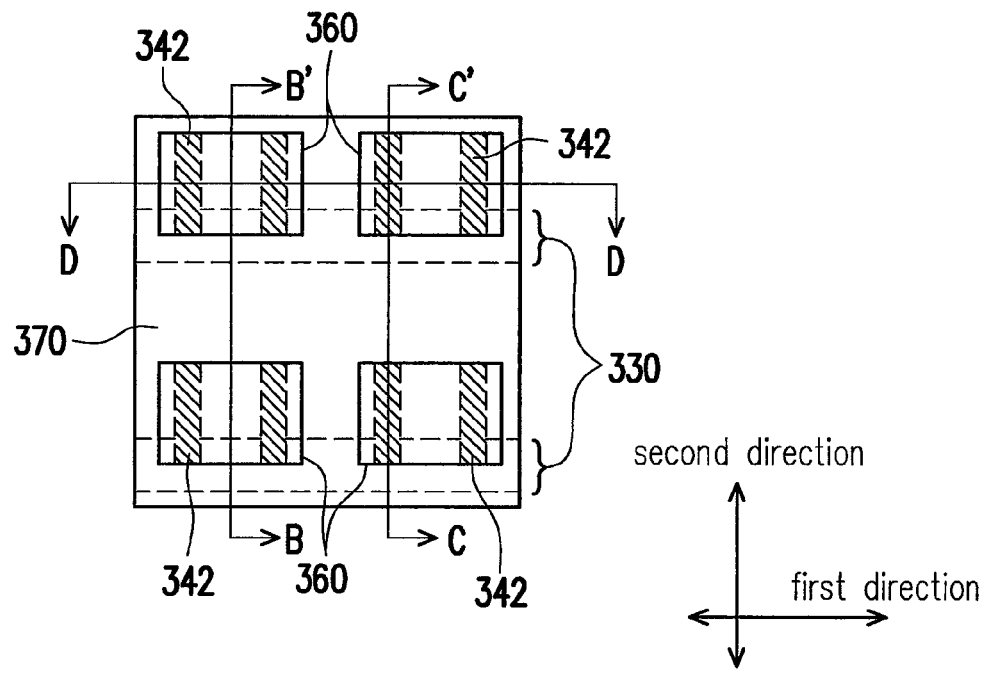
FIG. 6A is a top view of FIG. 5.
Figure 6B:
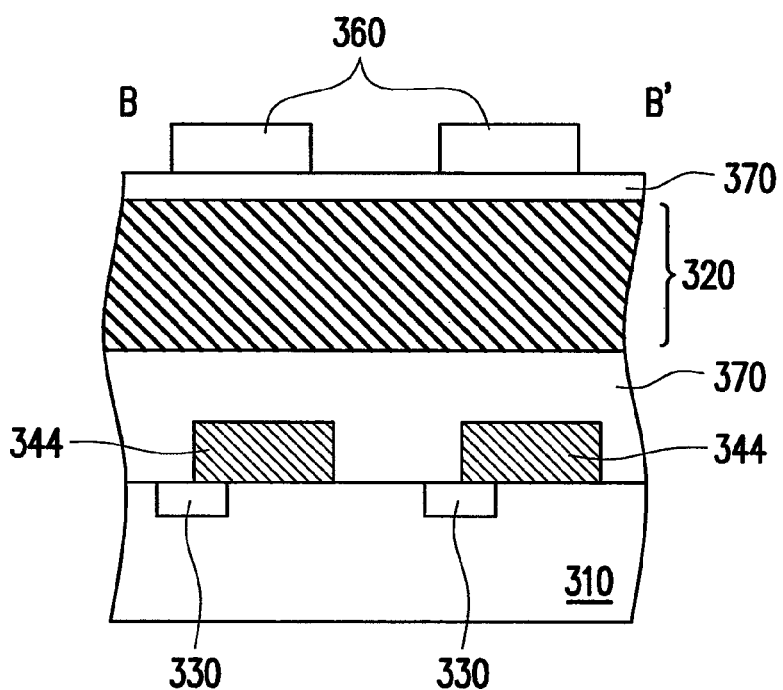
FIG. 6B is a cross-sectional view taken along a sectional line B-B' depicted in FIG. 6A.
Figure 6C:
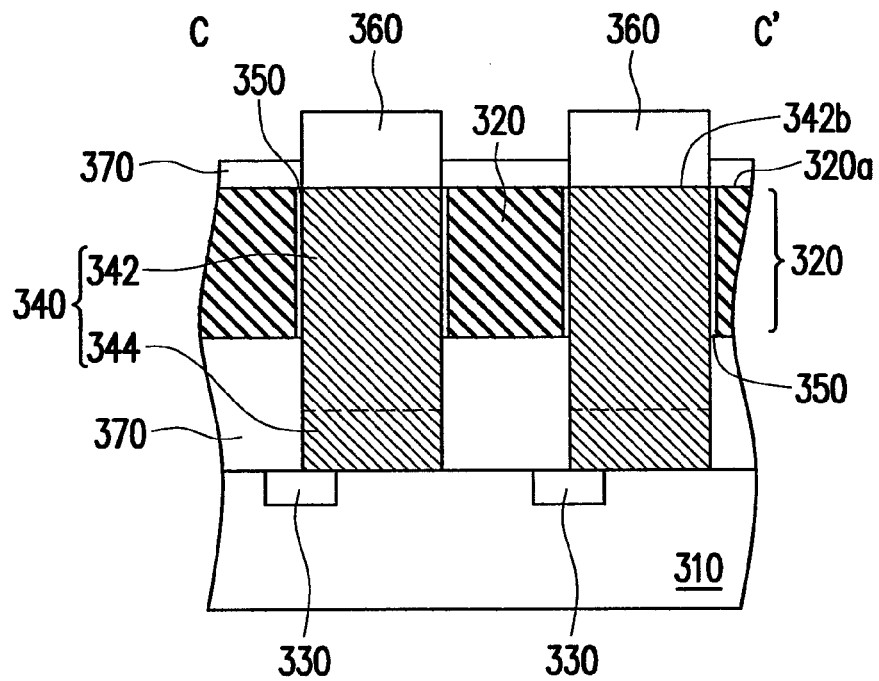
FIG. 6C is a cross-sectional view taken along a sectional line C-C' depicted in FIG. 6A.
Figure 6D:
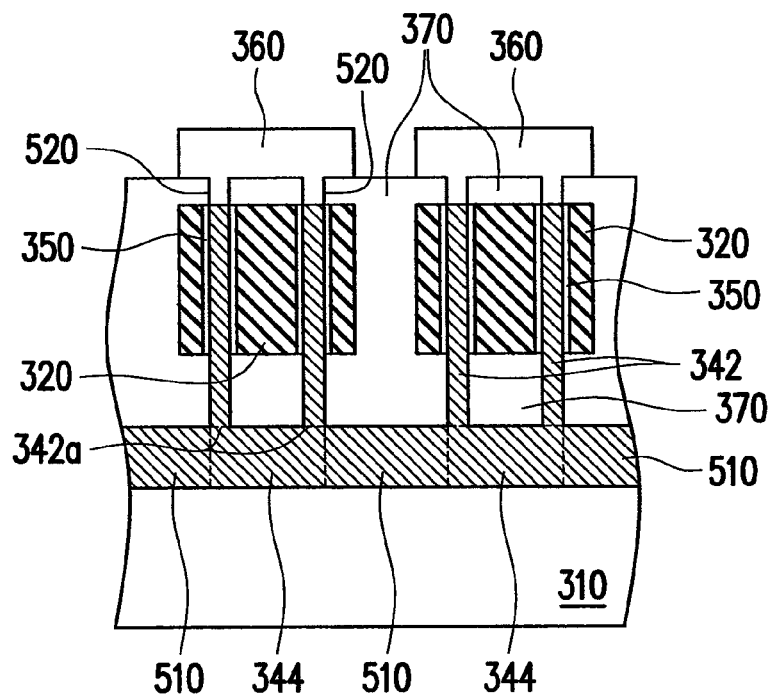
FIG. 6D is a cross-sectional view taken along a sectional line D-D depicted in FIG. 6A.

FIG. 5 is a schematic three-dimensional view of a transformed example of the vertical transistor according to the second embodiment of the present invention. Similar or identical elements in FIG. 5 and in FIG. 3 are represented by similar or the same reference numerals. FIG. 6A is a top view of FIG. 5. FIG. 6B is a cross-sectional view taken along a sectional line B-B' depicted in FIG. 6A. FIG. 6C is a cross-sectional view taken along a sectional line C-C' depicted in FIG. 6A. FIG. 6D is a cross-sectional view taken along a sectional line D-D depicted in FIG. 6A.

Referring to FIGS. 5 and 6A through 6D, an array 500 with vertical transistors also includes the substrate 310, the plurality of gate lines 320, the plurality of conductive straps 330, the plurality of semiconductor structures 340, and the plurality of conductive layers 360. Here, each of the semiconductor structures 340 includes the two vertical plates 342, the bottom plate 344, and the gate dielectric layer 350. The difference between the array 500 with the vertical transistors in FIG. 5 and the array 300 with the vertical transistors in FIG. 3 lies in that the upper surfaces 320a of the gate lines 320 and the tops 342b of the two vertical plates 342 of each of the semiconductor structures 340 are co-planar. To elaborate relative positions of the semiconductor structures 340 and the gate lines 320, a portion of the gate lines 320 positioned at the right half of FIG. 5 is illustrated perspectively. Moreover, it can be observed from FIG. 5 that the semiconductor structures 340 are connected to one another. For instance, in FIG. 5, the bottom plate 344 of each of the semiconductor structures 340 in the first direction can be connected to one another through extended conductive portions 510. The conductive layers 360 are not allowed to directly contact the gate lines 320, and therefore the conductive layers 360 are connected to the tops 342b of the vertical plates 342 through contact windows 520, respectively.

The array 300 with the vertical transistors or the array 500 with the vertical transistors as were discussed in the second embodiment of the present invention can be formed by performing following manufacturing processes, while the present invention is not limited thereby.

FIGS. 7-1 through 24-4 are schematic views illustrating a manufacturing process of the array 300 with the vertical transistors depicted in FIG. 3.

Figures 1, 7:
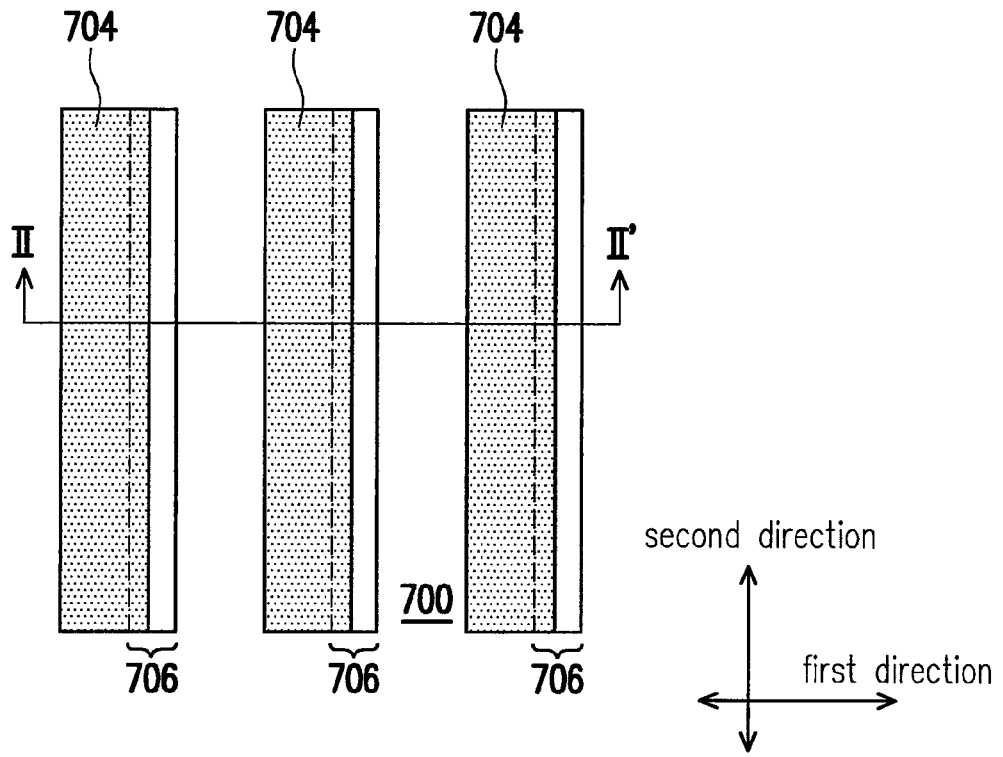
Figures 2, 7:
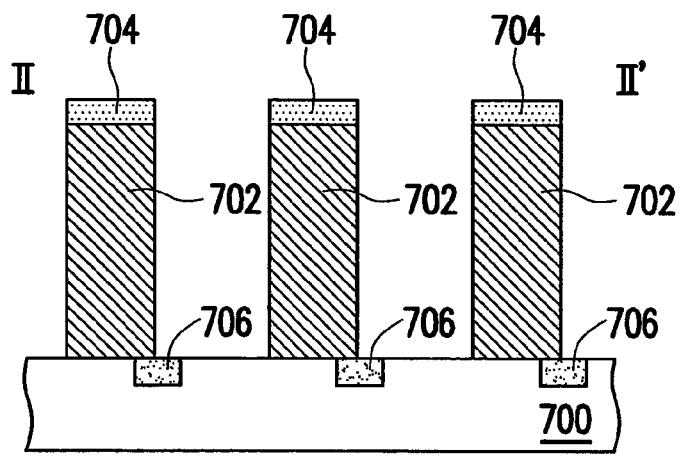

Referring to the top view of FIG. 7-1 and the cross-sectional view of FIG. 7-2 taken along a sectional line II-II', a substrate 700 is provided, and a plurality of bar-shaped semiconductor layers 702 along the second direction are formed on the substrate 700. Here, the semiconductor layers 702 are, for example, made of polysilicon or other appropriate semiconductor materials. Moreover, the bar-shaped semiconductor layers 702 are, for example, formed by etching an entire semiconductor layer with use of hark masks 704 as etching masks. A material of the hard masks 704 is SiON, for example. Next, a single-sided ion implantation process is performed on the substrate 700, so as to form conductive straps 706 contacting a portion of the semiconductor layers 702 in the substrate 700. Arsenic ions, boron ions, and phosphorus ions can be used to implement the single-sided ion implantation process.

Figures 1, 8:
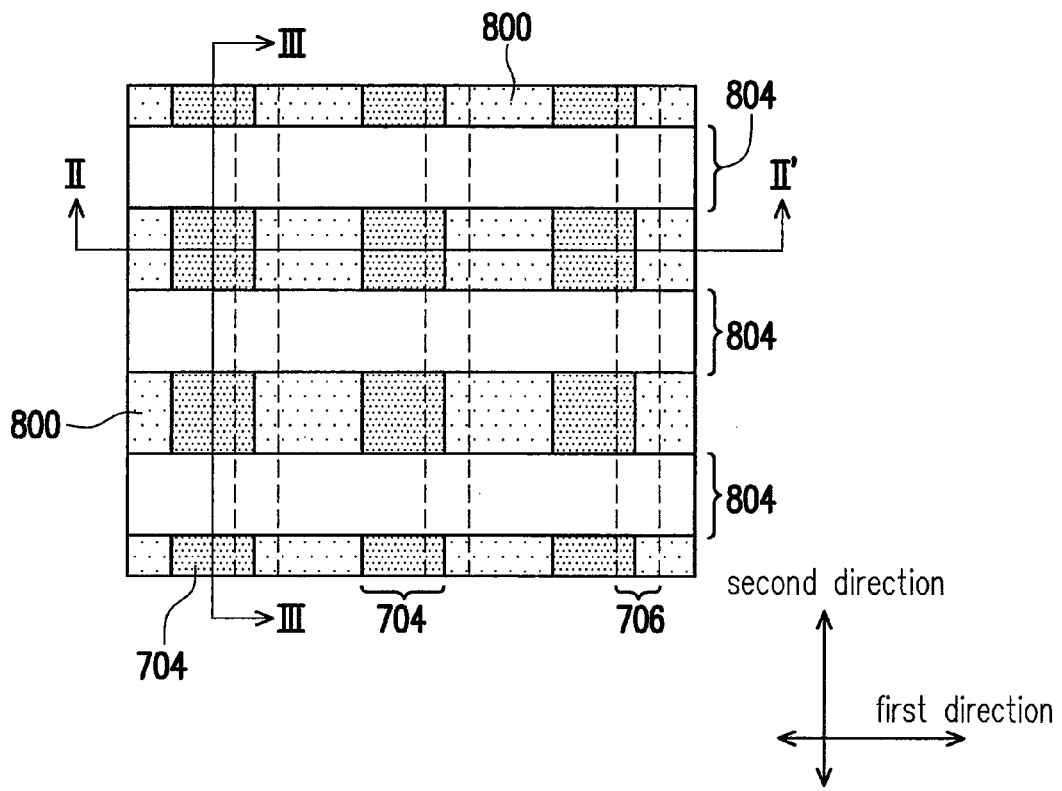
Figures 2, 8:
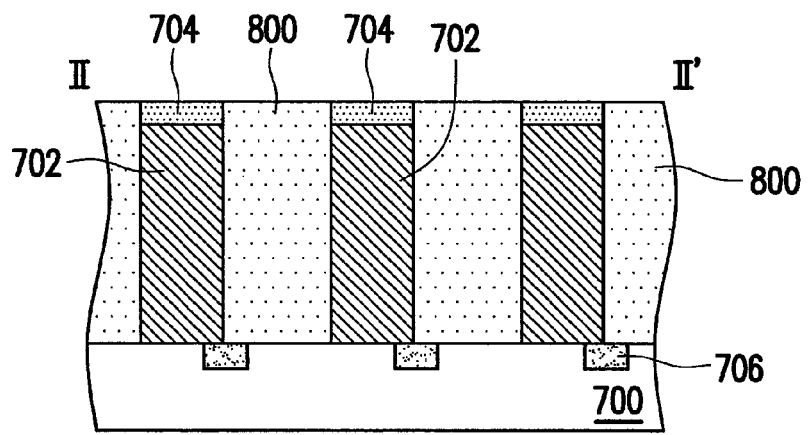
Figures 3, 8:
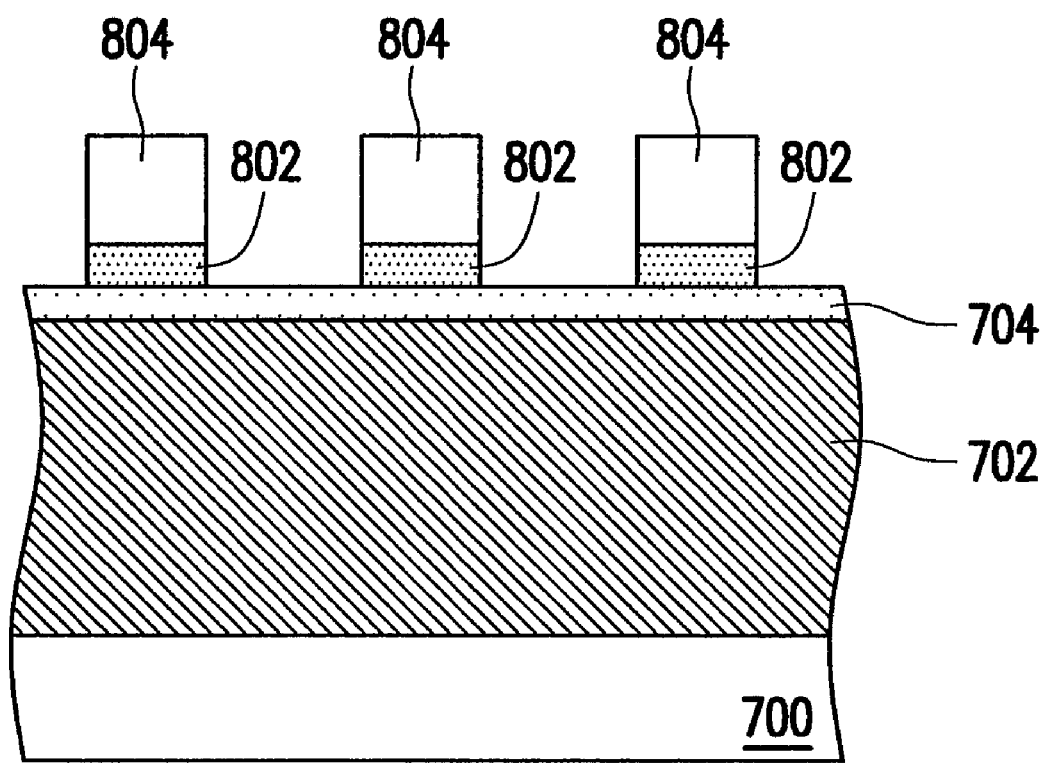

Next, referring to the top view of FIG. 8-1, the cross-sectional view of FIG. 8-2 taken along the sectional line II-II', and the cross-sectional view of FIG. 8-3 taken along a sectional line III-III, an oxidation layer 800 is deposited on the substrate 700 and fills between each of the semiconductor layers 702 as an insulation layer. Here, each of the semiconductor layers 702 has one of the hard marks 704 disposed thereon. Thereafter, a plurality of bar-shaped hard masks 802 extended along the first direction are formed on the hard masks 704 and the oxidation layer 800. Here, the hard masks 802 are made of silicon nitride, for example. Besides, the bar-shaped hard masks 802 are, for example, formed by etching an entire silicon nitride layer with use of photoresist layers 804 as the etching masks.

Figures 1, 9:
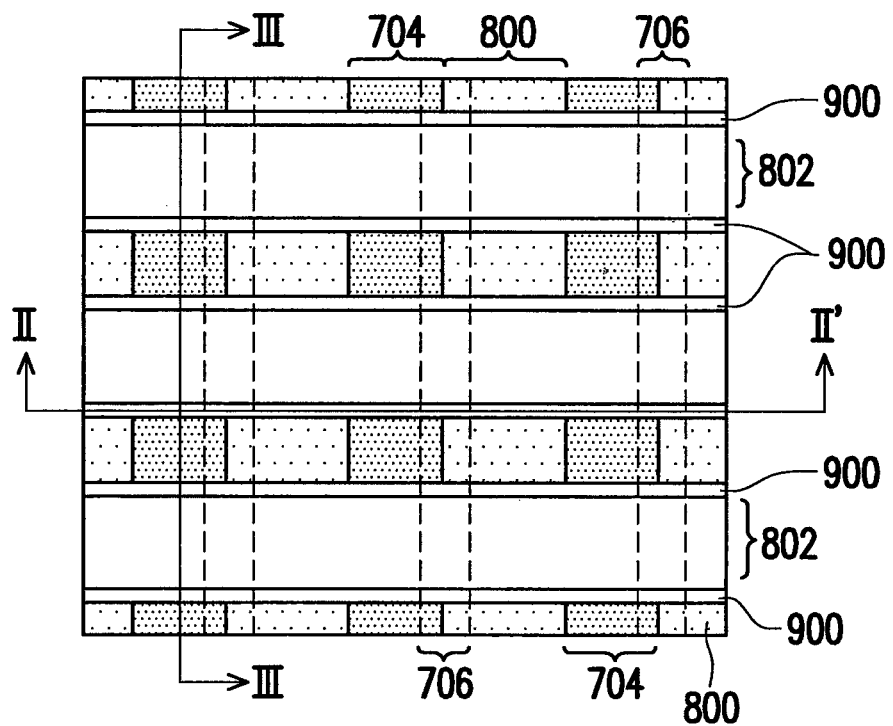
Figures 2, 9:
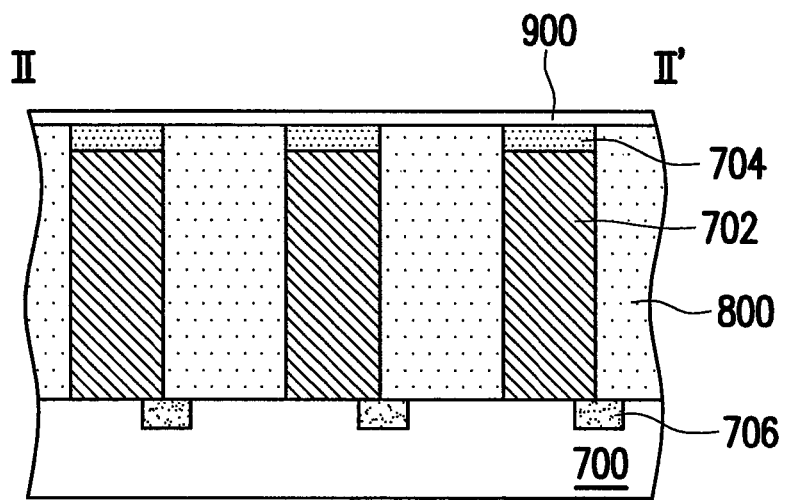
Figures 3, 9:
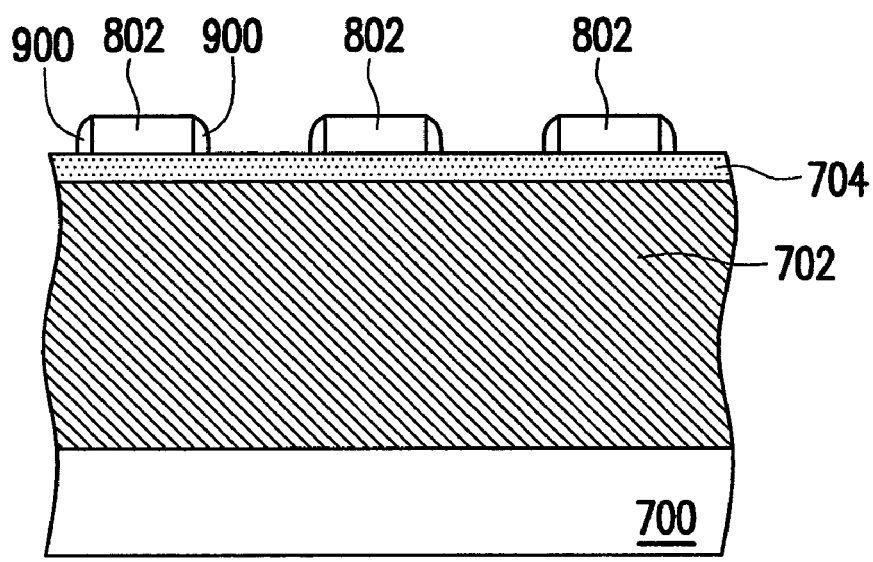

After that, referring to the top view of FIG. 9-1, the cross-sectional view of FIG. 9-2 taken along the sectional line II-II', and the cross-sectional view of FIG. 9-3 taken along the sectional line III-III, spacers 900 are formed on sidewalls of the hard masks 802 after the photoresist layers 804 are removed. The spacers 900 can be formed by collectively implementing a conventional deposition process and a dry etching process which can be easily accomplished by people skilled in the pertinent art. Additionally, the spacers 900 can be made of the same material as that of the hard masks 802 or can be made of other appropriate materials.

Figures 1, 10:
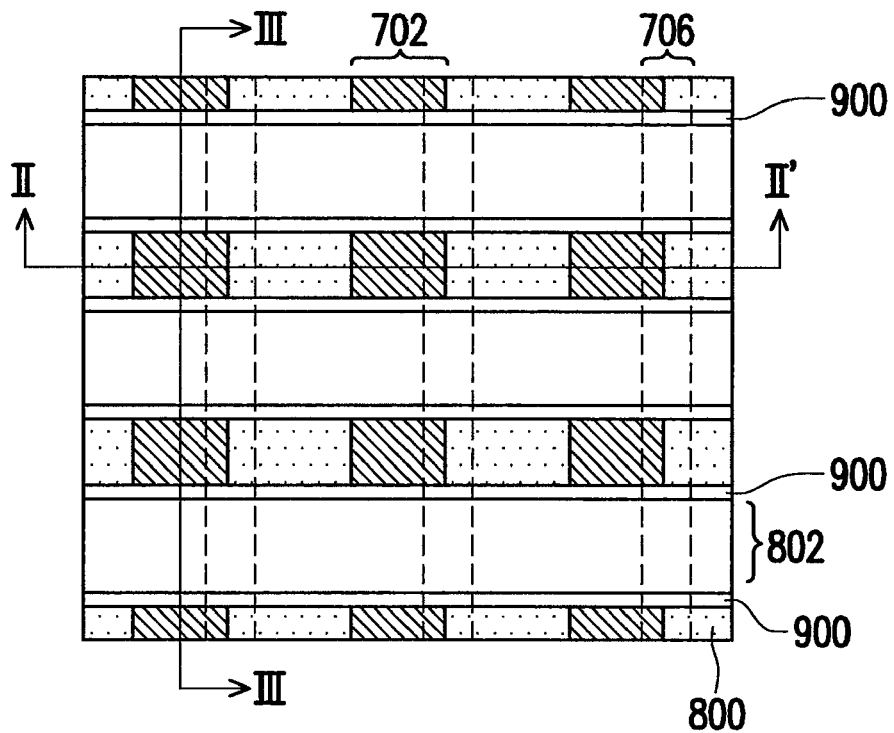
Figures 2, 10:
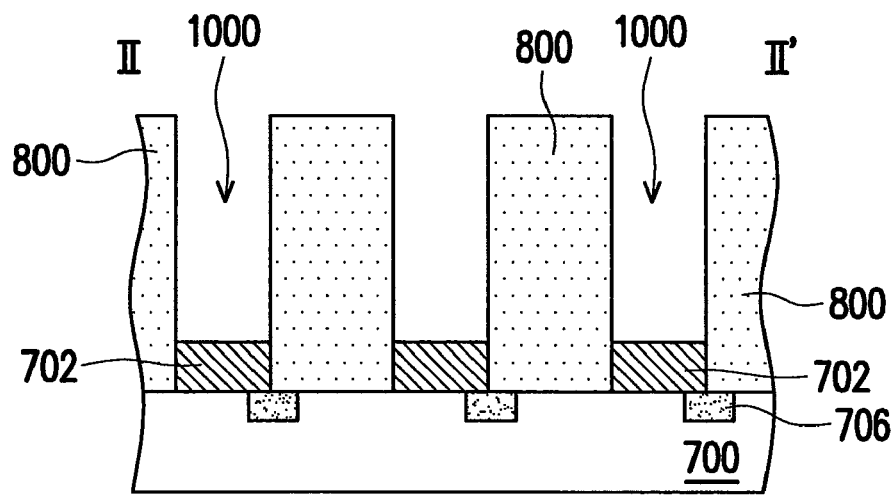
Figures 3, 10:
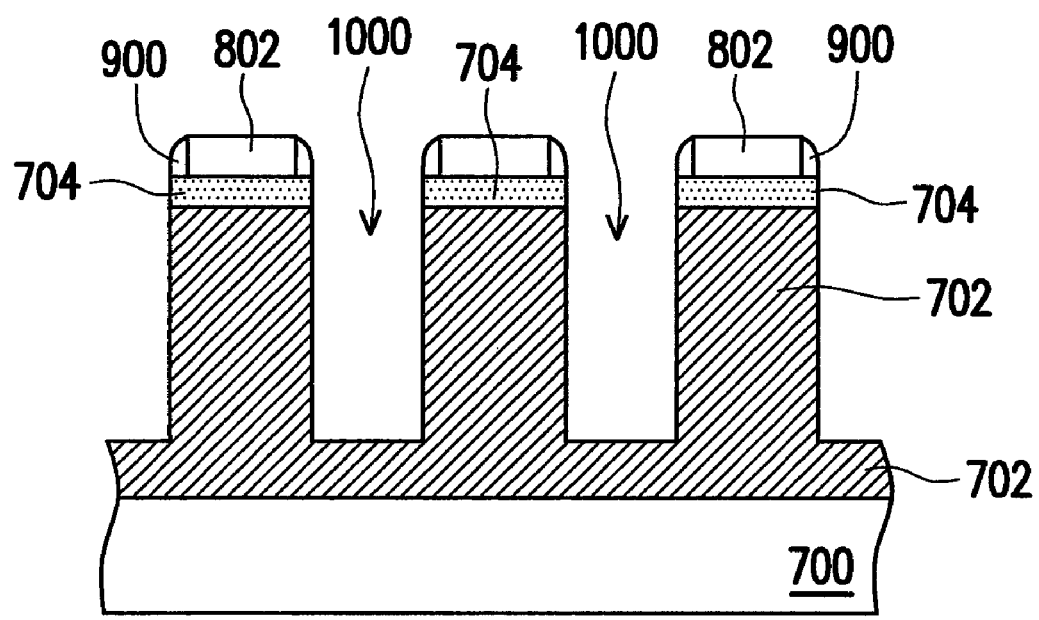

Afterwards, referring to the top view of FIG. 10-1, the cross-sectional view of FIG. 10-2 taken along the sectional line II-II', and the cross-sectional view of FIG. 10-3 taken along the sectional line III-III, the hard masks 704 that are not covered by the hard masks 802 and the spacers 900 are removed with use of the hard masks 802 and the spacers 900 as the etching masks, and the exposed semiconductor layers 702 are then etched to form a cavity 1000 in each of the semiconductor layers 702.

Figures 1, 11:
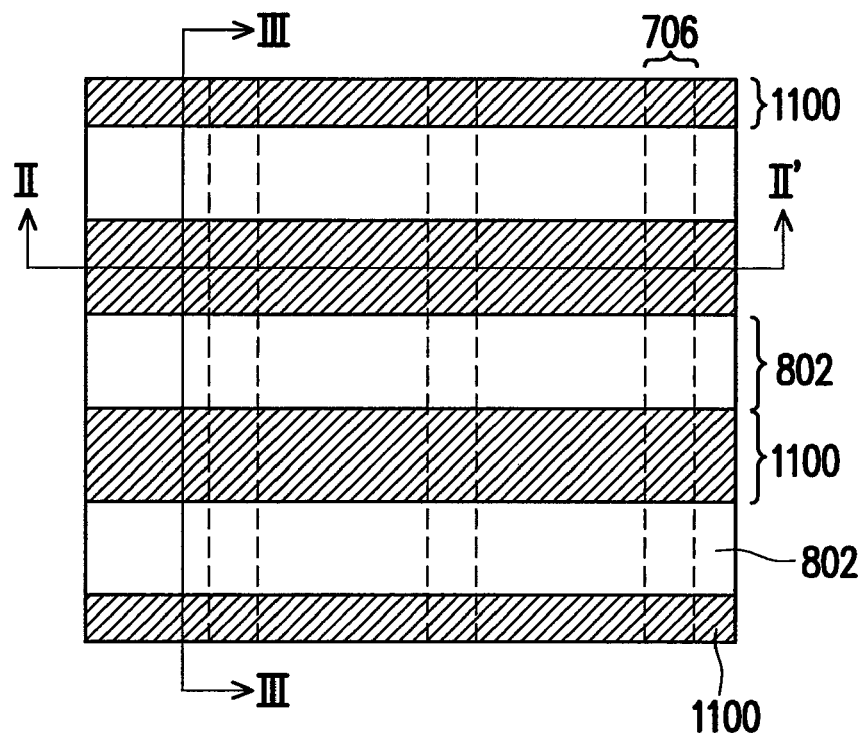
Figures 2, 11:
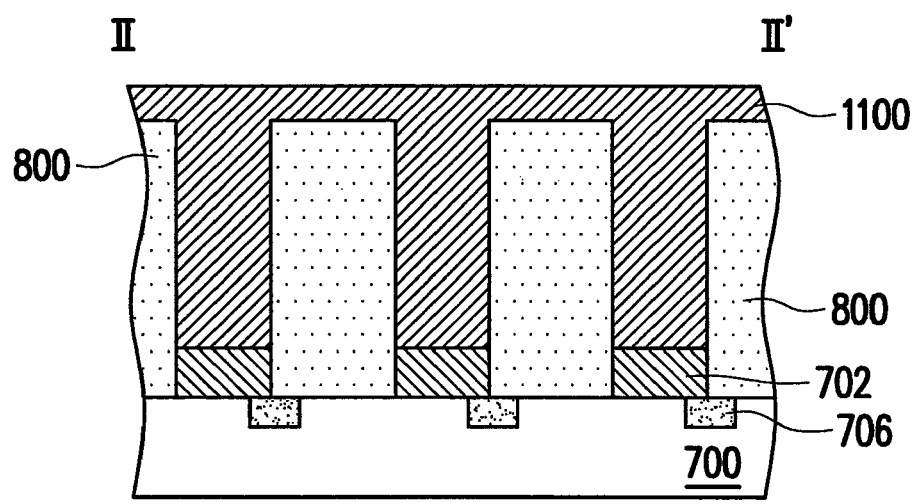
Figures 3, 11:
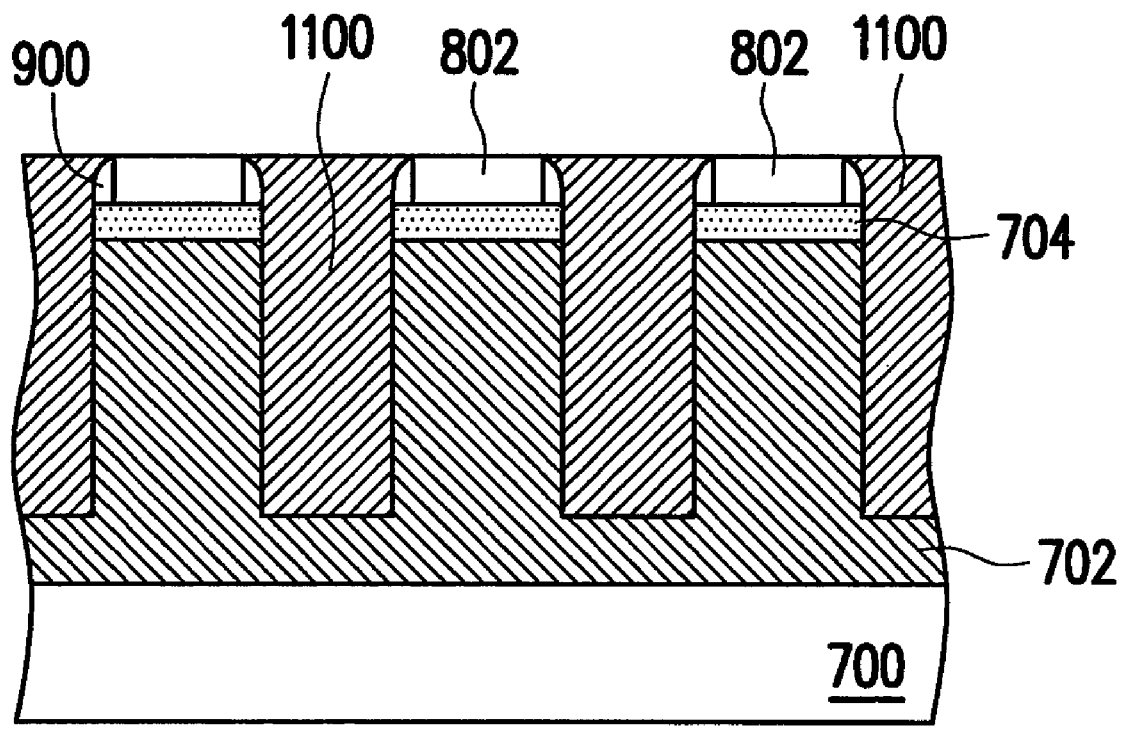

Next, referring to the top view of FIG. 11-1, the cross-sectional view of FIG. 11-2 taken along the sectional line II-II', and the cross-sectional view of FIG. 11-3 taken along the sectional line III-III, a sacrificial layer 1100 (e.g. a carbon layer) is deposited on the substrate 700. The sacrificial layer 1100 has respective etching selectivity ratios relative to the hard masks 704 and 802, the spacers 900, and the semiconductor layers 702. Here, a chemical-mechanical polishing (CMP) process can be continuously carried out for planarizing the sacrificial layer 1100 until the hard masks 802 are exposed.

Figures 1, 12:
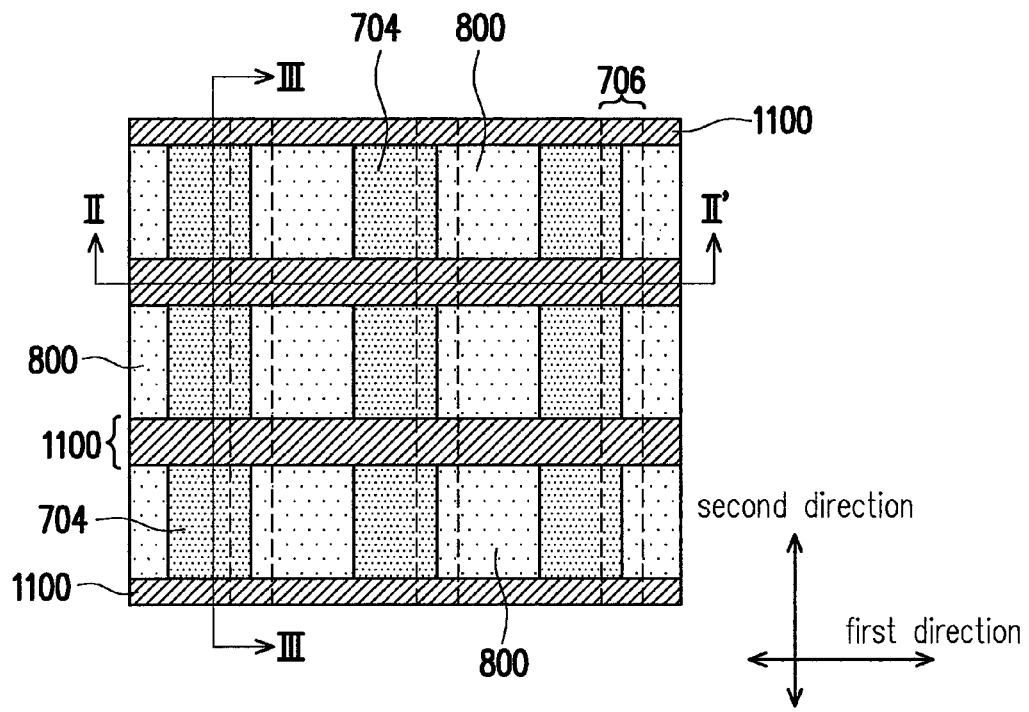
Figures 2, 12:
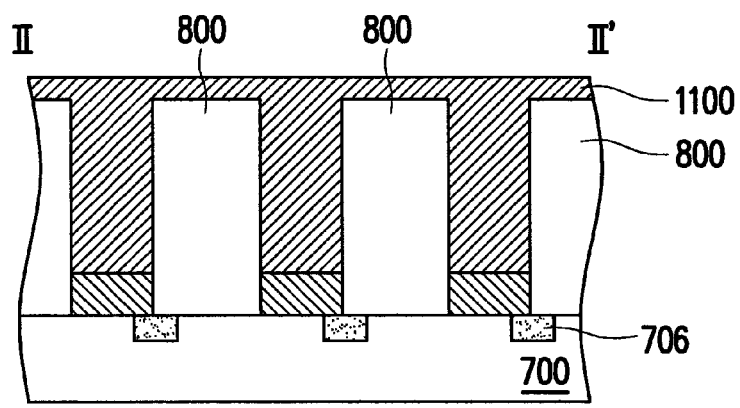
Figures 3, 12:
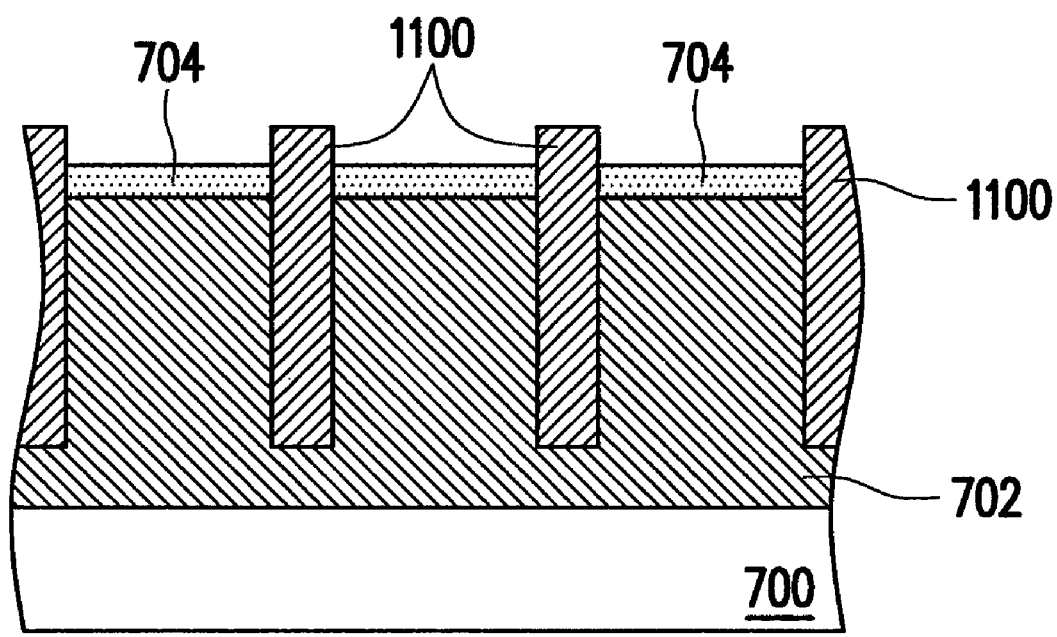

Next, referring to the top view of FIG. 12-1, the cross-sectional view of FIG. 12-2 taken along the sectional line II-II', and the cross-sectional view of FIG. 12-3 taken along the sectional line III-III, the sacrificial layer 1100 is slightly etched to expose the spacers 900 (as shown in FIG. 11-3). After that, the hard masks 802 and the spacers 900 are completely removed, while the sacrificial layer 1100 extended in the first direction remains.

Figures 1, 13:
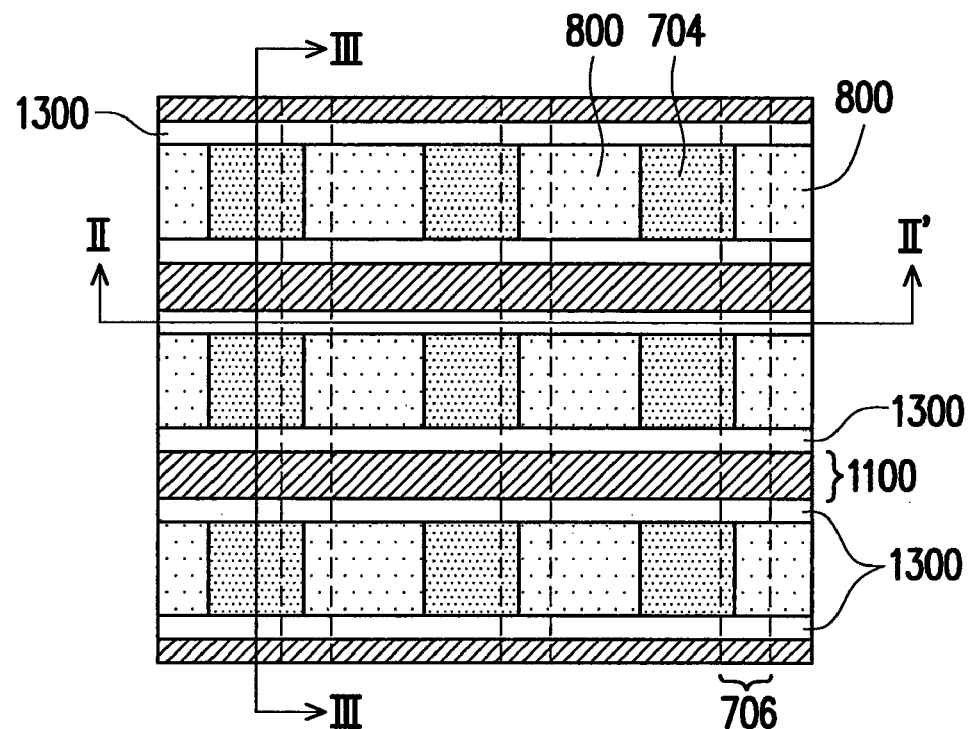
Figures 2, 13:
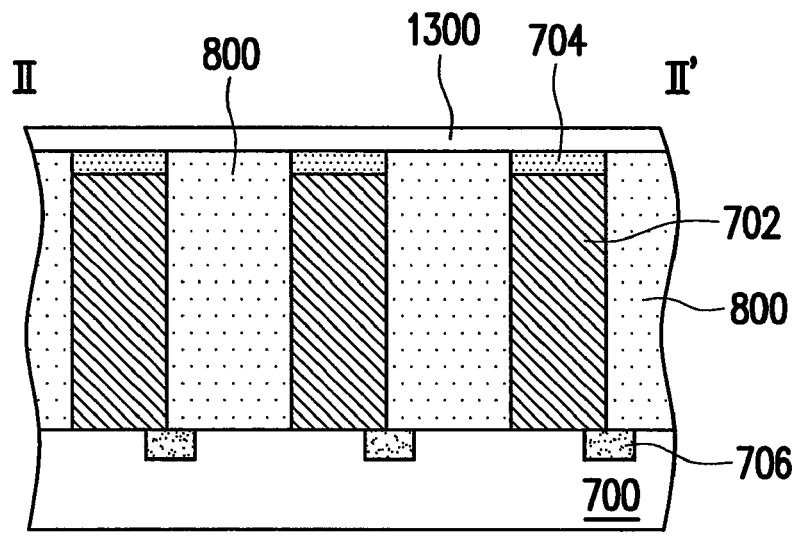
Figures 3, 13:
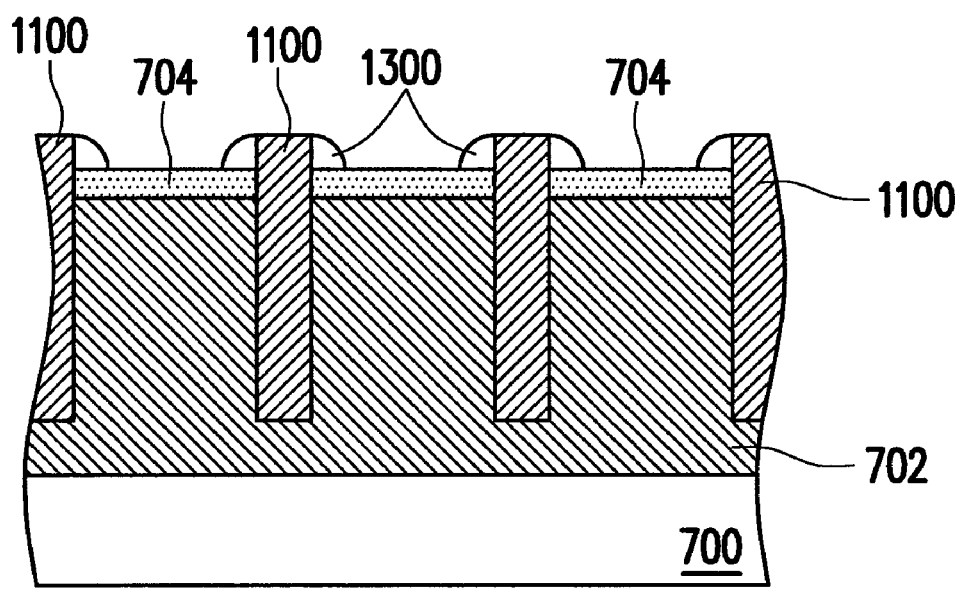

Thereafter, referring to the top view of FIG. 13-1, the cross-sectional view of FIG. 13-2 taken along the sectional line II-II', and the cross-sectional view of FIG. 13-3 taken along the sectional line III-III, spacers 1300 are formed on sidewalls of the sacrificial layer 1100 which protrudes from the hark masks 704. The spacers 1300 can be formed by collectively implementing the conventional deposition process and the dry etching process which can be easily accomplished by people skilled in the pertinent art.

Figures 1, 14:
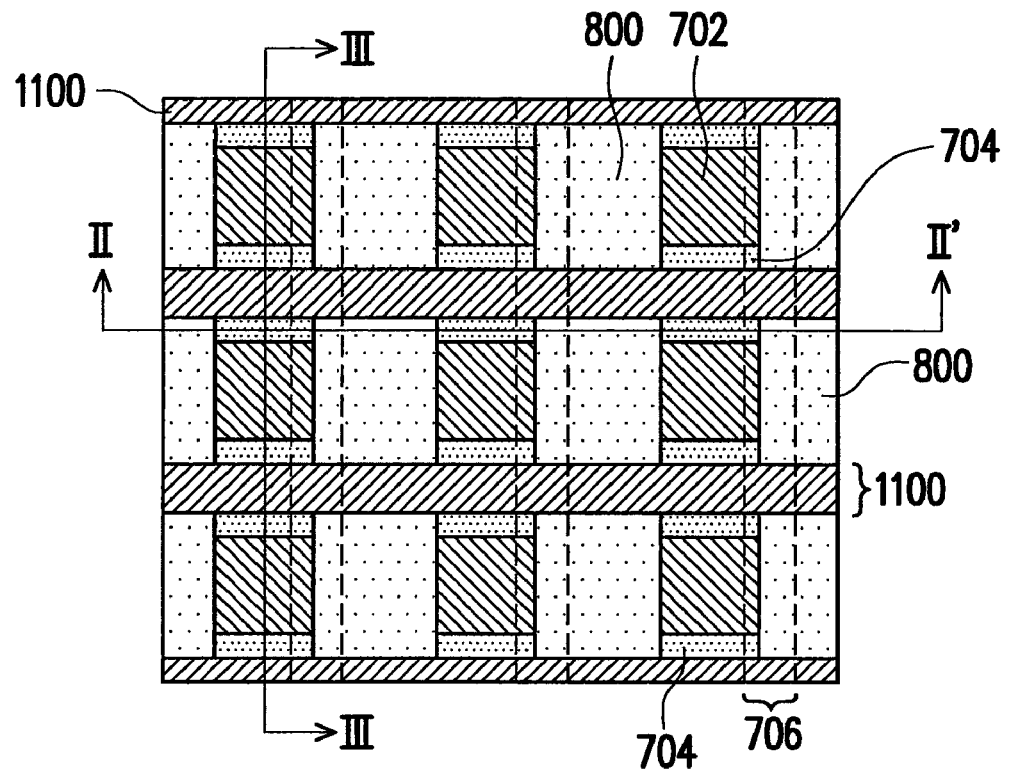
Figures 2, 14:
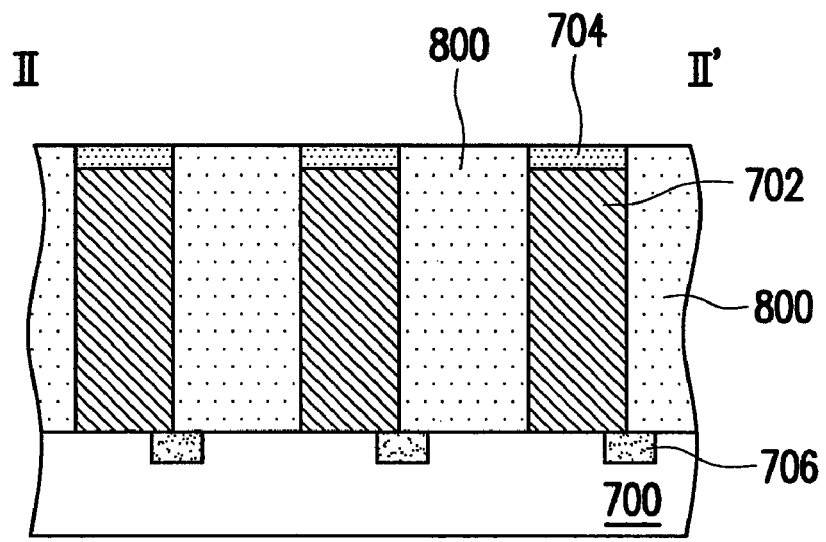
Figures 3, 14:
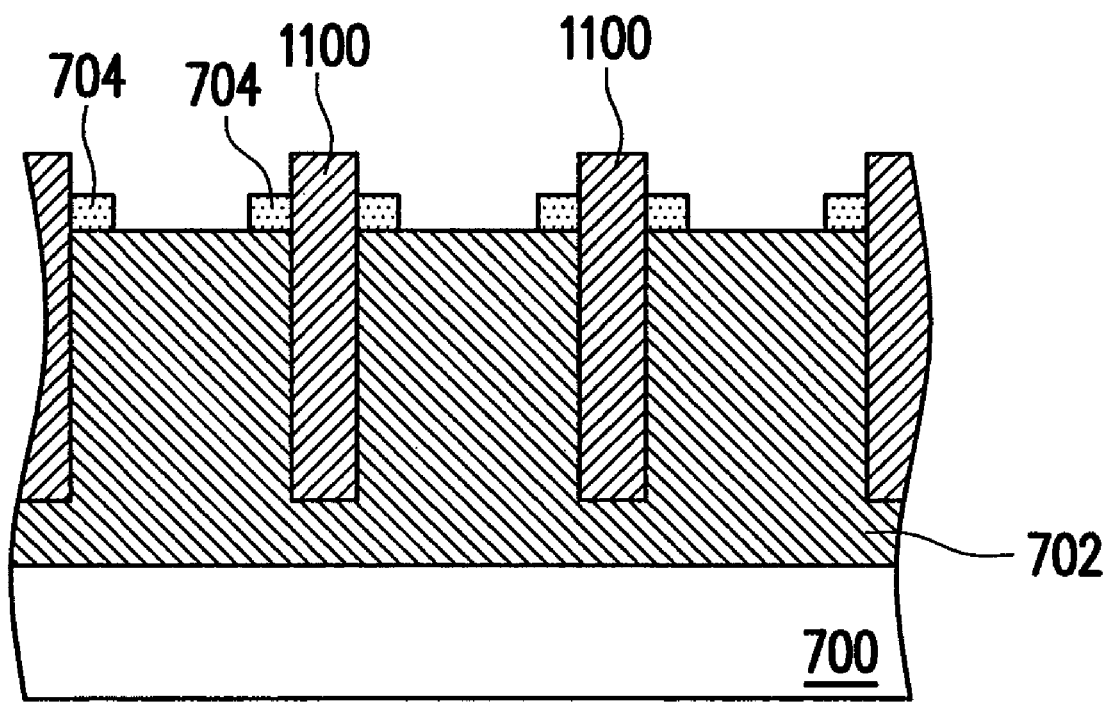

Referring to the top view of FIG. 14-1, the cross-sectional view of FIG. 14-2 taken along the sectional line II-II', and the cross-sectional view of FIG. 14-3 taken along the sectional line III-III, the hark masks 704 which are not covered by the spacers 1300 are then removed with use of the spacers 1300 as the etching masks, such that the remaining hard masks 704 are merely disposed at respective sides of the sacrificial layer 1100. Next, the spacers 1300 are completely removed.

Figures 1, 15:
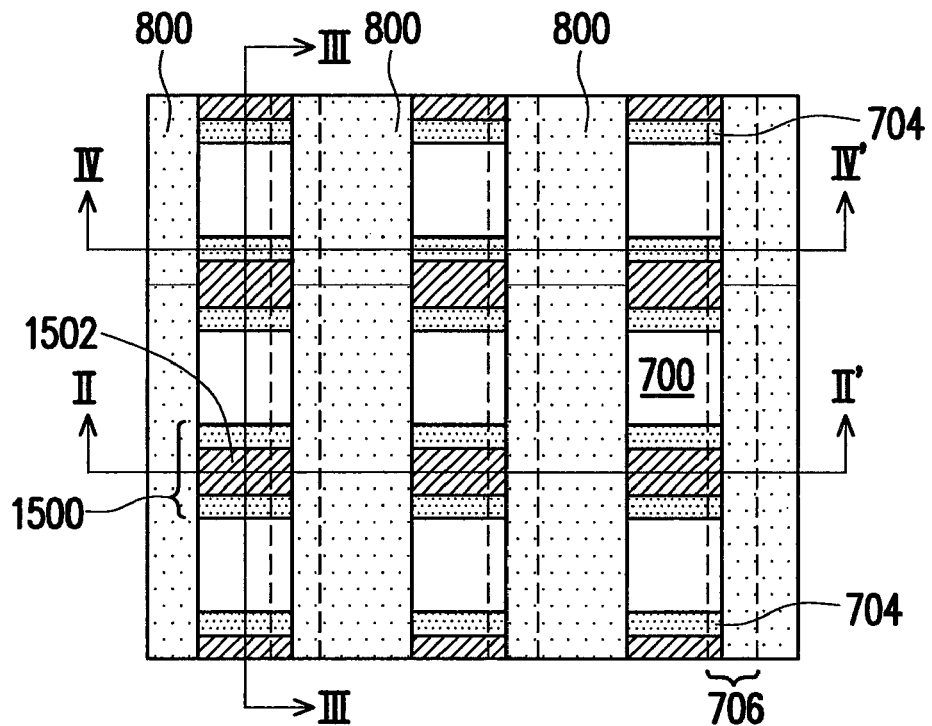
Figures 2, 15:
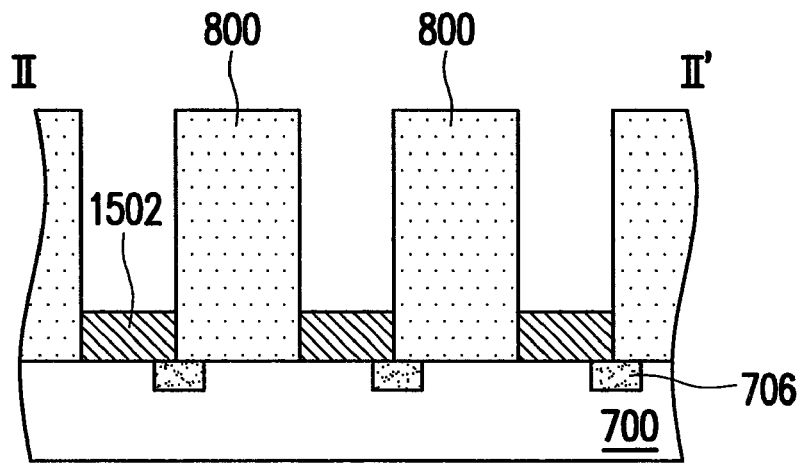
Figures 3, 15:
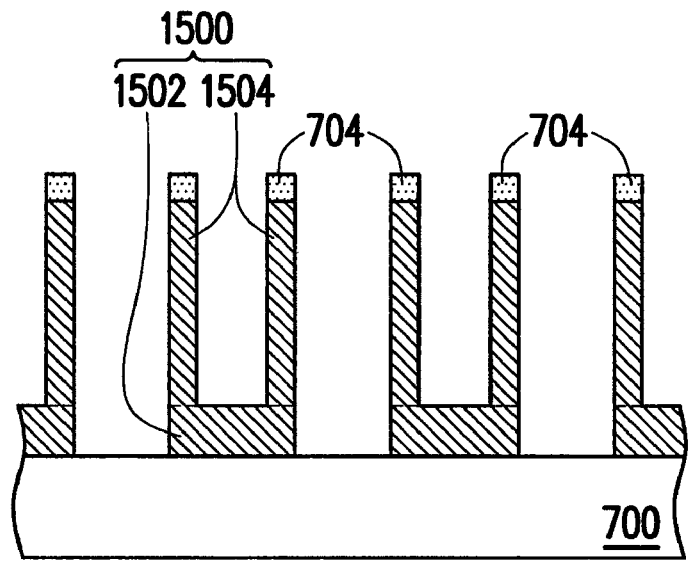
Figures 4, 15:
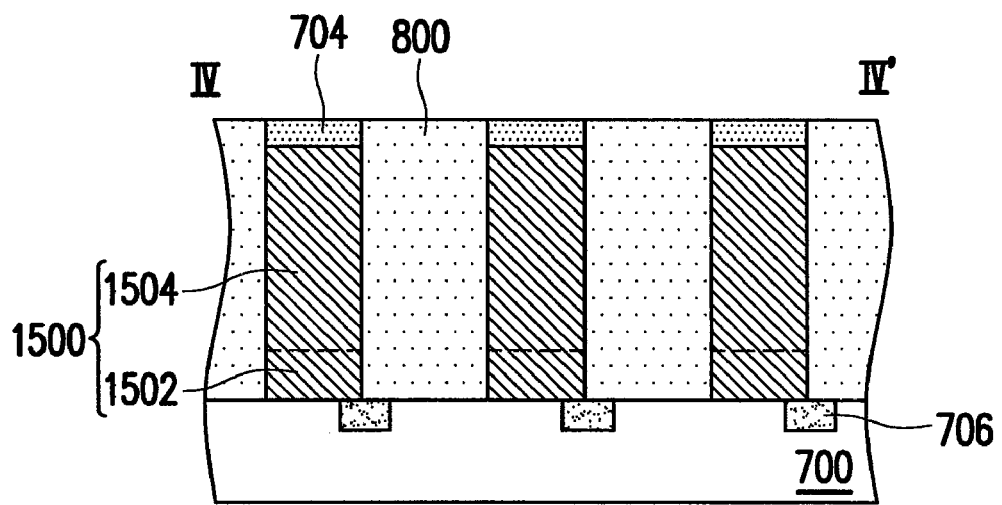

Thereafter, referring to the top view of FIG. 15-1, the cross-sectional view of FIG. 15-2 taken along the sectional line II-II', the cross-sectional view of FIG. 15-3 taken along the sectional line III-III, and the cross-sectional view of FIG. 15-4 taken along a sectional line IV-IV', the semiconductor layers 702 that are not covered by the hard masks 704 are continuously etched with use of the remaining hard masks 704 as the etching masks until the substrate 700 is exposed, so as to form semiconductor structures 1500. Afterwards, the sacrificial layer 1100 is completely removed. As a result, the semiconductor structures 1500 are formed as indicated in FIG. 15-3, and each of the semiconductor structures 1500 includes two vertical plates 1504 and a bottom plate 1502.

Figures 1, 16:
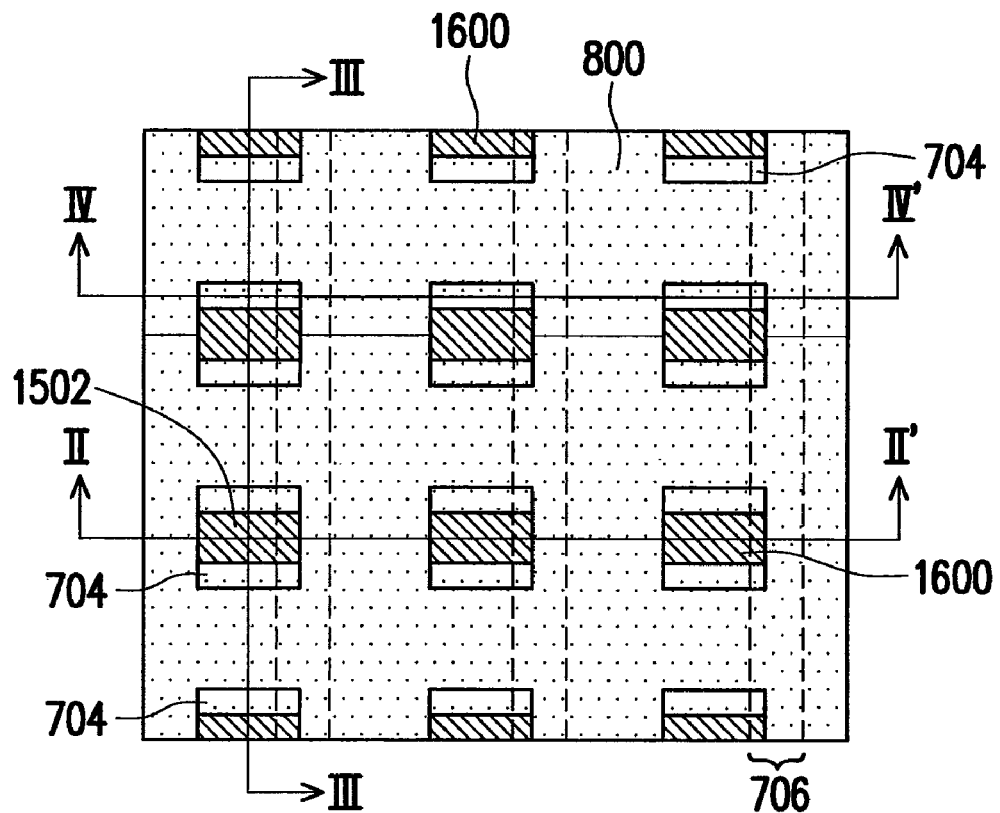
Figures 2, 16:
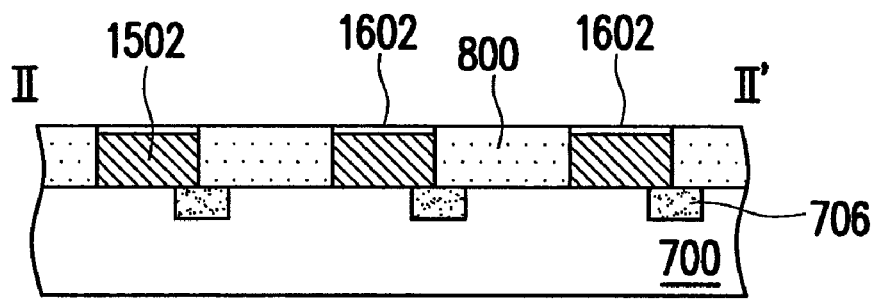
Figures 3, 16:
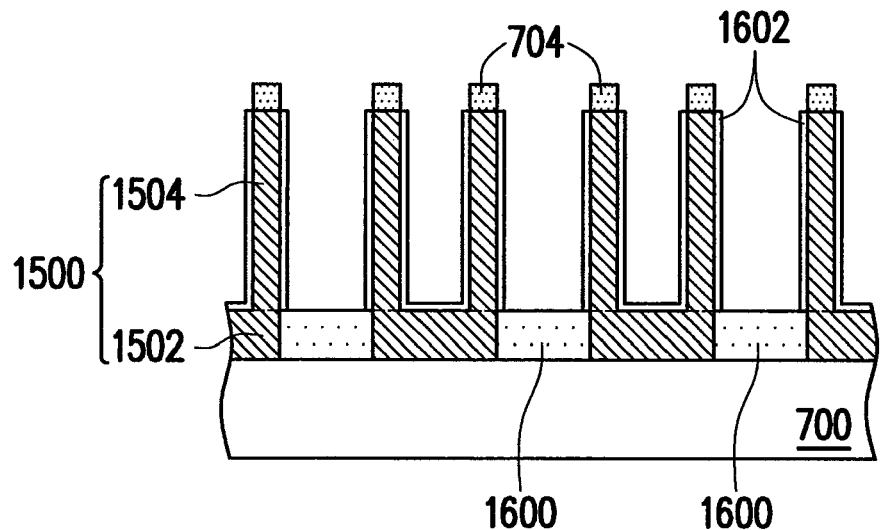
Figures 4, 16:
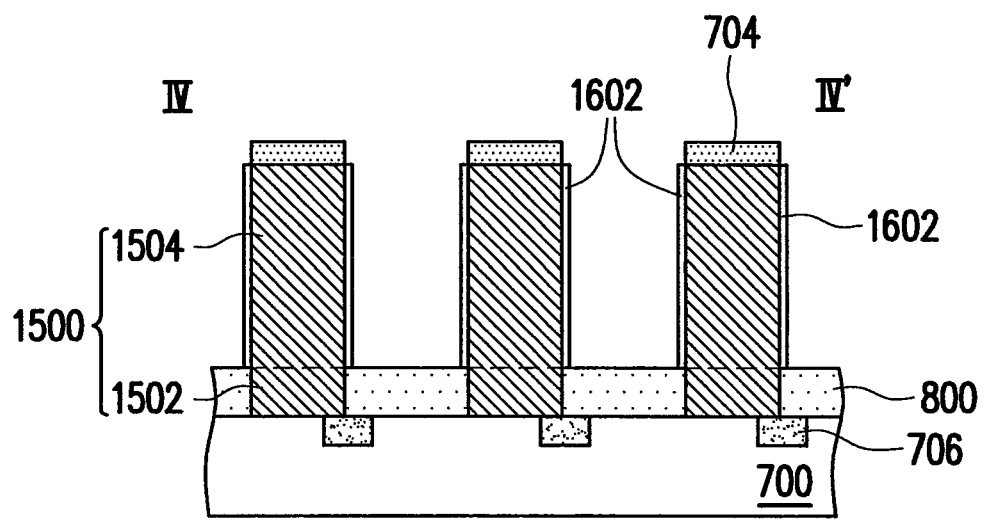

Next, referring to the top view of FIG. 16-1, the cross-sectional view of FIG. 16-2 taken along the sectional line II-II', the cross-sectional view of FIG. 16-3 taken along the sectional line III-III, and the cross-sectional view of FIG. 16-4 taken along the sectional line IV-IV', an oxidation layer 1600 is deposited on the substrate 700, and parts of the oxidations layers 800 and 1600 are removed, so as to recess the oxidations layers 800 and 1600 and to expose the vertical plates 1504 of each of the semiconductor structures 1500. Gate dielectric layers 1602 are then formed on exposed portions of the semiconductor structures 1500. Given that the semiconductor structure 1500 is made of polysilicon, the gate dielectric layer 1602 can be formed by thermal oxidation, such that a silicon oxide thin film acting as the gate dielectric layer can be formed on a surface of the polysilicon.

Figures 1, 17:
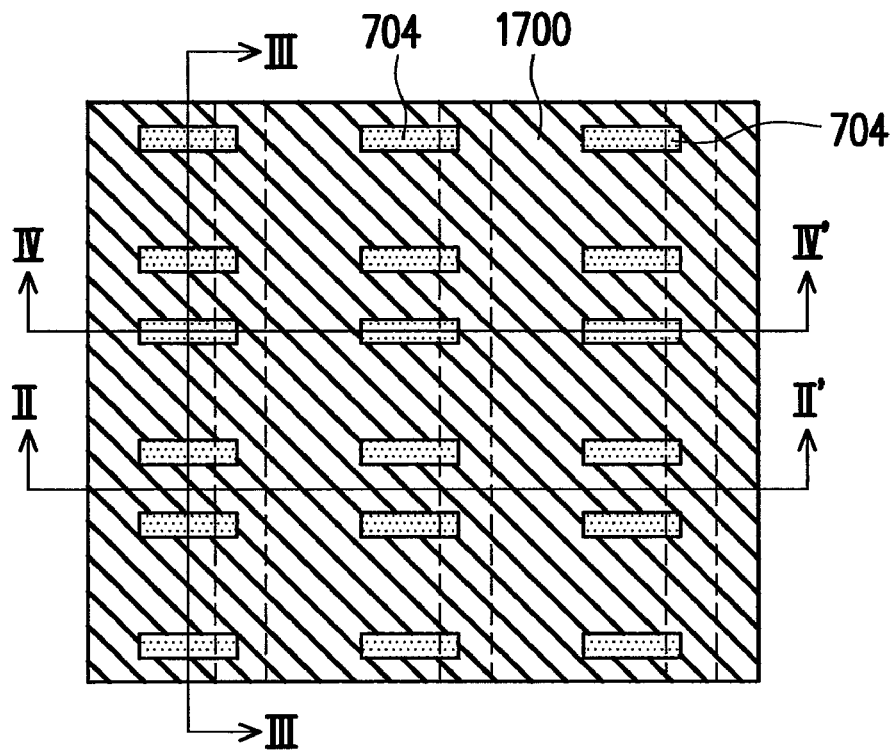
Figures 2, 17:
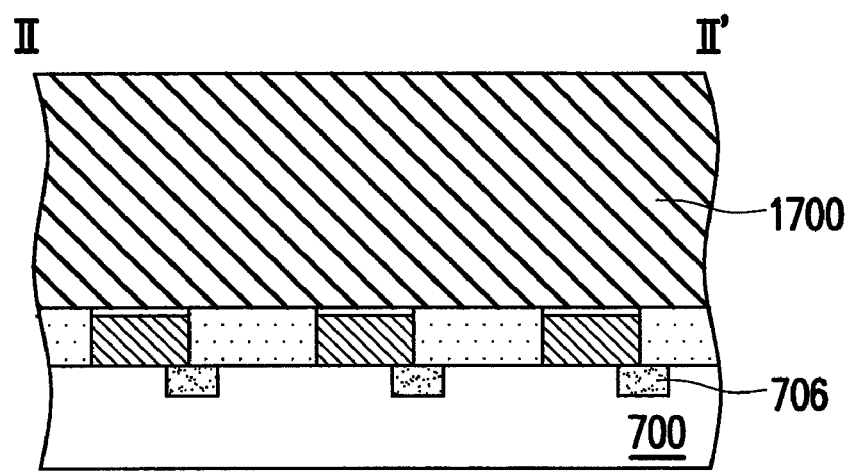
Figures 3, 17:
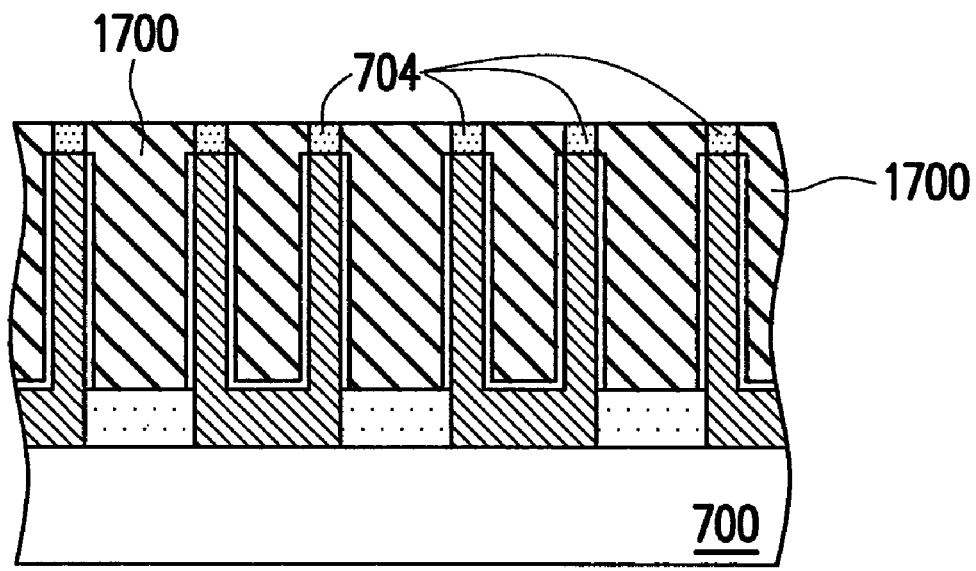
Figures 4, 17:
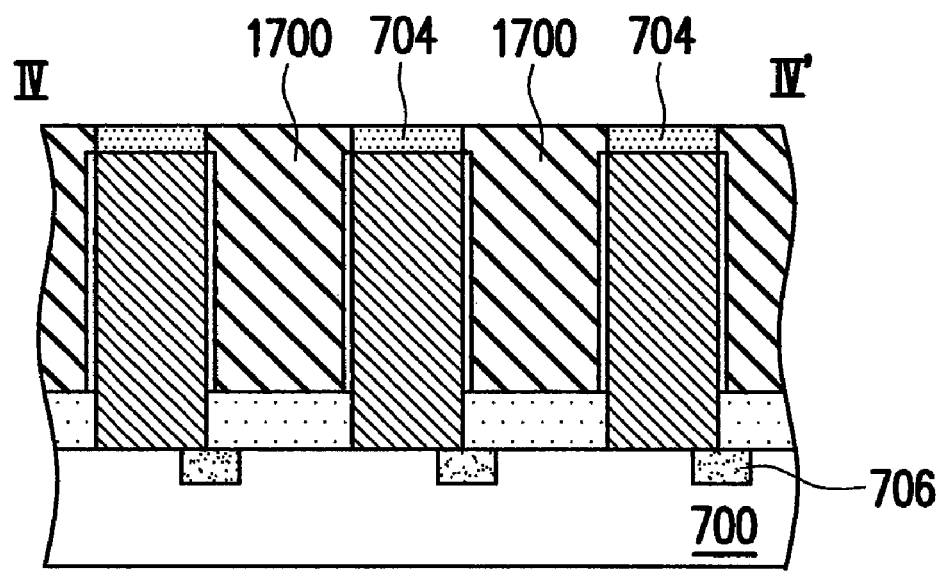

After that, referring to the top view of FIG. 17-1, the cross-sectional view of FIG. 17-2 taken along the sectional line II-II', the cross-sectional view of FIG. 17-3 taken along the sectional line III-III, and the cross-sectional view of FIG. 17-4 taken along the sectional line IV-IV', a gate material 1700 is deposited on the substrate 700 and continuously planarized by performing the CMP process until the hard masks 704 are exposed. The gate material 1700 can be a conventional gate material, such as metals, carbon, polysilicon, and so on.

Figures 1, 18:
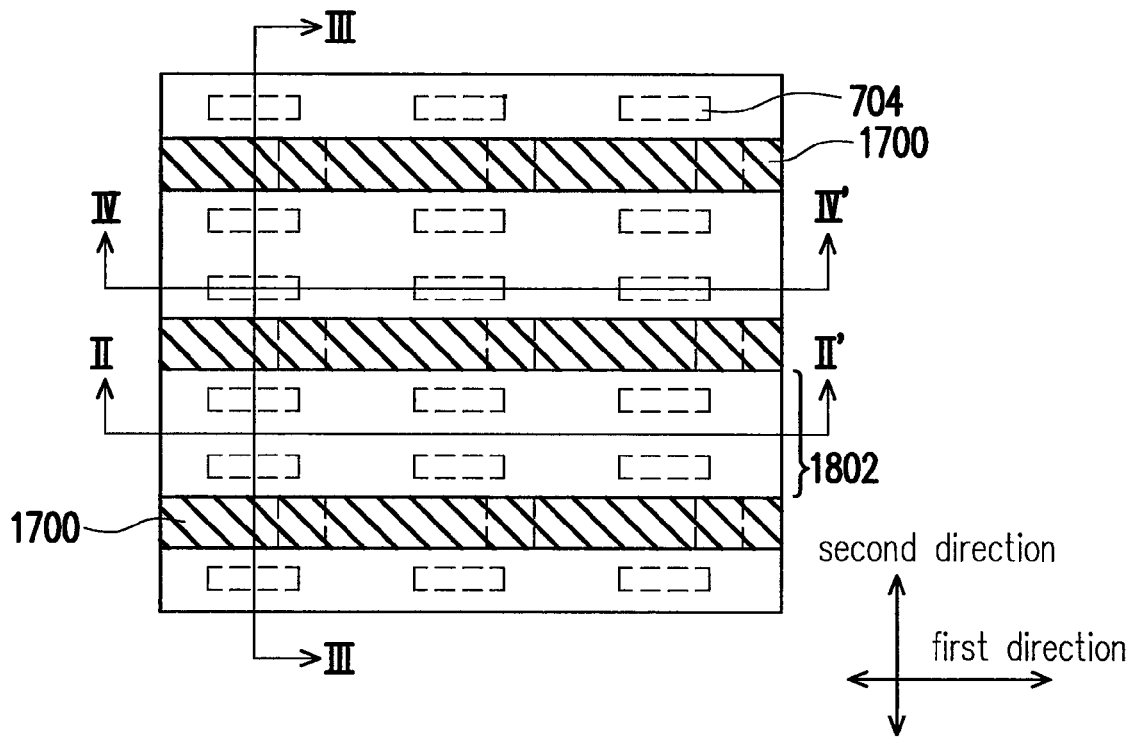
Figures 2, 18:
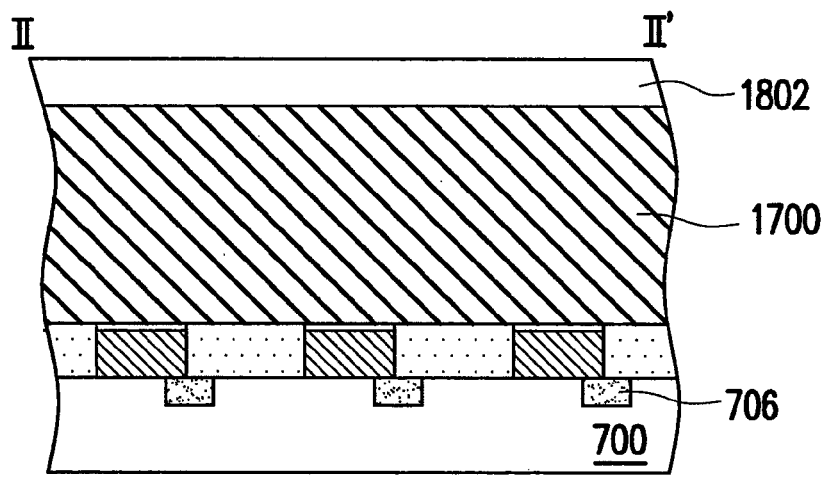
Figures 3, 18:
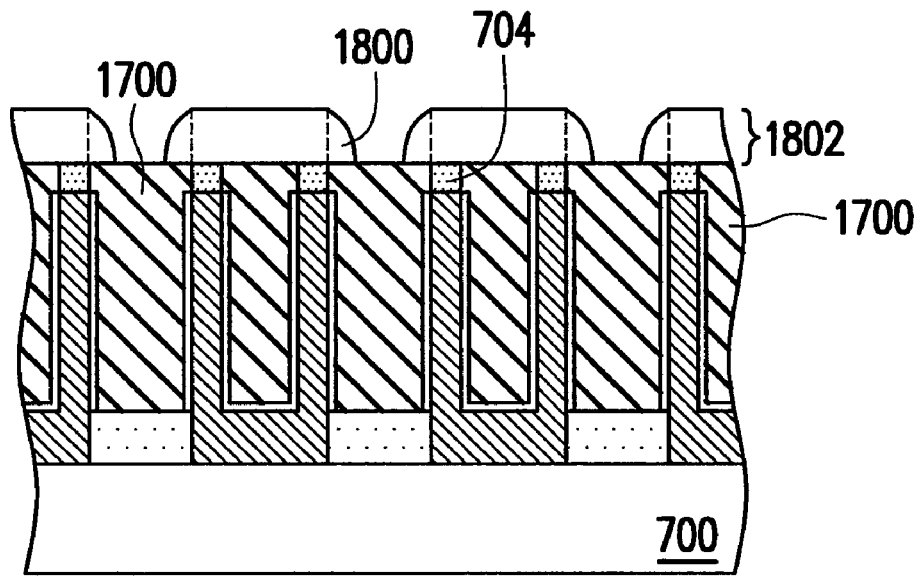
Figures 4, 18:
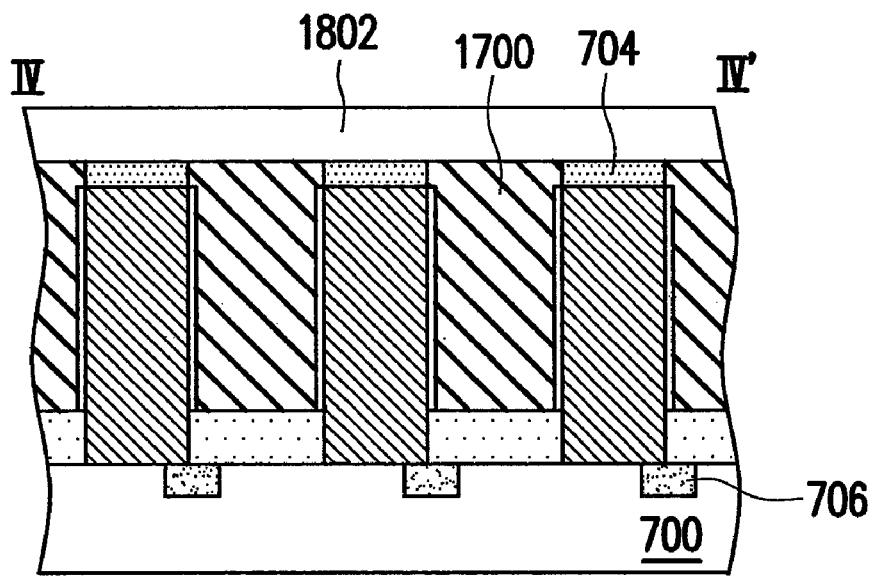

Thereafter, referring to the top view of FIG. 18-1, the cross-sectional view of FIG. 18-2 taken along the sectional line II-II', the cross-sectional view of FIG. 18-3 taken along the sectional line III-III, and the cross-sectional view of FIG. 18-4 taken along the sectional line IV-IV', hard masks 1802 having spacers 1800 are formed at regions where gate lines are intended to be formed, and a portion of the gate material 1700 is exposed. The hard masks 1802 and the spacers 1800 thereof can be thoroughly formed by performing conventional semiconductor processes, such as deposition, exposure and development, etching, and so forth.

Figures 1, 19:
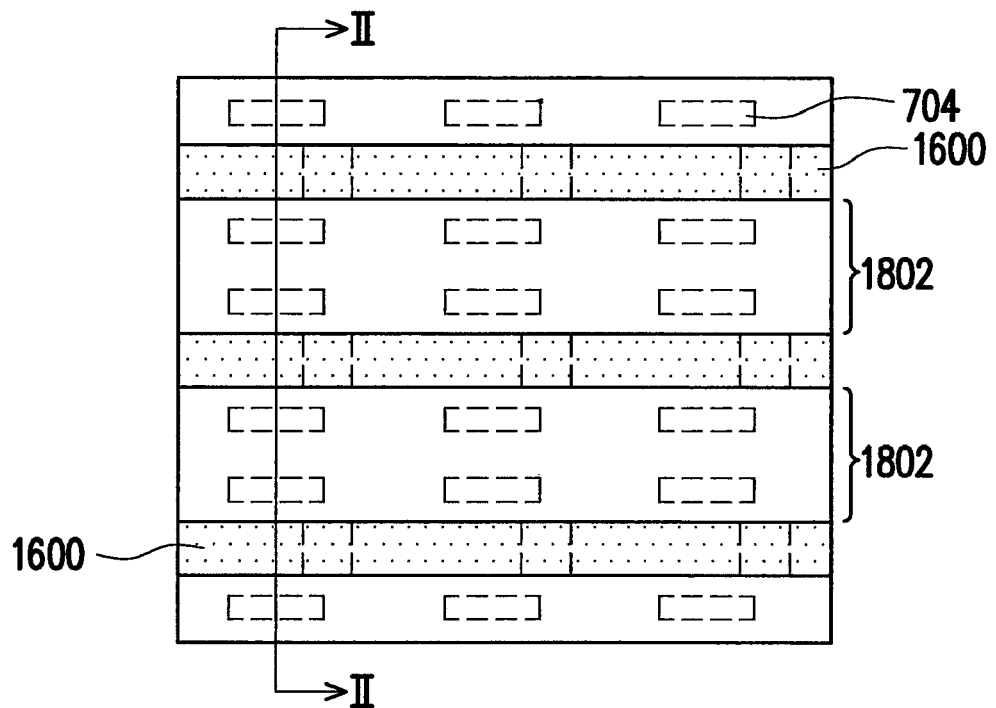
Figures 2, 19:
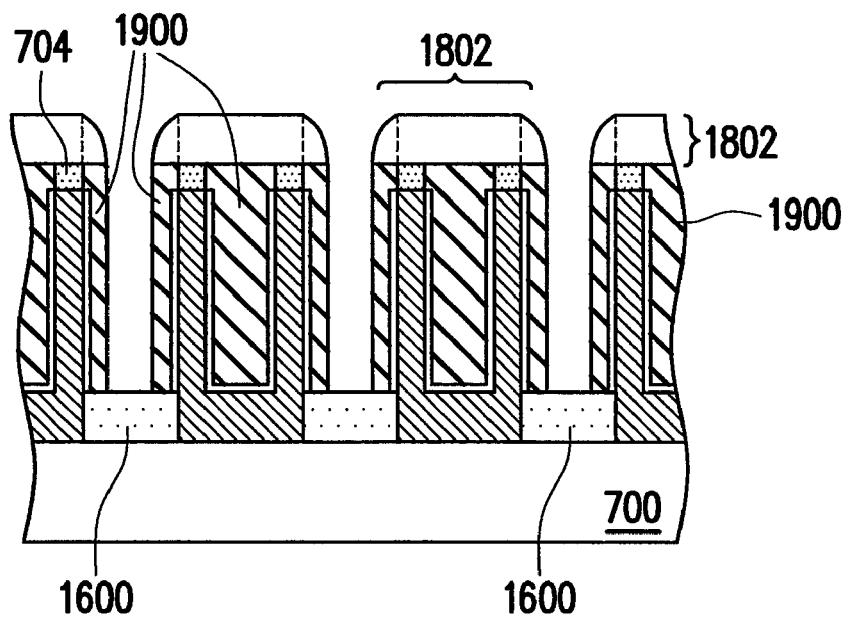

Afterwards, referring to the top view of FIG. 19-1 and the cross-sectional view of FIG. 19-2 taken along the sectional line II-II, the exposed gate material 1700 is continuously etched with use of the hard masks 1802 as the etching masks until the oxidation layer 1600 is exposed, so as to form gate lines 1900.

Figures 1, 20:
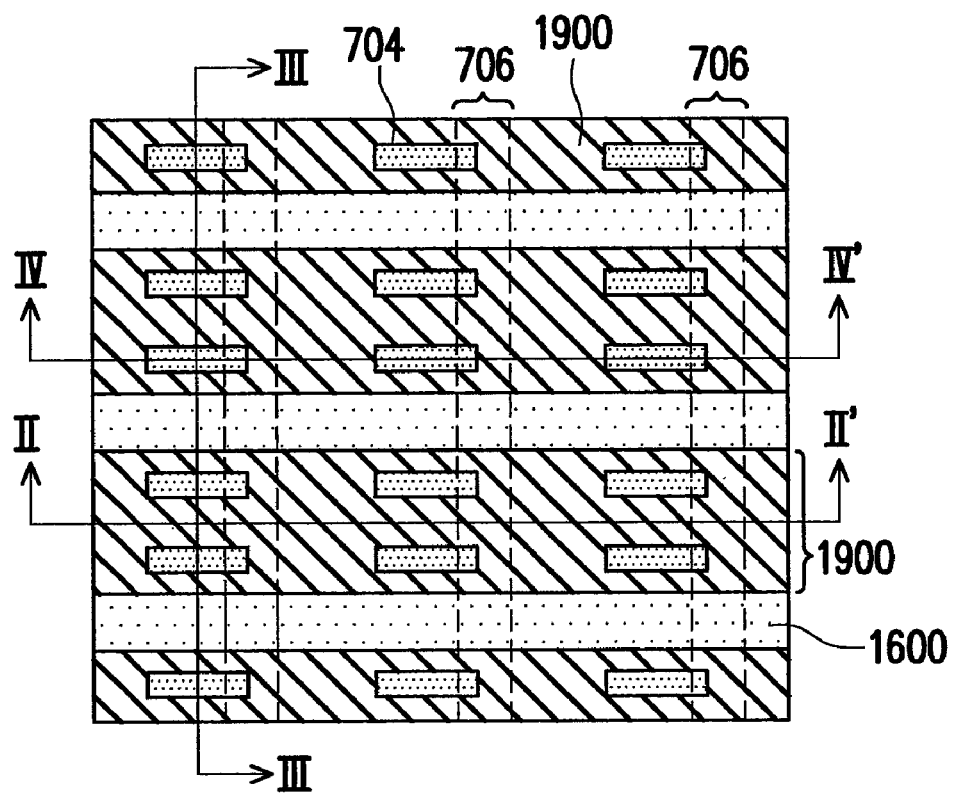
Figures 2, 20:
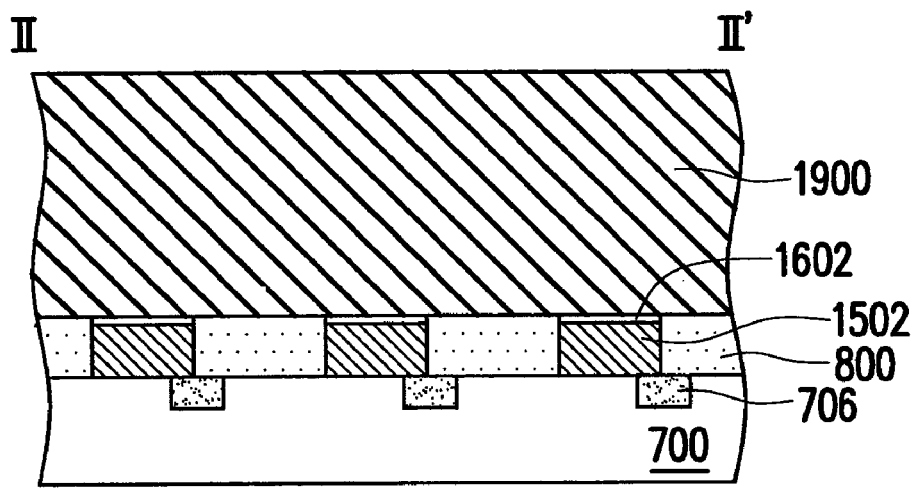
Figures 3, 20:
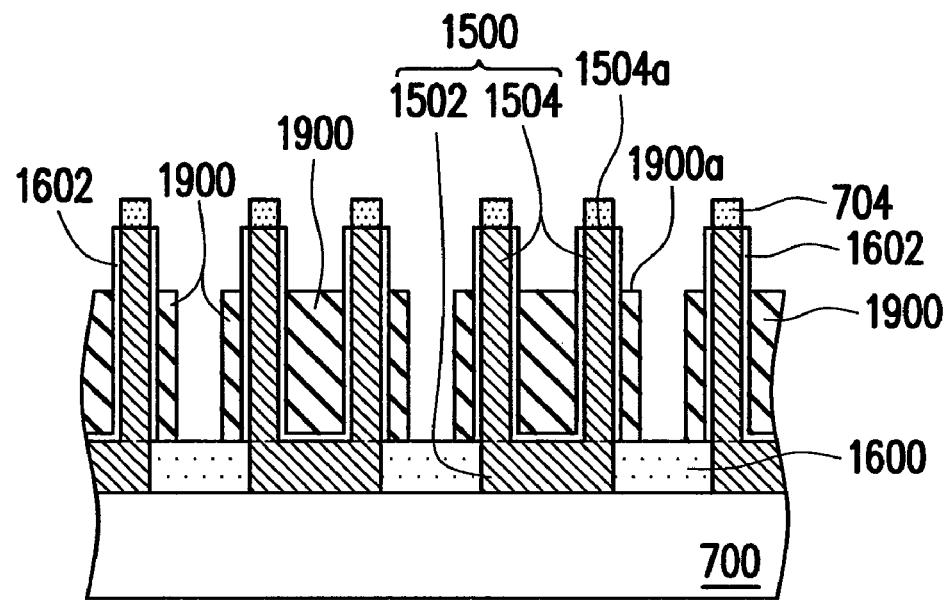
Figures 4, 20:
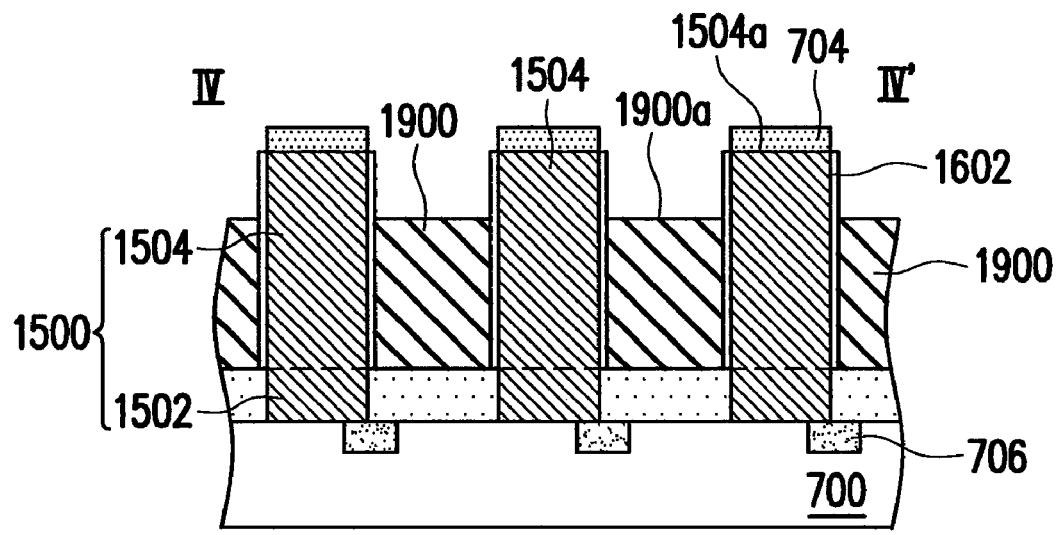

Next, referring to the top view of FIG. 20-1, the cross-sectional view of FIG. 20-2 taken along the sectional line II-II', the cross-sectional view of FIG. 20-3 taken along the sectional line III-III, and the cross-sectional view of FIG. 20-4 taken along the sectional line IV-IV', the hard masks 1802 are completely removed, and the thickness of the gate lines 1900 is then reduced, such that upper surfaces 1900a of the gate lines 1900 are lower than tops 1504a of the vertical plates 1504 of the semiconductor structures 1500.

Figures 1, 21:
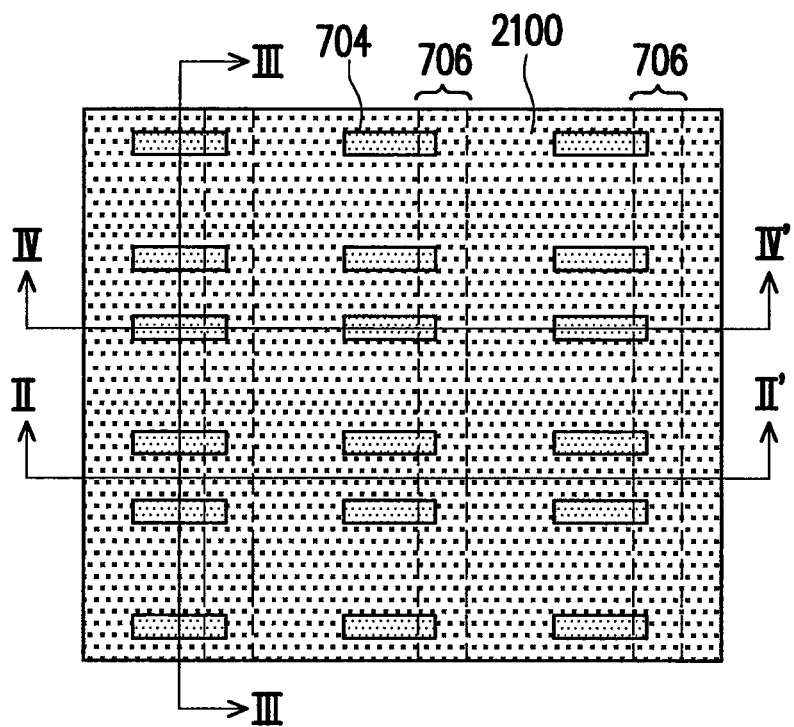
Figures 2, 21:
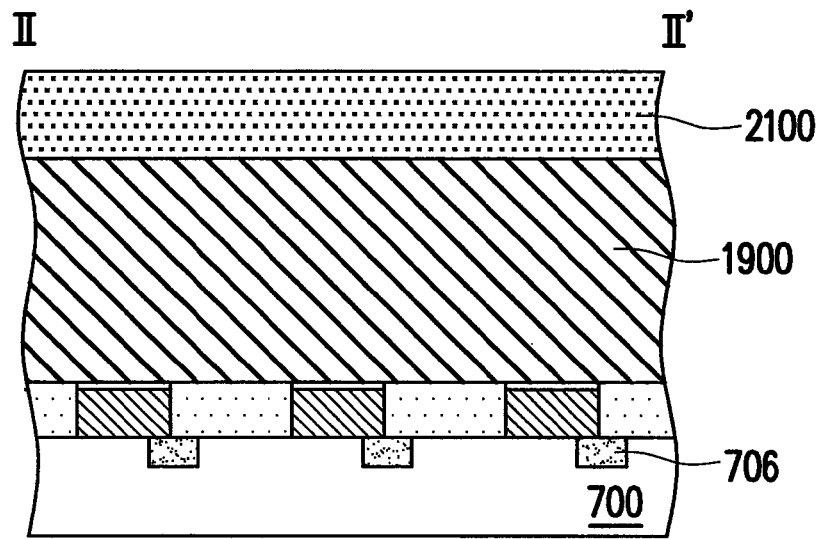
Figures 3, 21:
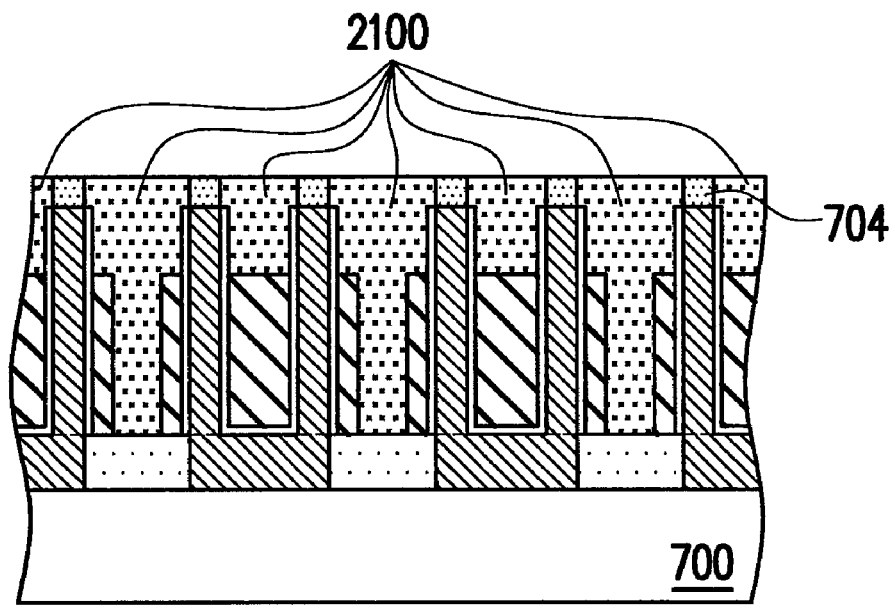
Figures 4, 21:
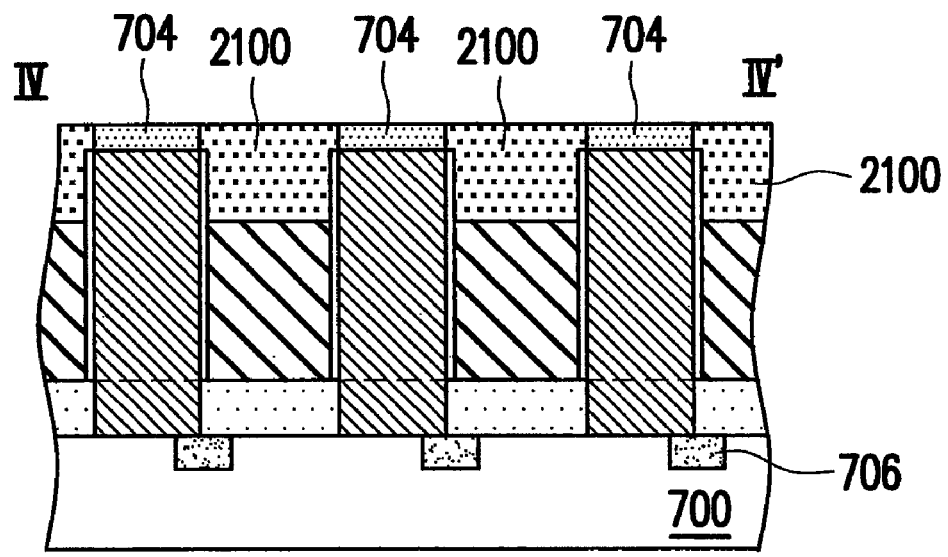

After that, referring to the top view of FIG. 21-1, the cross-sectional view of FIG. 21-2 taken along the sectional line II-II', the cross-sectional view of FIG. 21-3 taken along the sectional line III-III, and the cross-sectional view of FIG. 21-4 taken along the sectional line IV-IV', an oxidation layer 2100 is deposited on the substrate 700 and continuously planarized by performing the CMP process until the hard masks 704 are exposed.

Figures 1, 22:
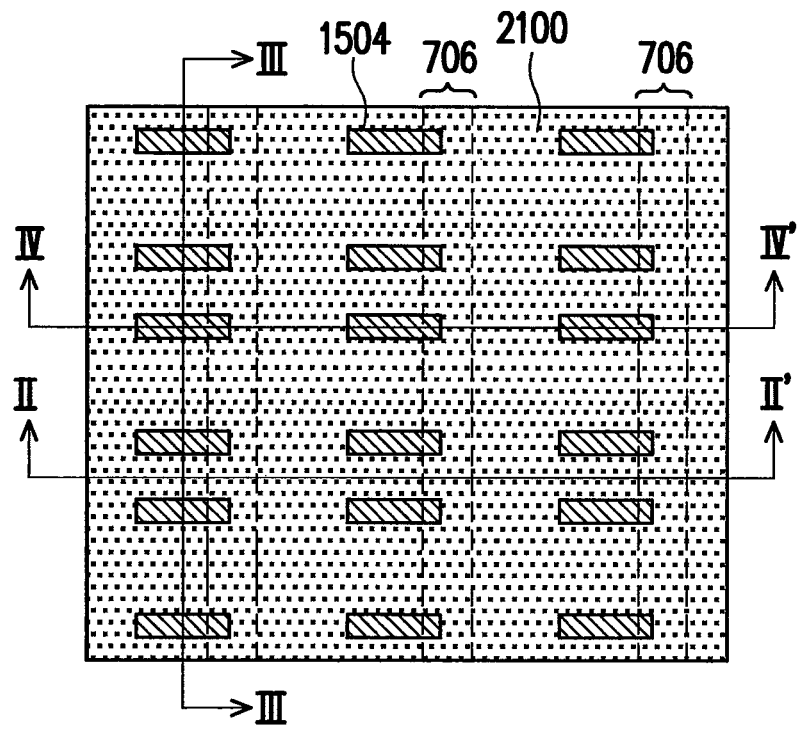
Figures 2, 22:
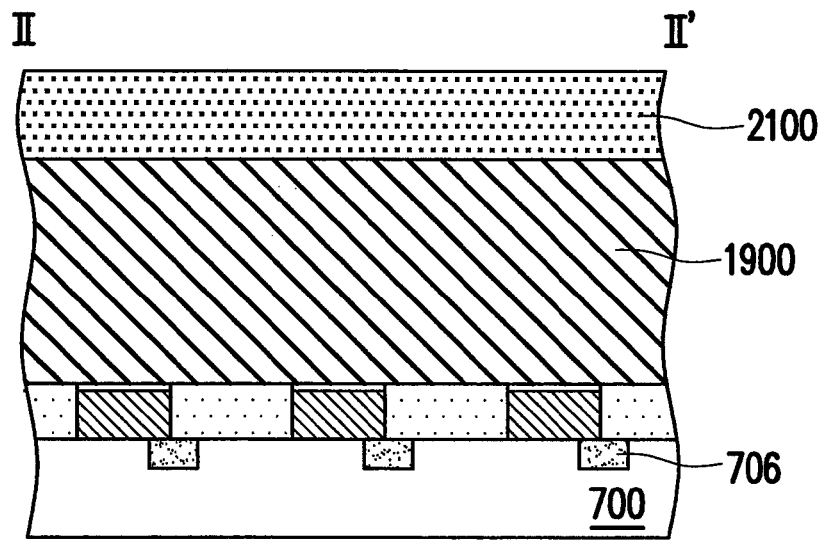
Figures 3, 22:
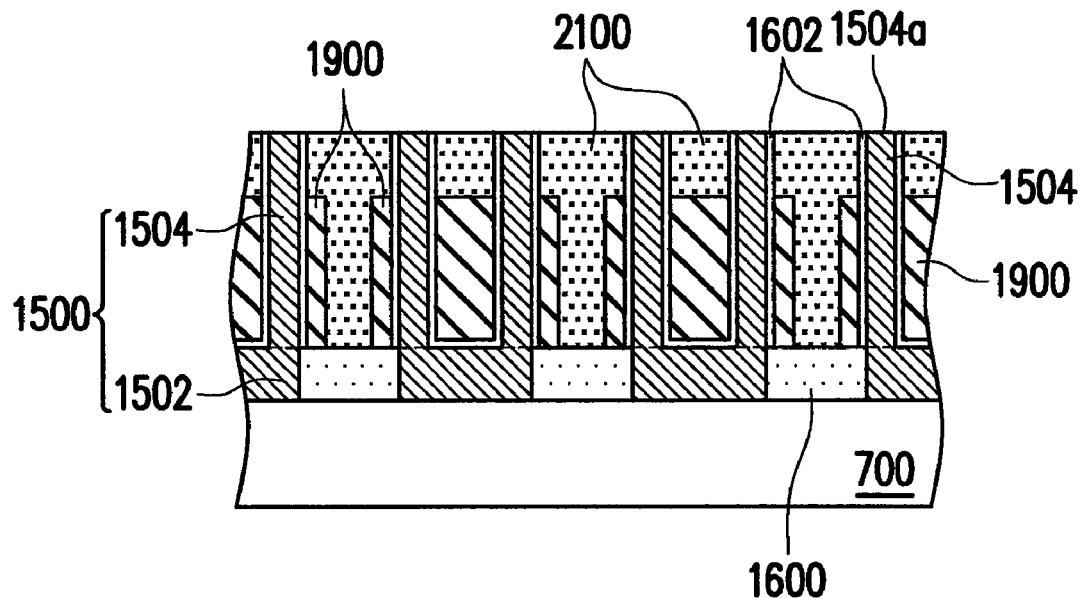
Figures 4, 22:
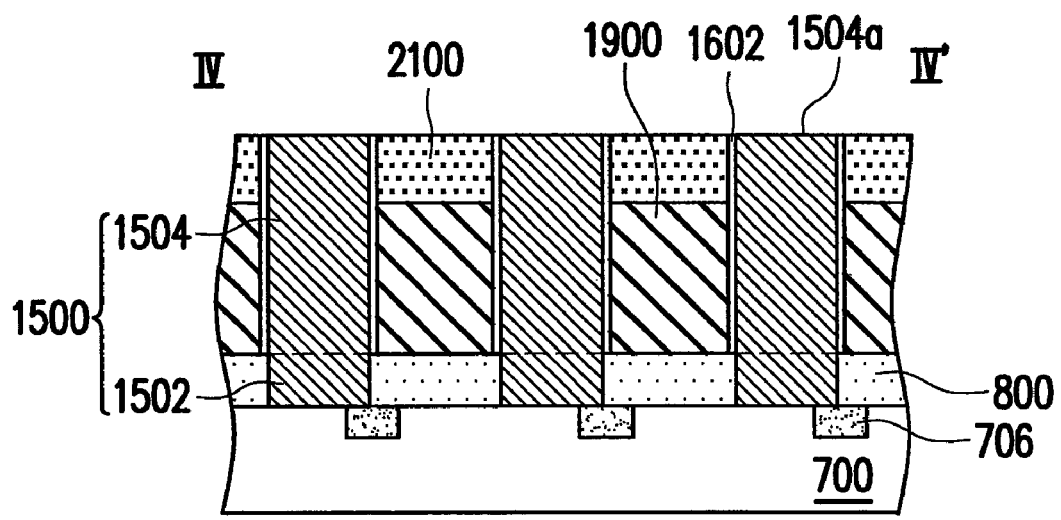

Thereafter, referring to the top view of FIG. 22-1, the cross-sectional view of FIG. 22-2 taken along the sectional line II-II', the cross-sectional view of FIG. 22-3 taken along the sectional line III-III, and the cross-sectional view of FIG. 22-4 taken along the sectional line IV-IV', the hard masks 704 as shown in FIG. 21-3 are completely removed, and the thickness of the oxidation layer 2100 is simultaneously reduced, such that the tops 1504a of the vertical plates 1504 of the semiconductor structures 1500 are exposed.

Figures 1, 23:
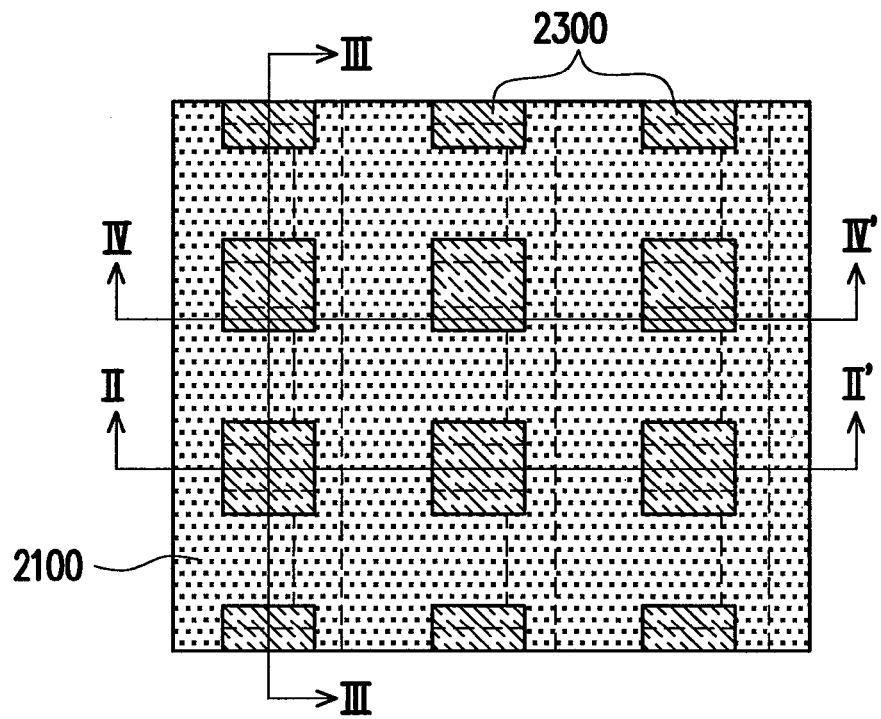
Figures 2, 23:
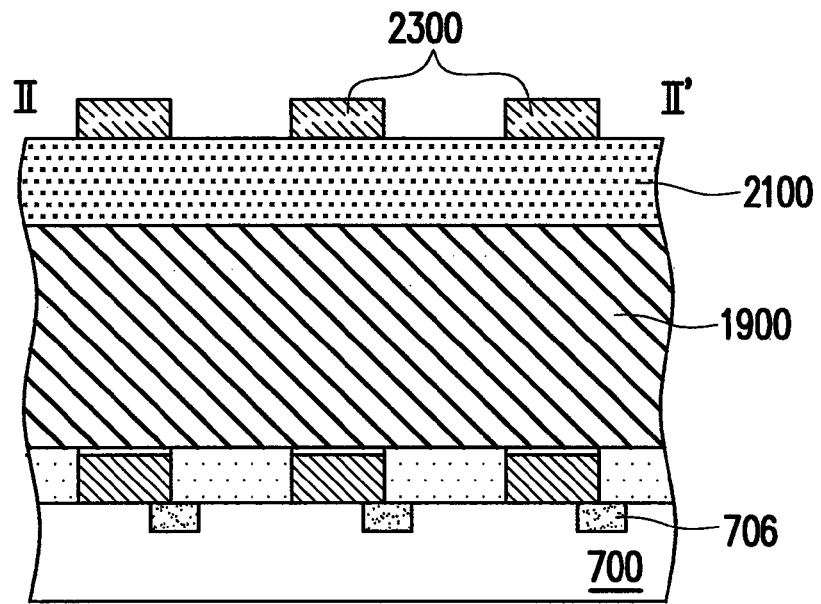
Figures 3, 23:
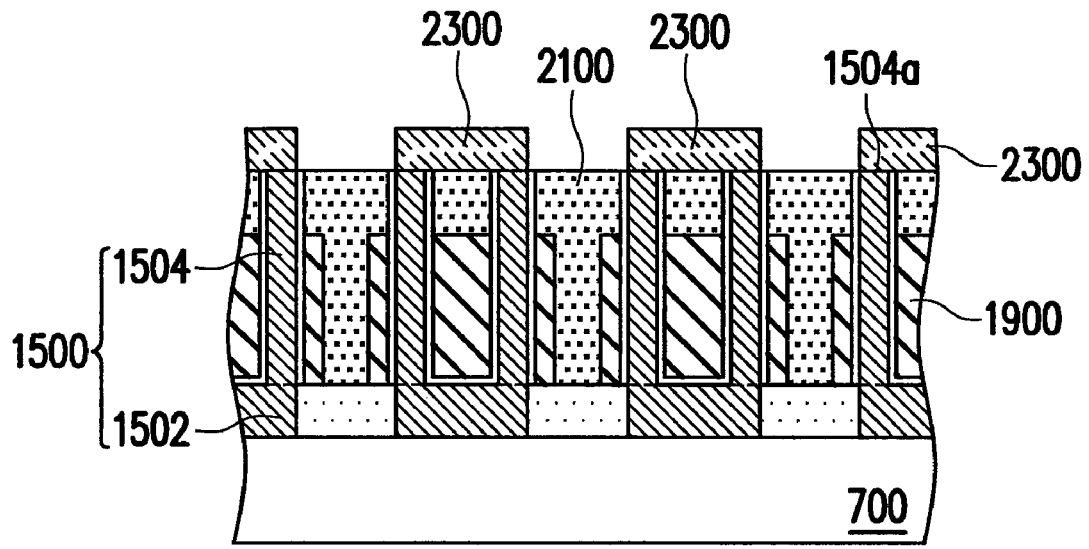
Figures 4, 23:
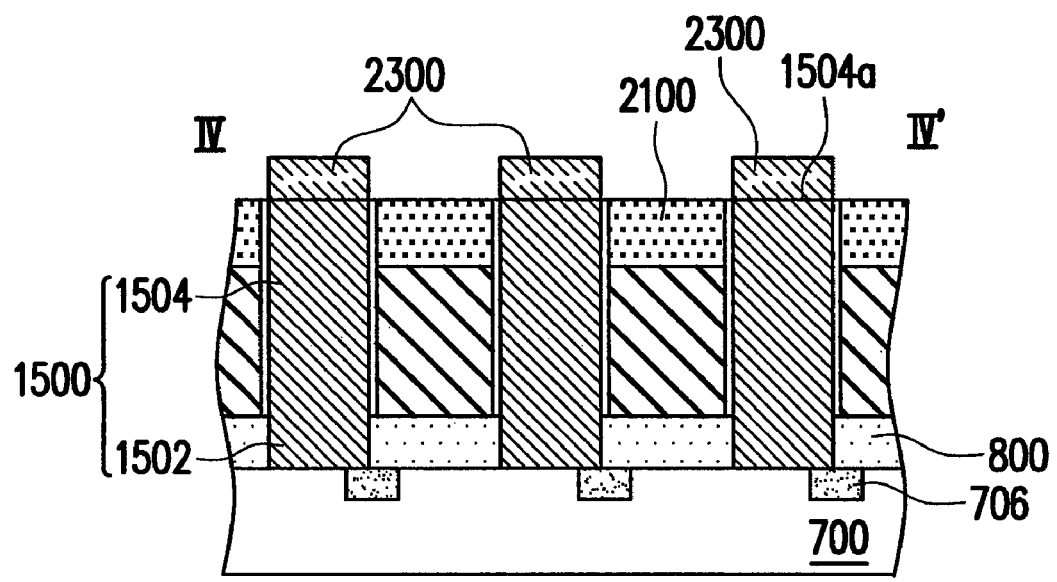

Finally, referring to the top view of FIG. 23-1, the cross-sectional view of FIG. 23-2 taken along the sectional line II-II', the cross-sectional view of FIG. 23-3 taken along the sectional line III-III, and the cross-sectional view of FIG. 23-4 taken along the sectional line IV-IV', conductive layers 2300 electrically connected to the tops 1504a of the vertical plates 1504 are respectively formed on the semiconductor structures 1500, such that the fabrication of the array with the vertical transistors is completed. Here, the conductive layers 2300 are, for example, made of epitaxially-grown polysilicon.

Figures 1, 24:
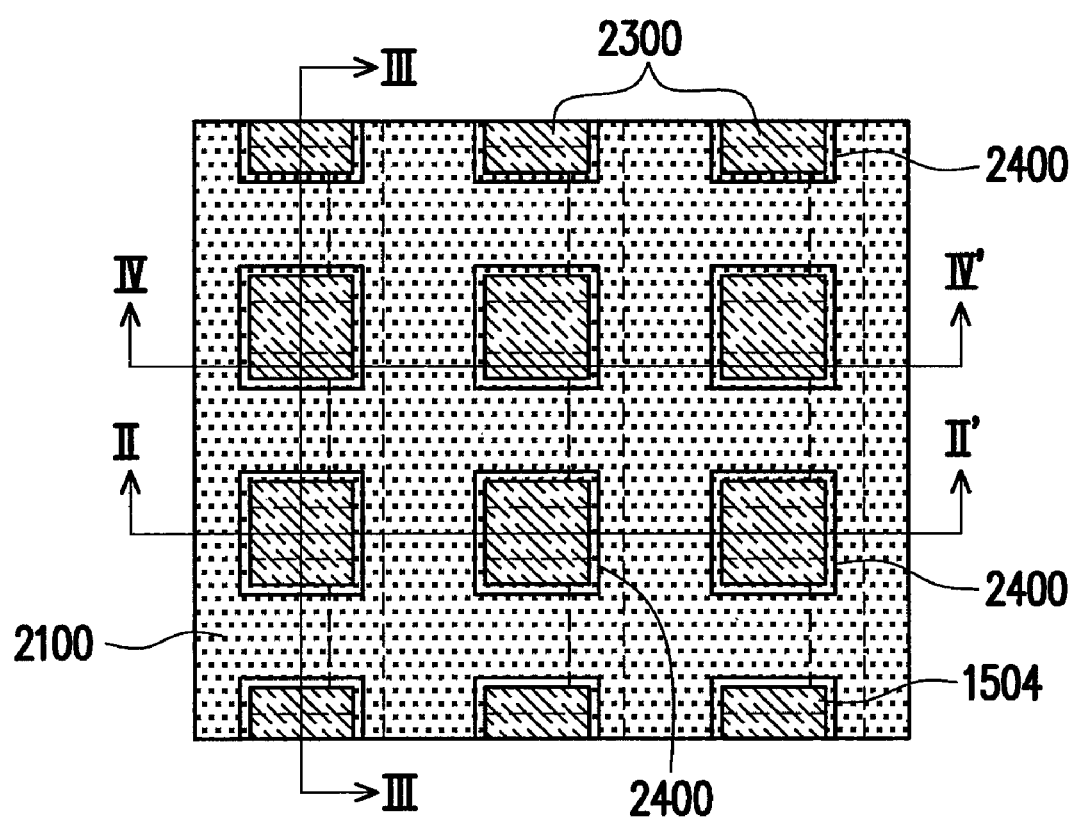
Figures 2, 24:
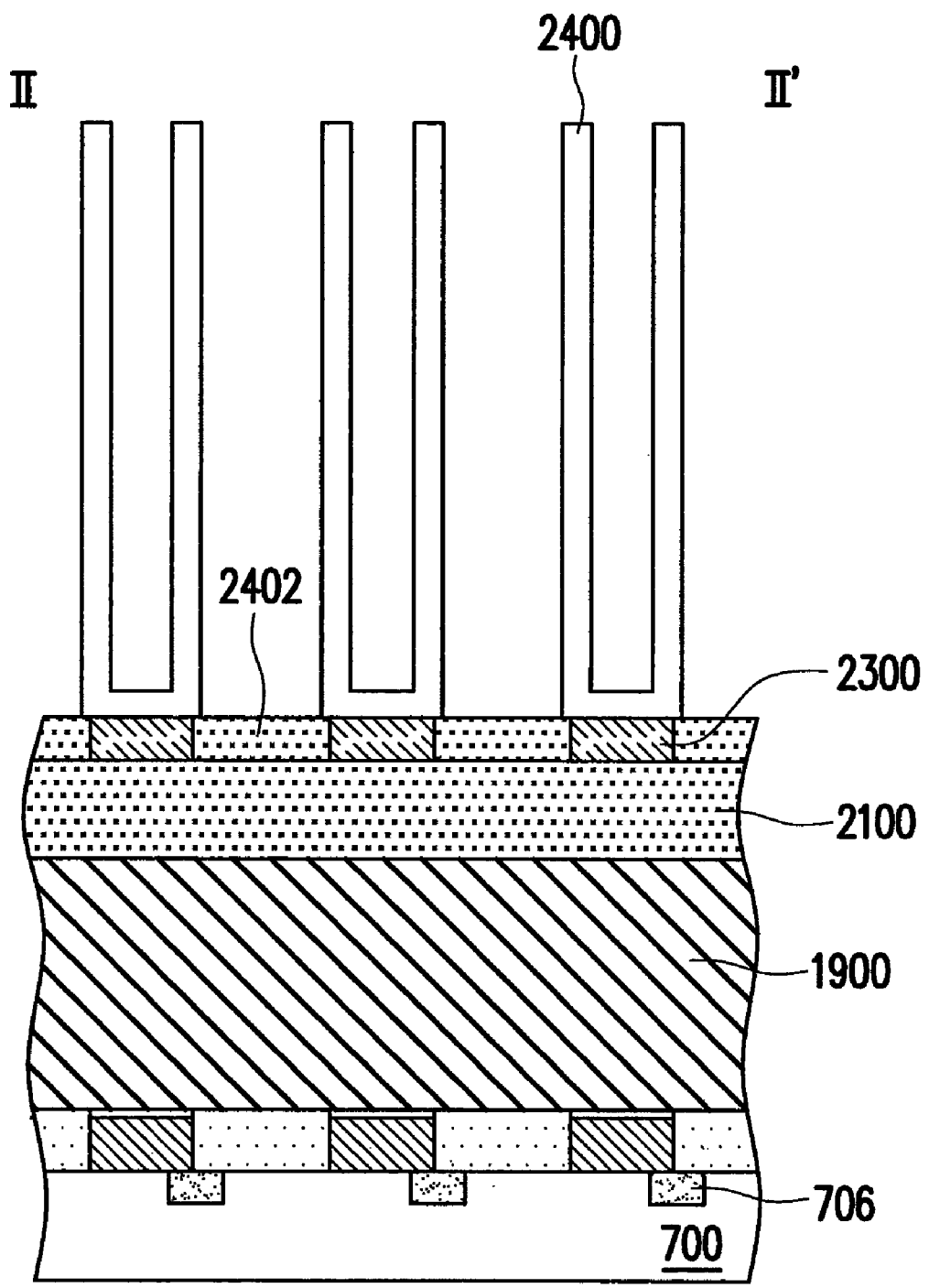
Figures 3, 24:
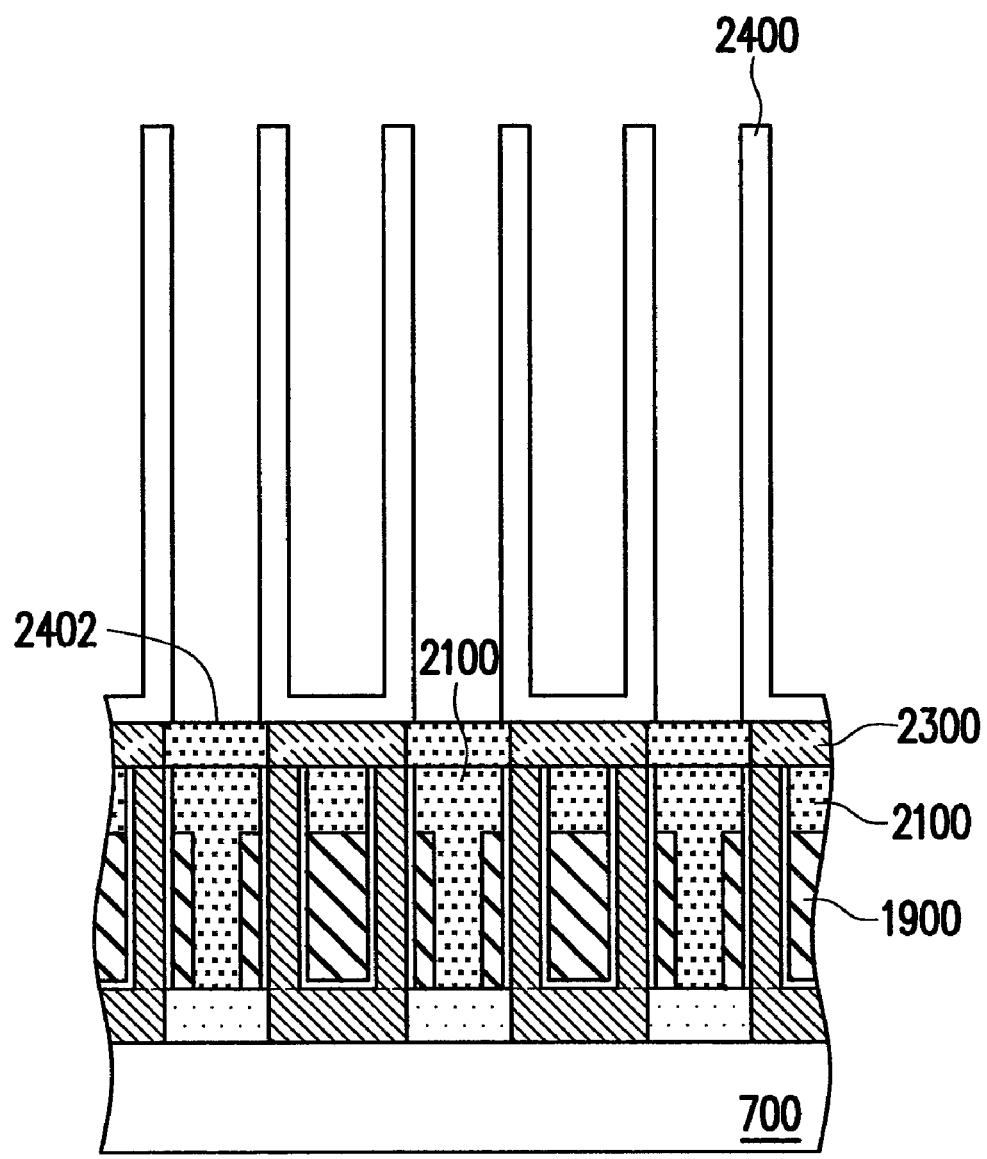
Figures 4, 24:
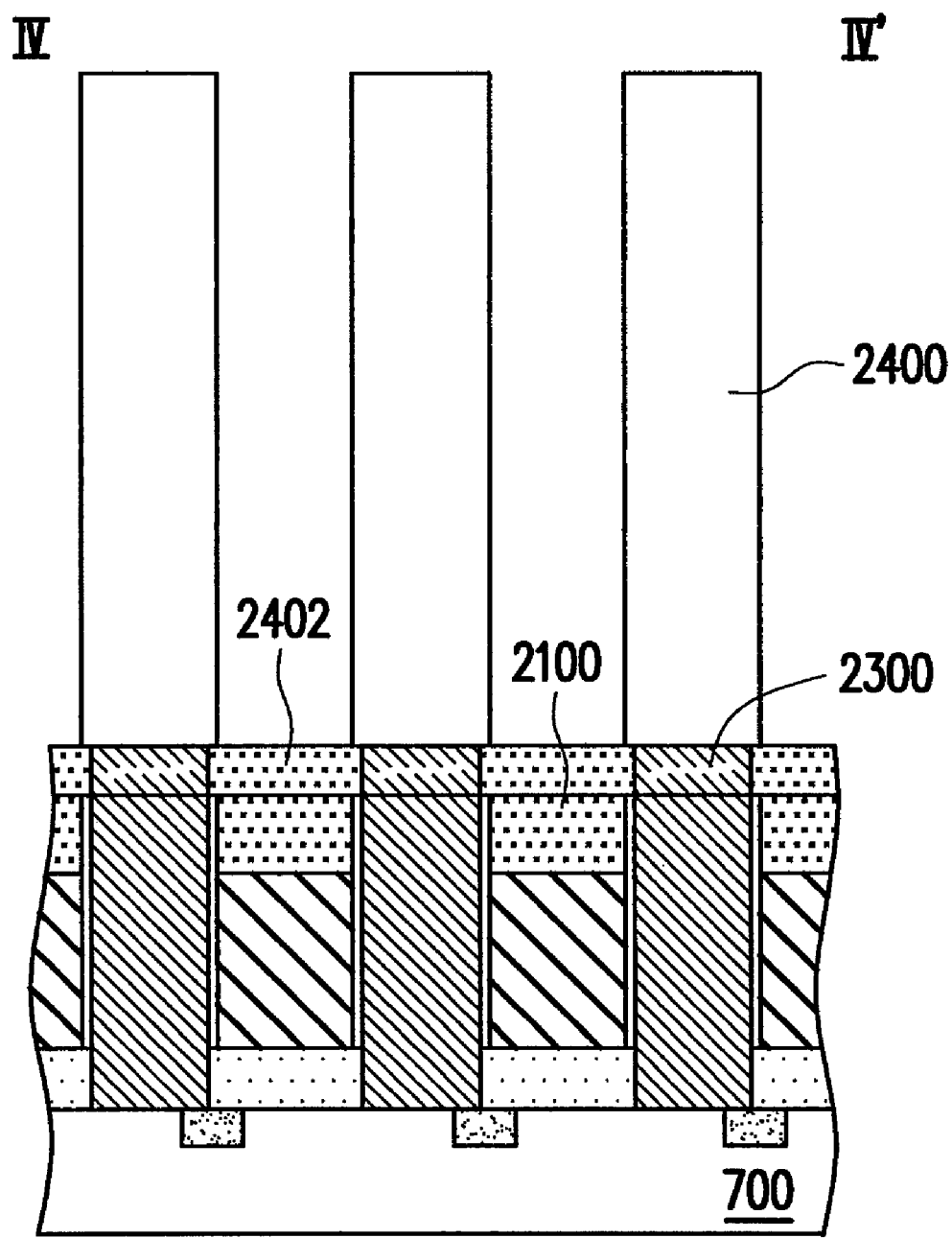

In addition, referring to the top view of FIG. 24-1, the cross-sectional view of FIG. 24-2 taken along the sectional line II-II', the cross-sectional view of FIG. 24-3 taken along the sectional line III-III, and the cross-sectional view of FIG. 24-4 taken along the sectional line IV-IV', after the formation of the conductive layers 2300 is completed, lower electrodes 2400 of capacitors can be further formed on the conductive layers 2300. Moreover, an insulation layer 2402 can be formed between each of the conductive layers 2300, and the formation of the insulation layer 2402 is followed by the fabrication of the capacitors. As such, said manufacturing process can be applied to the fabrication of DRAM devices.

Figures 1, 25:
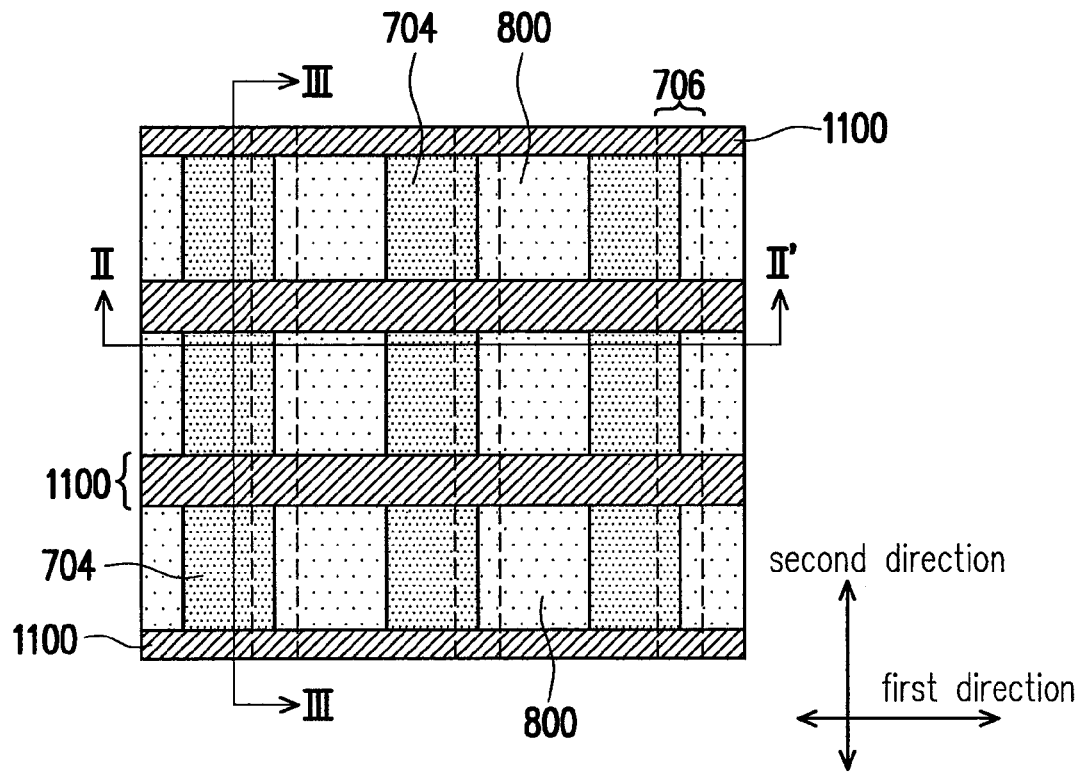
Figures 2, 25:
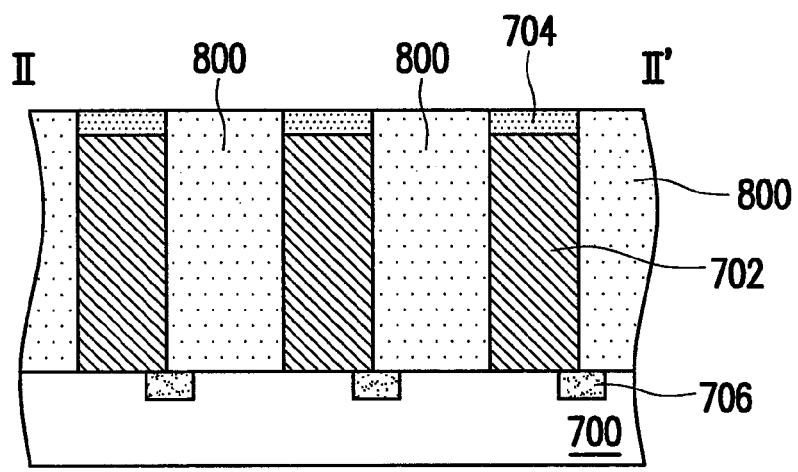
Figures 3, 25:
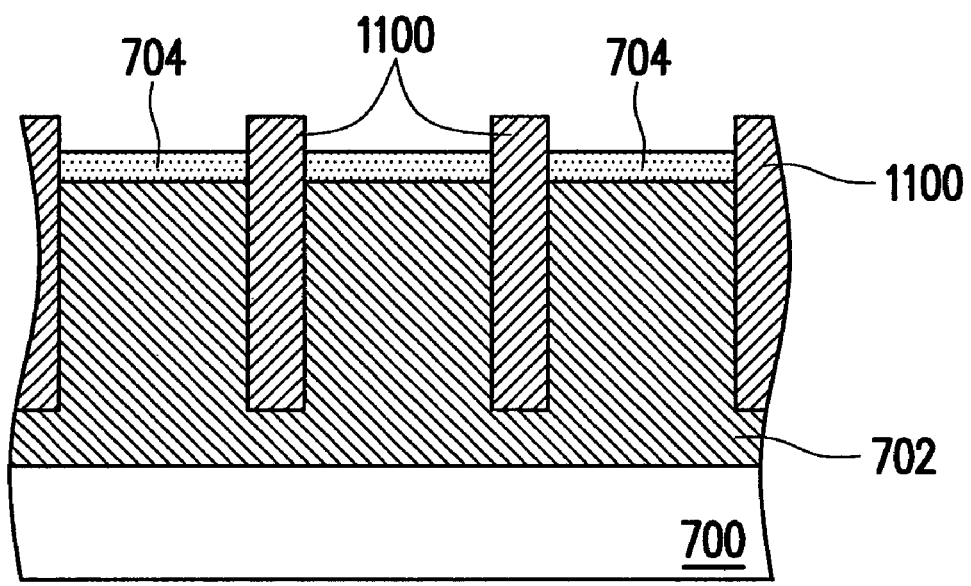

FIGS. 25-1 through 33-4 are schematic views illustrating a manufacturing process of the array 500 with the vertical transistors depicted in FIG. 5. Steps performed up to the one depicted in FIG. 25-1 are indicated in FIGS. 7-1 through 11-3.

Next, referring to the top view of FIG. 25-1, the cross-sectional view of FIG. 25-2 taken along the sectional line II-II', and the cross-sectional view of FIG. 25-3 taken along the sectional line III-III, the sacrificial layer 1100 is slightly etched to expose the spacers 900 (as shown in FIG. 11-3). After that, the hard masks 802 and the spacers 900 are completely removed, while the sacrificial layer 1100 extended in the first direction remains.

Figures 1, 26:
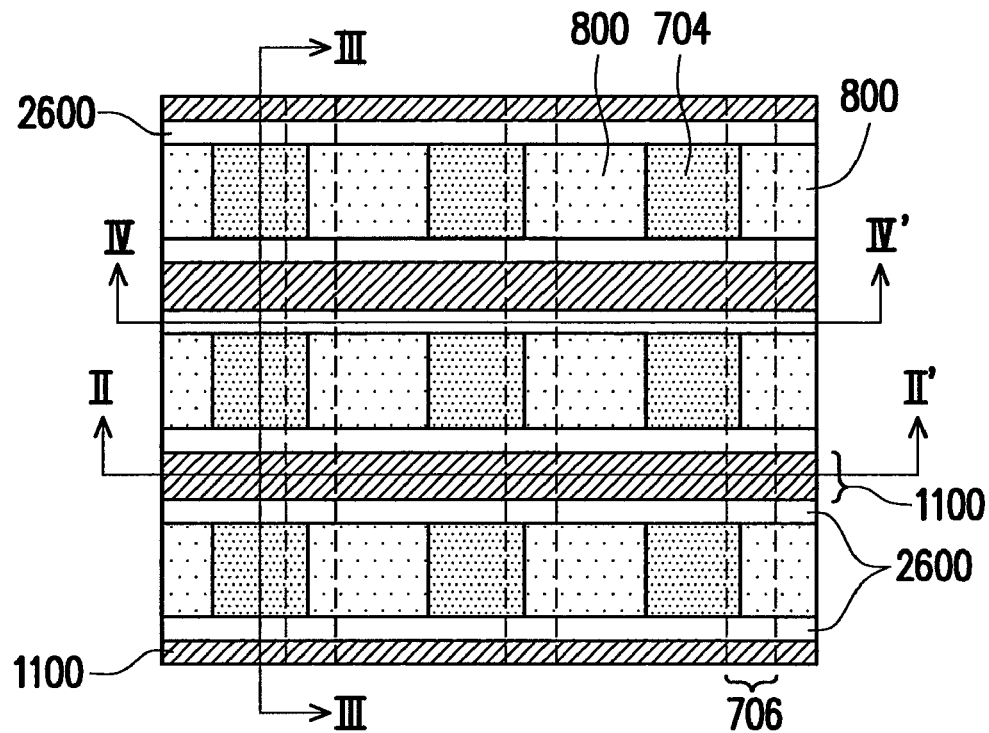
Figures 2, 26:
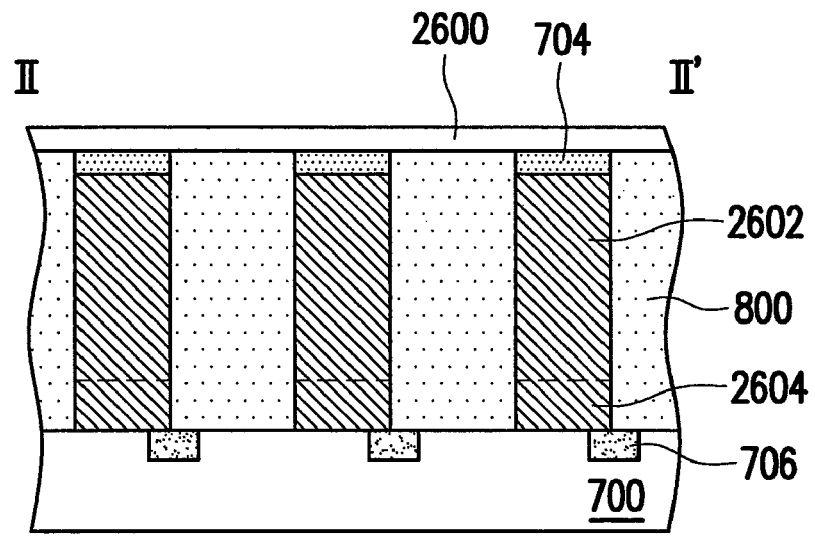
Figures 3, 26:
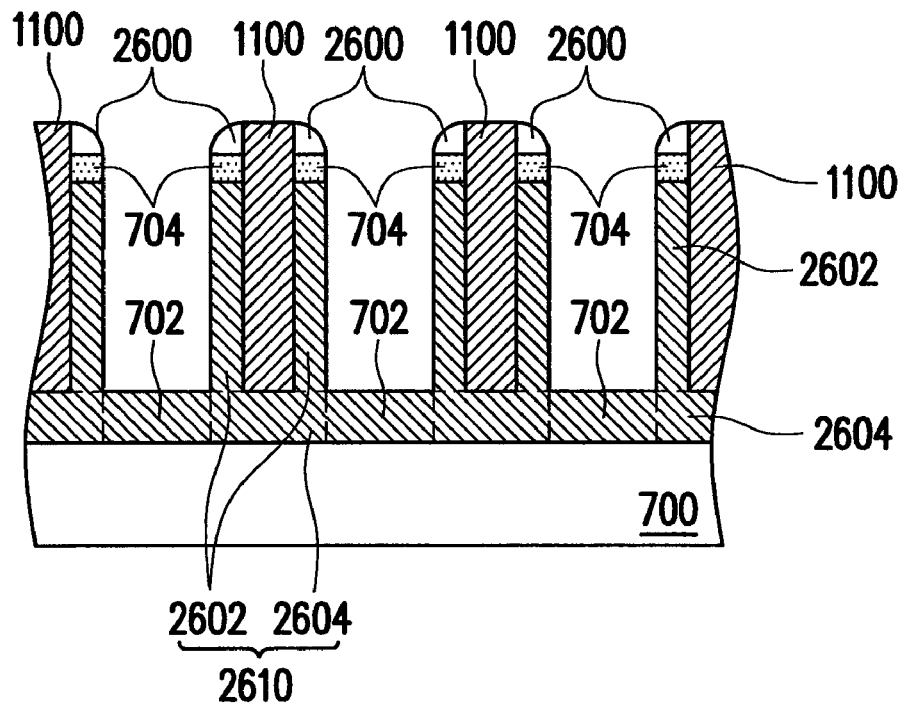
Figures 4, 26:
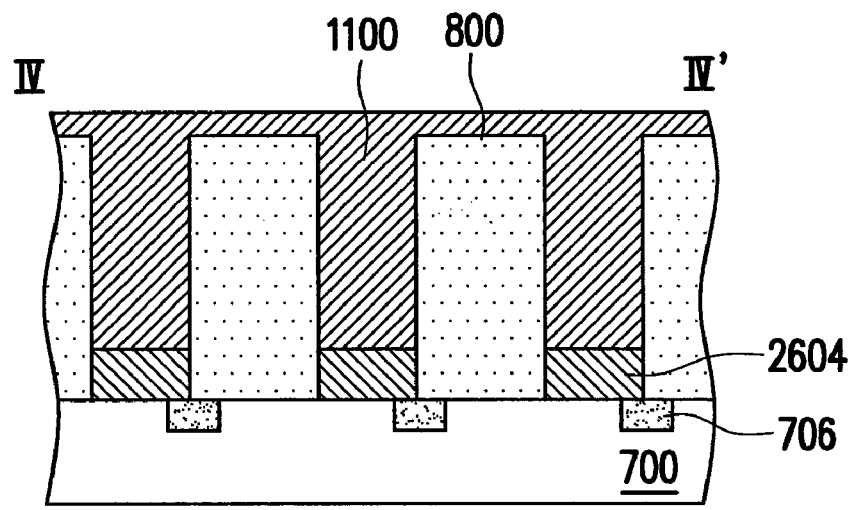

Thereafter, referring to the top view of FIG. 26-1, the cross-sectional view of FIG. 26-2 taken along the sectional line II-II', the cross-sectional view of FIG. 26-3 taken along the sectional line III-III, and the cross-sectional view of FIG. 26-4 taken along the sectional line IV-IV', spacers 2600 are formed on sidewalls of the sacrificial layer 1100 which protrudes from the hark masks 704. Next, the hard masks 704 which are not covered by the spacers 2600 are removed with use of the spacers 2600 as the etching masks, such that the remaining hard masks 704 are merely disposed at the respective sides of the sacrificial layer 1100. The semiconductor layers 702 (as shown in FIG. 25-3) that are not covered by the hard masks 704 are then continuously etched with use of the spacers 2600 and the remaining hard masks 704 as the etching masks, so as to form semiconductor structures 2610. Each of the semiconductor structures 2610 includes two vertical plates 2602 and a bottom plate 2604. Here, the semiconductor layers 702 that are not covered by the hard masks 704 are not completely removed, and therefore the remaining semiconductor layers 702 are still disposed between the semiconductor structures 2610.

Figures 1, 27:
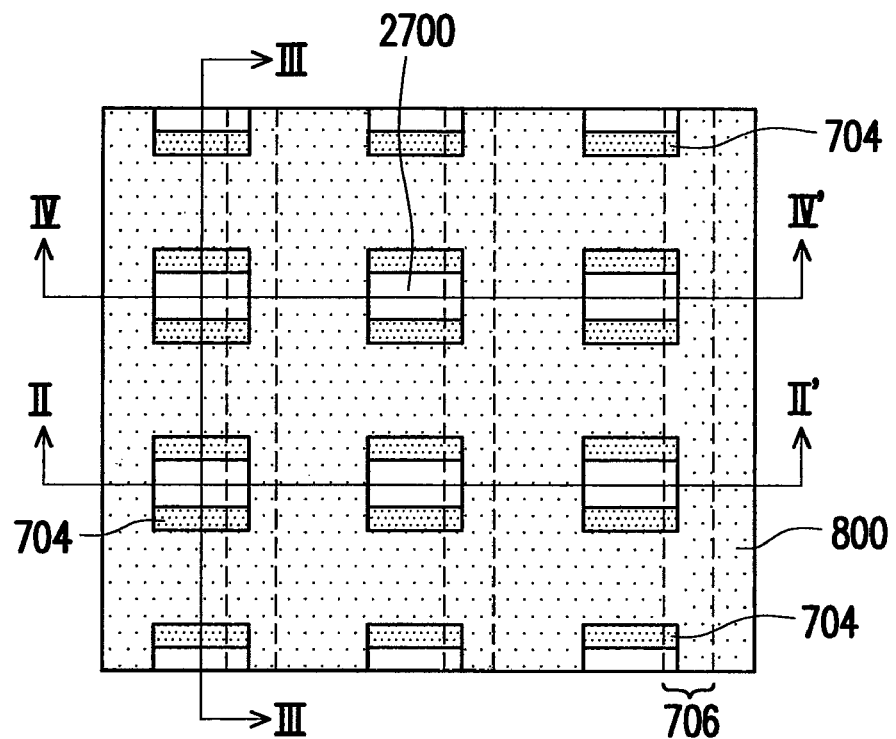
Figures 2, 27:
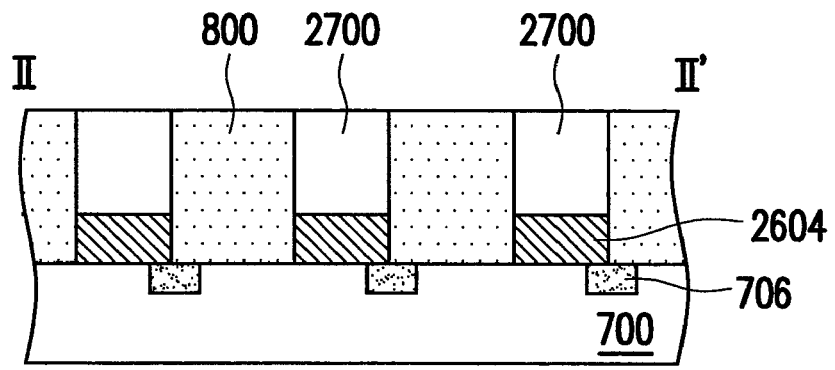
Figures 3, 27:
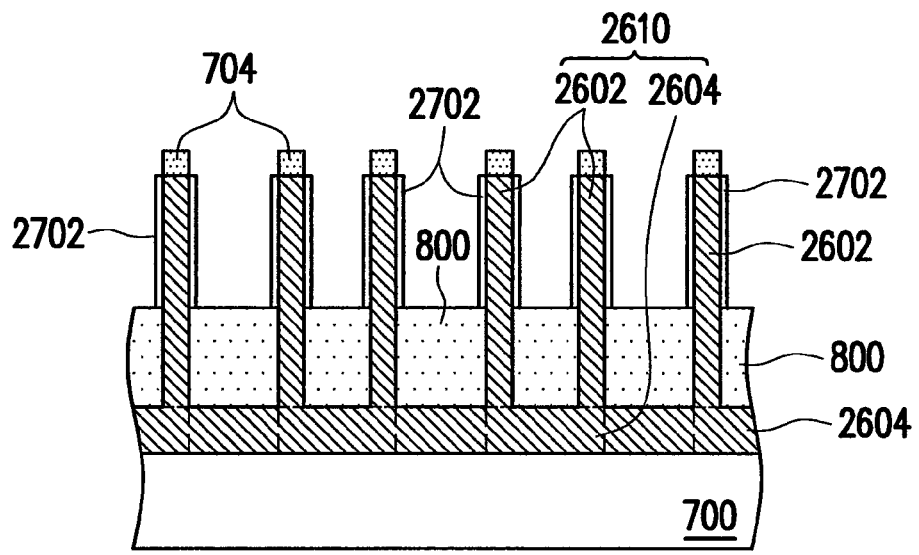
Figures 4, 27:
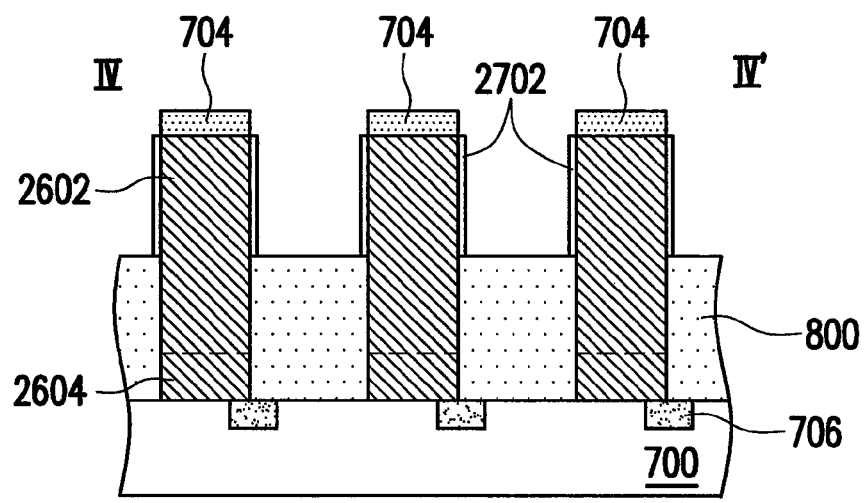

Next, referring to the top view of FIG. 27-1, the cross-sectional view of FIG. 27-2 taken along the sectional line II-II', the cross-sectional view of FIG. 27-3 taken along the sectional line III-III, and the cross-sectional view of FIG. 27-4 taken along the sectional line IV-IV', the spacers 2600 and the sacrificial layer 1100 (as shown in FIG. 26-3) are completely removed, and an oxidation layer 2700 is then deposited on the substrate 700. After that, parts of the oxidation layers 800 and 2700 are removed, so as to recess the oxidation layers 800 and 2700 and to expose the vertical plates 2602 of the semiconductor structures 2610. Gate dielectric layers 2702 are then formed on exposed portions of the semiconductor structures 2610.

Figures 1, 28:
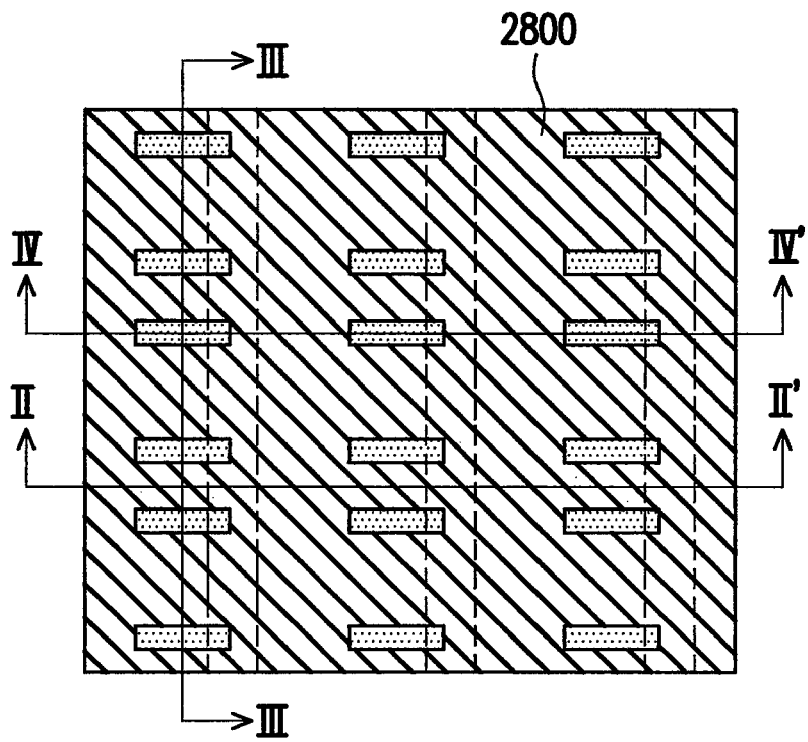
Figures 2, 28:
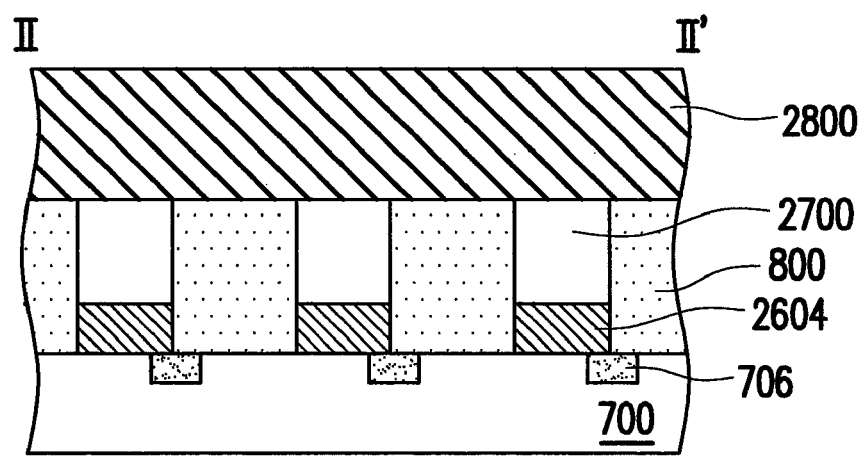
Figures 3, 28:
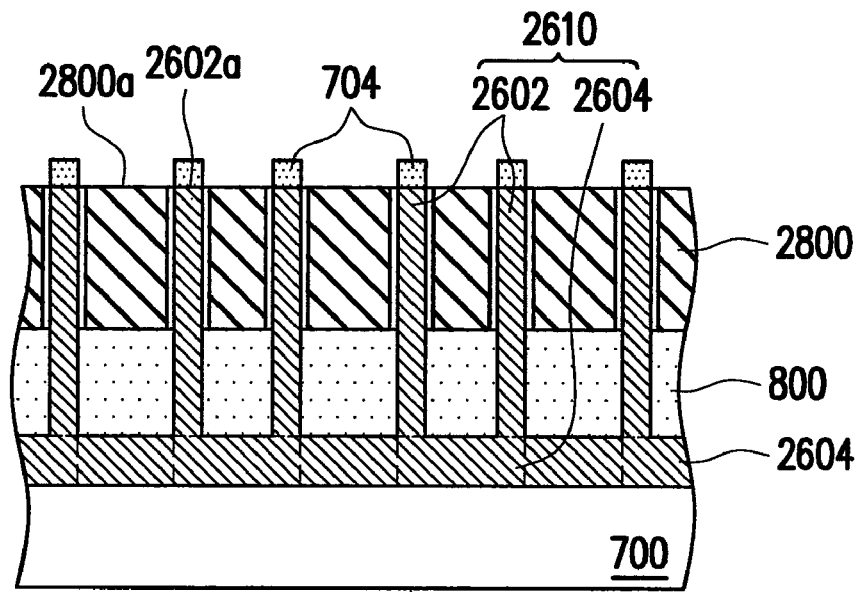
Figures 4, 28:
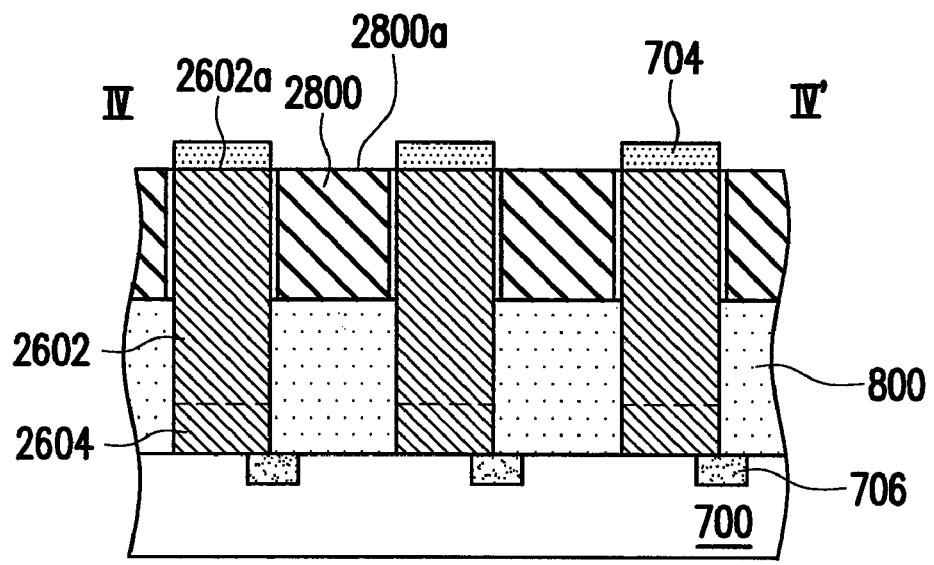

Next, referring to the top view of FIG. 28-1, the cross-sectional view of FIG. 28-2 taken along the sectional line II-II', the cross-sectional view of FIG. 28-3 taken along the sectional line III-III, and the cross-sectional view of FIG. 28-4 taken along a sectional line IV-IV', a gate material 2800 is deposited on the substrate 700, and an upper surface 2800a of the gate material 2800 is aligned to tops 2602a of the vertical plates 2602 of each of the semiconductor structures 2610.

Figures 1, 29:
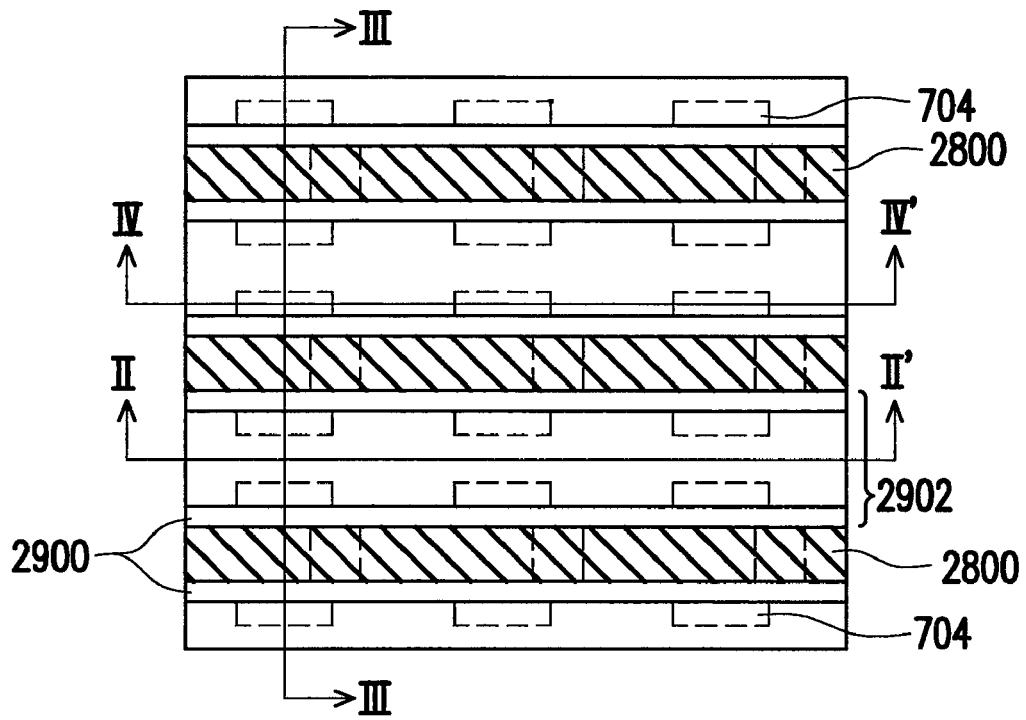
Figures 2, 29:
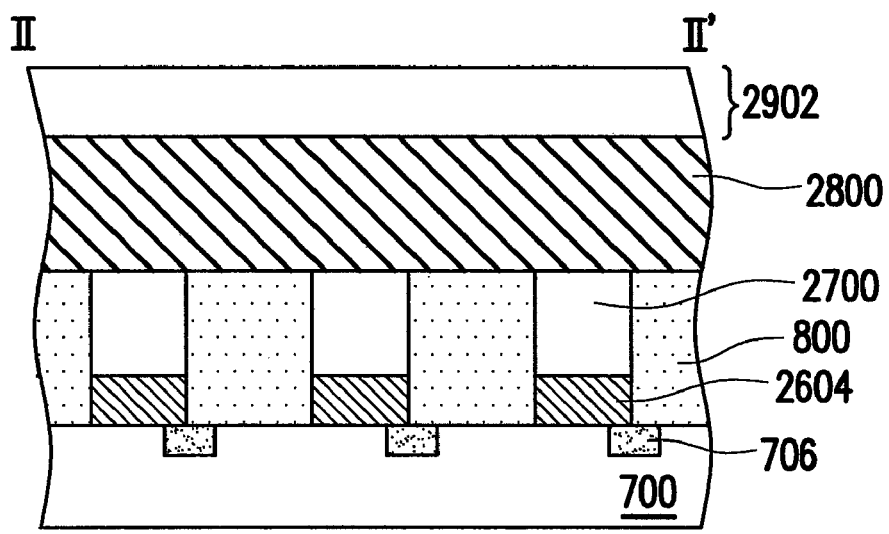
Figures 3, 29:
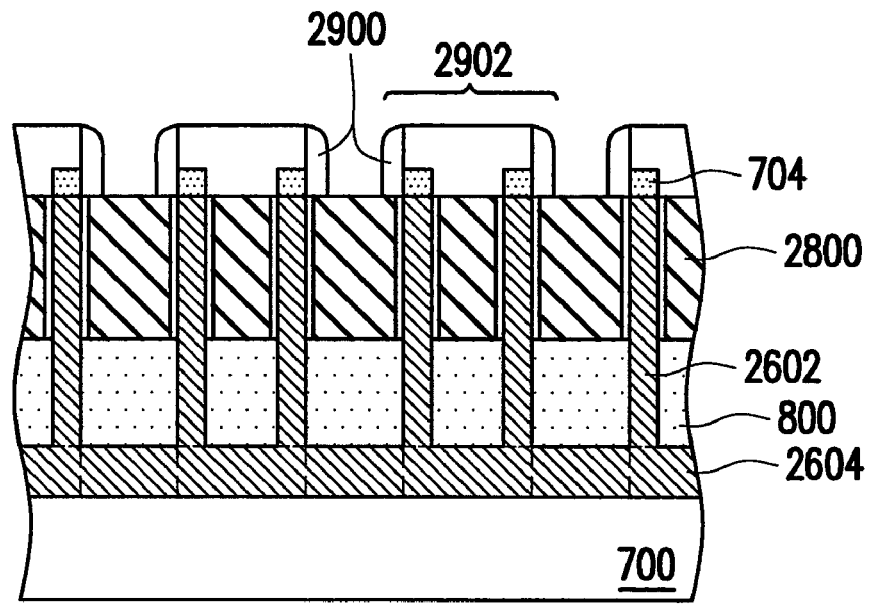
Figures 4, 29:
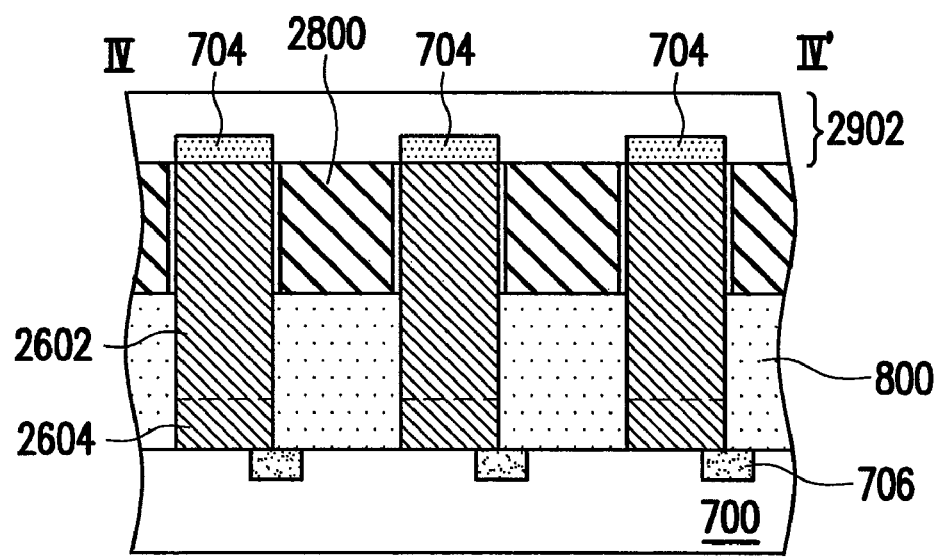

Thereafter, referring to the top view of FIG. 29-1, the cross-sectional view of FIG. 29-2 taken along the sectional line II-II', the cross-sectional view of FIG. 29-3 taken along the sectional line III-III, and the cross-sectional view of FIG. 29-4 taken along the sectional line IV-IV', hard masks 2902 having spacers 2900 are formed at regions where gate lines are intended to be formed, and a portion of the gate material 2800 is exposed.

Figures 1, 30:
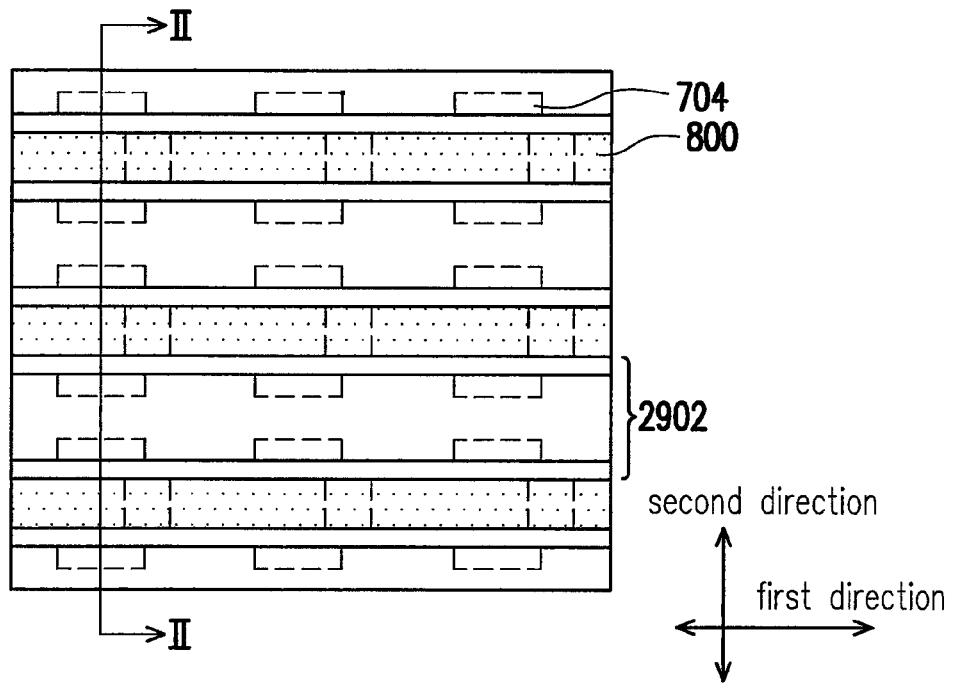
Figures 2, 30:
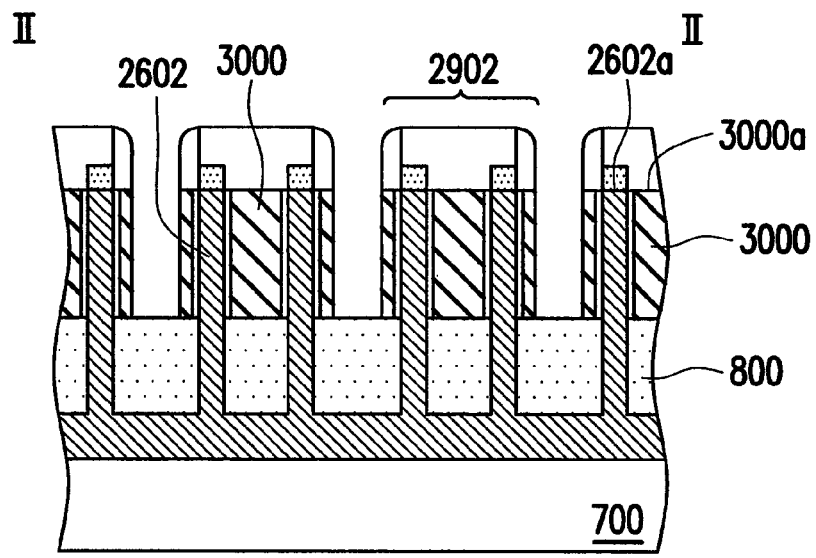

Afterwards, referring to the top view of FIG. 30-1 and the cross-sectional view of FIG. 30-2 taken along the sectional line II-II, the exposed gate material 2800 is continuously etched with use of the hard masks 2902 as the etching masks until the oxidation layer 800 is exposed, so as to form gate lines 3000 extended in the first direction.

Figures 1, 31:
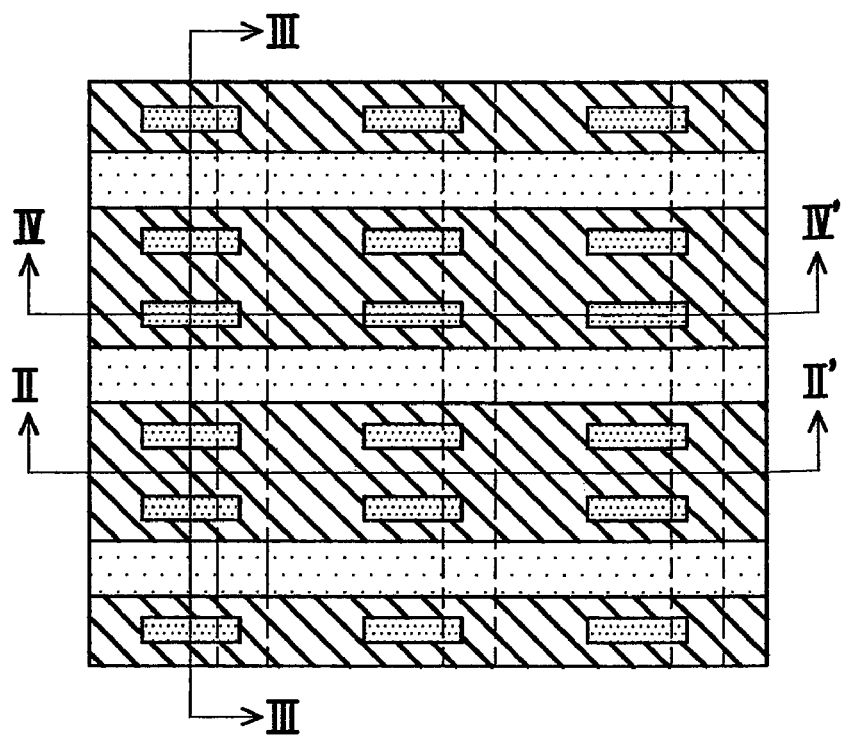
Figures 2, 31:
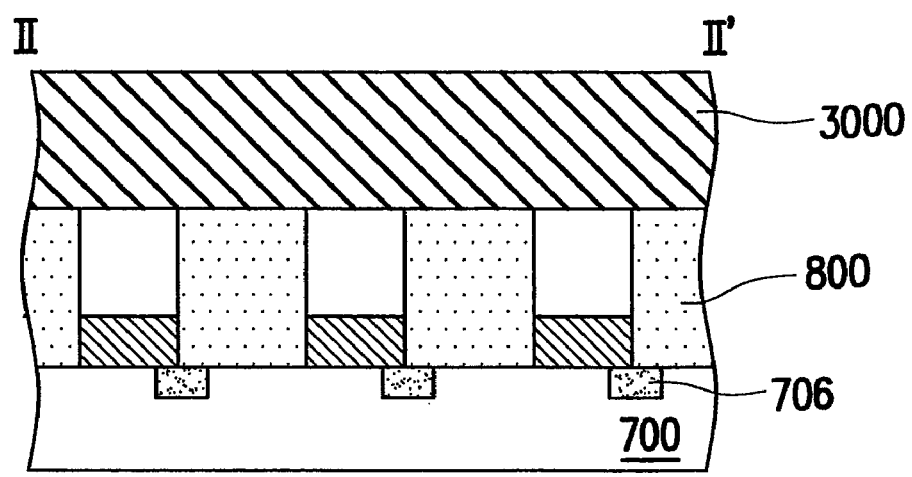
Figures 3, 31:
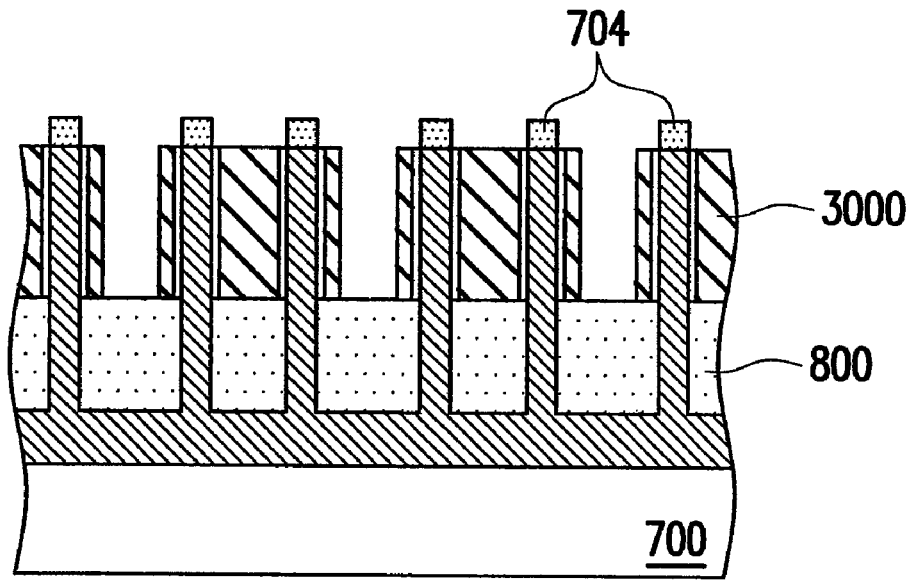
Figures 4, 31:
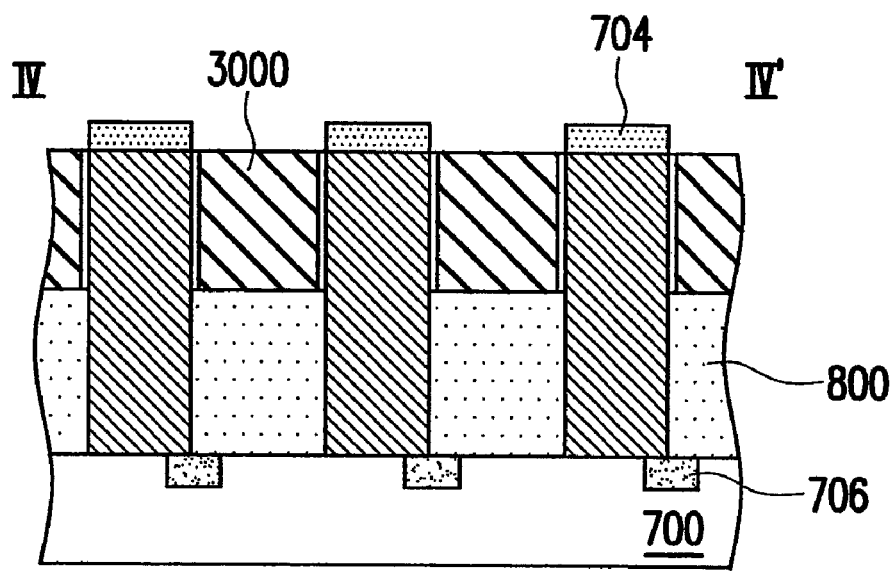

Referring to the top view of FIG. 31-1, the cross-sectional view of FIG. 31-2 taken along the sectional line II-II', the cross-sectional view of FIG. 31-3 taken along the sectional line III-III, and the cross-sectional view of FIG. 31-4 taken along the sectional line IV-IV', the hard masks 2902 are then removed completely. Here, upper surfaces 3000a of the gate lines 3000 and the tops 2602a of the vertical plates 2602 of each of the semiconductor structures 2610 are co-planar.

Figures 1, 32:
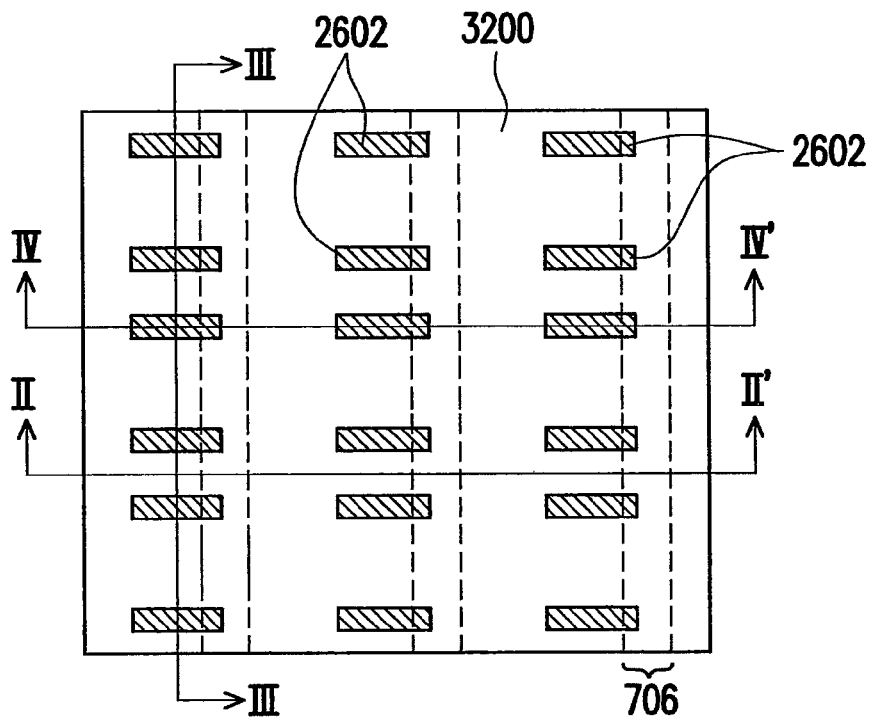
Figures 2, 32:
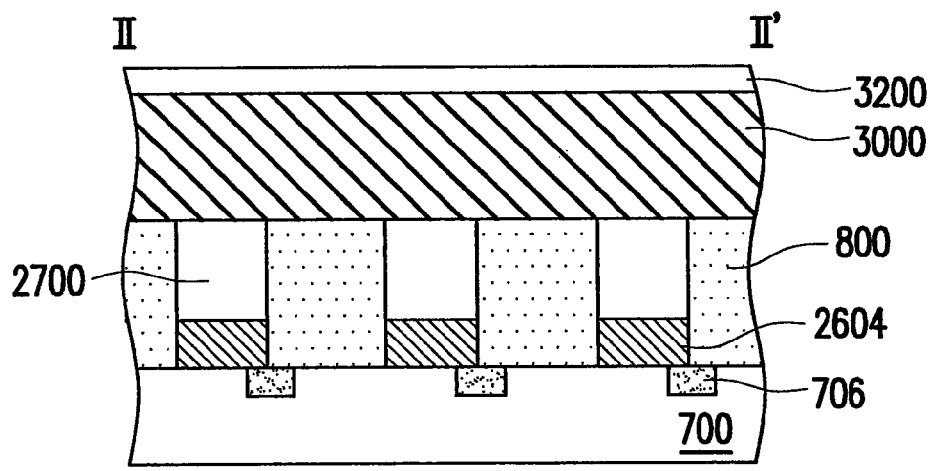
Figures 3, 32:
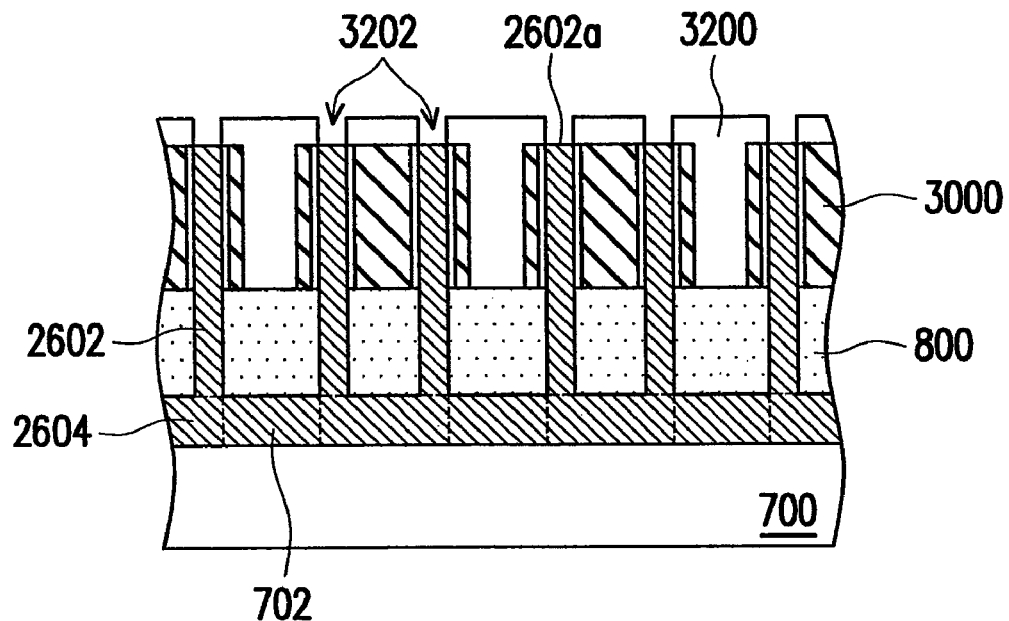
Figures 4, 32:
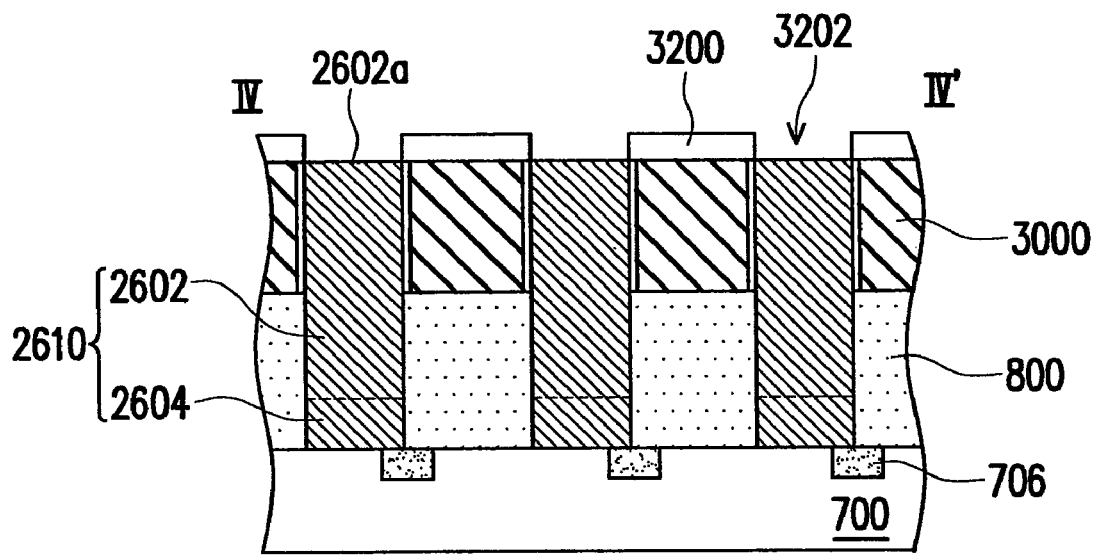

After that, referring to the top view of FIG. 32-1, the cross-sectional view of FIG. 32-2 taken along the sectional line II-II', the cross-sectional view of FIG. 32-3 taken along the sectional line III-III, and the cross-sectional view of FIG. 32-4 taken along the sectional line IV-IV', an oxidation layer 3200 is deposited on the substrate 700 and continuously planarized by performing the CMP process until the hard masks 704 are exposed. The hard masks 704 as shown in FIG. 31-3 are then removed, such that the tops 2602a of the vertical plates 2602 of each of the semiconductor structures 2610 are exposed by openings 3202 of the oxidation layer 3200.

Figures 1, 33:
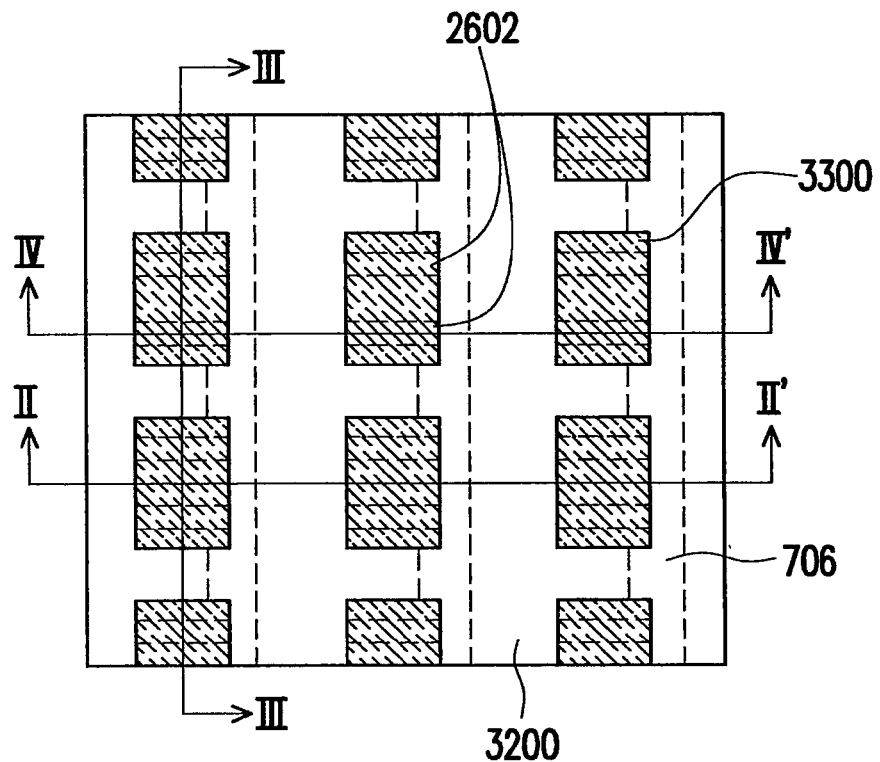
Figures 2, 33:
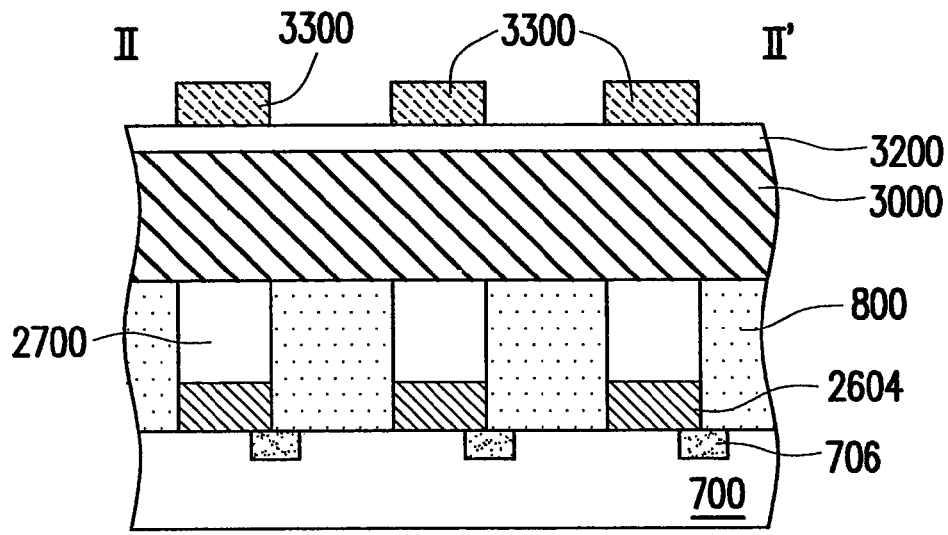
Figures 3, 33:
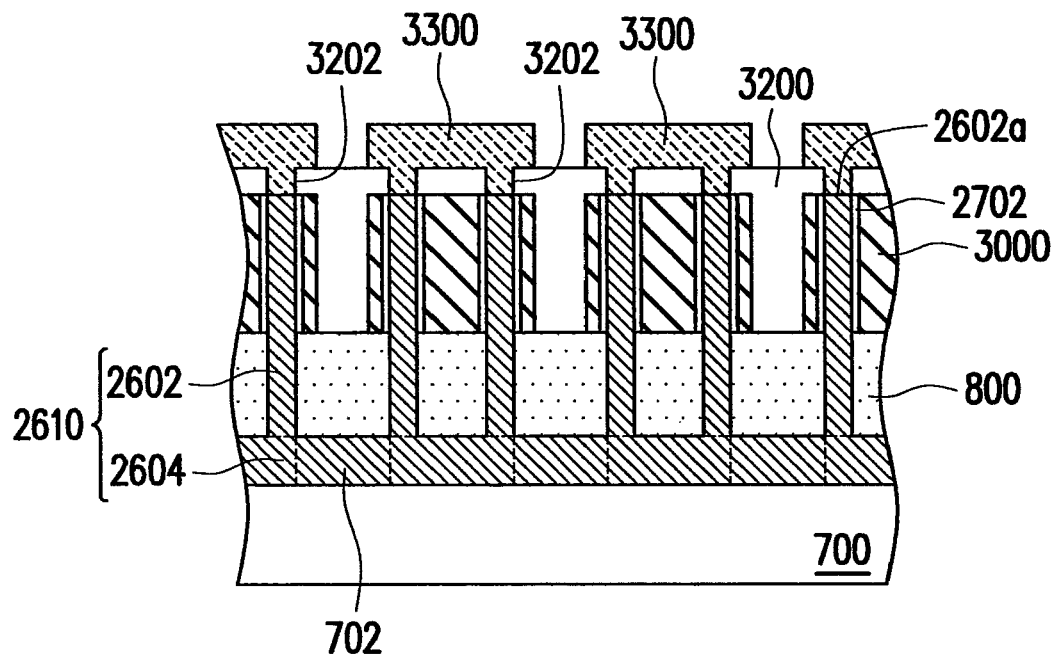
Figures 4, 33:
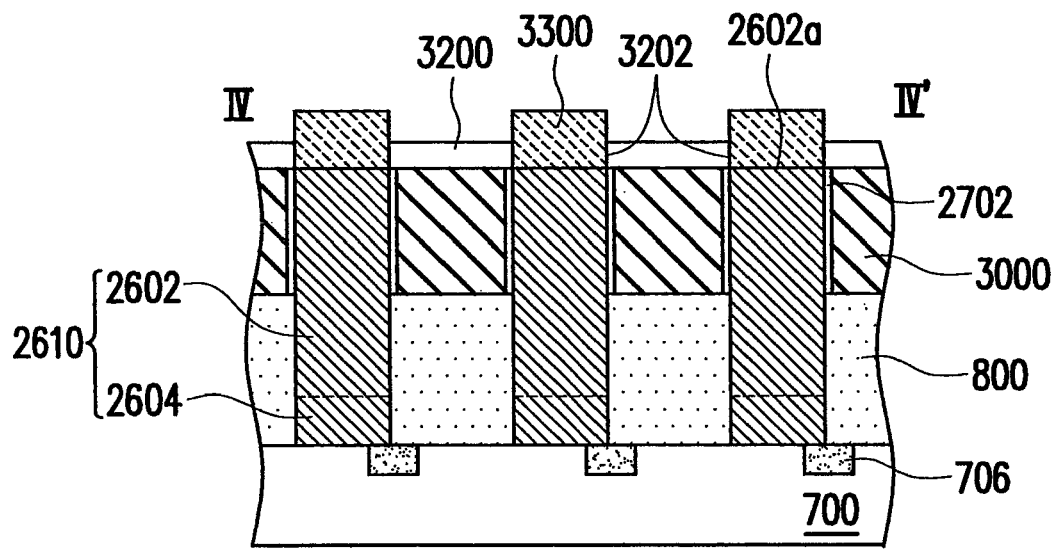

Finally, referring to the top view of FIG. 33-1, the cross-sectional view of FIG. 33-2 taken along the sectional line II-II', the cross-sectional view of FIG. 33-3 taken along the sectional line III-III, and the cross-sectional view of FIG. 33-4 taken along the sectional line IV-IV', conductive layers 3300 are respectively formed on the semiconductor structures 2610, such that the conductive layers 3300 are electrically connected to the tops 2602a of the vertical plates 2602 through the openings 3202, respectively. Thereby, the fabrication of the array 500 with the vertical transistors is completed. Here, the conductive layers 3300 are, for example, made of epitaxially-grown polysilicon.

Additionally, after the formation of the conductive layers 3300, the capacitors can be further formed thereon. As such, said manufacturing process can be applied to the fabrication of the DRAM devices.

In light of the foregoing, the vertical transistor of the present invention has the semiconductor structure and the gate surrounding and penetrating the entire semiconductor structure. Therefore, the individual vertical transistor can be equipped with eight controlling surfaces in total. On the other hand, when the vertical transistors are arranged in array, the conductive straps disposed therein are conductive to the reduction of the area occupied by the chips, so as to increase the device density. Moreover, the manufacturing process of the array with the vertical transistors of the present invention can be integrated into the manufacturing process of the DRAMs, and therefore additional equipment and machinery are not required for achieving the present invention.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A vertical transistor, comprising:
   a substrate;
   a gate, disposed above the substrate;
   a semiconductor structure, disposed on the substrate and
      having two vertical plates and a bottom plate, wherein an upper surface of the bottom plate is partially connected to bottoms of the two vertical plates, a bottom surface of the bottom plate is connected to the substrate, and the two vertical plates are disposed in the gate;

a gate dielectric layer, sandwiched in between the gate and the semiconductor structure; and a conductive layer, disposed on the semiconductor structure and electrically connected to tops of the two vertical plates.

2. The vertical transistor as claimed in claim 1, further comprising a buried conductive region disposed in the substrate and electrically connected to the bottom plate of the semiconductor structure.

3. The vertical transistor as claimed in claim 1, wherein a material of the gate comprises titanium nitride.

4. The vertical transistor as claimed in claim 1, wherein a material of the gate dielectric layer comprises oxide-nitride-oxide.

5. The vertical transistor as claimed in claim 2, wherein a bottom surface of the gate is disposed above the bottom plate of the semiconductor structure.

6. The vertical transistor as claimed in claim 5, wherein an upper surface of the gate and the tops of the two vertical plates of the semiconductor structure are co-planar.

7. The vertical transistor as claimed in claim 5, wherein an upper surface of the gate is lower than the tops of the two vertical plates of the semiconductor structure.

8. An array with vertical transistors, comprising:

a substrate, comprising a plurality of conductive straps buried in the substrate in parallel along a first direction;

a plurality of gate lines, disposed above the substrate in parallel along a second direction, wherein an insulation layer is disposed between each of the gate lines, and the insulation layer is extended between each of the gate lines and the substrate;

a plurality of semiconductor structures, respectively disposed on the substrate located at intersections between the conductive straps and the gate lines, each of the semiconductor structures comprising two vertical plates, a bottom plate, and a gate dielectric layer, wherein bottoms of the two vertical plates are connected to an upper surface of the bottom plate and are disposed in one of the gate lines, a bottom surface of the bottom plate is electrically connected to one of the conductive straps, and the gate dielectric layer is sandwiched by the two vertical plates and the one of the gate lines; and a plurality of conductive layers, respectively disposed above the plurality of the semiconductor structures and electrically connected to the two vertical plates.

9. The array with the vertical transistors as claimed in claim 8, wherein the bottom plate of each of the semiconductor structures in the first direction is connected to one another.

10. The array with the vertical transistors as claimed in claim 8, wherein a material of the gate lines comprises titanium nitride.

11. The array with the vertical transistors as claimed in claim 9, wherein a material of the gate lines comprises titanium nitride.

12. The array with the vertical transistors as claimed in claim 8, wherein a material of the gate dielectric layers comprises oxide-nitride-oxide.

13. The array with the vertical transistors as claimed in claim 9, wherein a material of the gate dielectric layers comprises oxide-nitride-oxide.

14. The array with the vertical transistors as claimed in claim 8, wherein upper surfaces of the gate lines and the tops of the two vertical plates of each of the semiconductor structures are co-planar.

15. The array with the vertical transistors as claimed in claim 9, wherein upper surfaces of the gate lines and the tops of the two vertical plates of each of the semiconductor structures are co-planar.

16. The array with the vertical transistors as claimed in claim 8, wherein upper surfaces of the gate lines are lower than the tops of the two vertical plates of each of the semiconductor structures.

17. The array with the vertical transistors as claimed in claim 9, wherein upper surfaces of the gate lines are lower than the tops of the two vertical plates of each of the semiconductor structures.

* * * * *